United States Patent
Nikandish et al.

(10) Patent No.: US 12,199,574 B2
(45) Date of Patent: Jan. 14, 2025

(54) POWER AMPLIFIERS

(71) Applicant: University College Dublin, National University of Ireland, Dublin (IE)

(72) Inventors: Gholamreza Nikandish, Donnybrook (IE); Anding Zhu, Blackrock (IE); Robert Bogdan Staszewski, Dublin (IE)

(73) Assignee: UNIVERSITY COLLEGE DUBLIN, NATIONAL UNIVERSITY OF IRELAND, Dublin (IE)

( * ) Notice: Subject to any disclaimer, the term of this patent is extended or adjusted under 35 U.S.C. 154(b) by 503 days.

(21) Appl. No.: 17/407,591

(22) Filed: Aug. 20, 2021

(65) Prior Publication Data
US 2022/0158594 A1  May 19, 2022

Related U.S. Application Data

(63) Continuation-in-part of application No. PCT/IB2020/058894, filed on Sep. 23, 2020.

(30) Foreign Application Priority Data

Feb. 21, 2020 (EP) ..................................... 20158862

(51) Int. Cl.
*H03F 1/56* (2006.01)
*H03F 1/02* (2006.01)
(Continued)

(52) U.S. Cl.
CPC .......... *H03F 1/565* (2013.01); *H03F 1/0288* (2013.01); *H03F 3/245* (2013.01)

(58) Field of Classification Search
CPC ........ H03F 1/565; H03F 1/0288; H03F 3/245; H03F 2200/222; H03F 2200/387; H03F 2200/391; H03F 2200/451; H03F 2203/7206; H03F 2203/7236; H03F 3/19; H03F 1/42; H03F 3/217; H03F 3/72
(Continued)

(56) References Cited

U.S. PATENT DOCUMENTS

| | | | |
|---|---|---|---|
| 7,663,435 B2 * | 2/2010 | Kim | H03F 3/604 330/124 R |
| 9,397,616 B2 * | 7/2016 | Donati | H03F 3/2171 |
| 10,135,408 B2 * | 11/2018 | Cao | H03F 3/195 |

FOREIGN PATENT DOCUMENTS

| | | |
|---|---|---|
| WO | 02101918 A1 | 12/2002 |
| WO | 2021/059161 A9 | 8/2021 |

OTHER PUBLICATIONS

European Search Report issued in Application Serial No. 20158862.1 on Aug. 11, 2020.
(Continued)

*Primary Examiner* — Hieu P Nguyen
(74) *Attorney, Agent, or Firm* — Brian J. Colandreo; Jeffrey T. Placker; Holland & Knight LLP

(57) ABSTRACT

A broadband power amplifier circuit is disclosed for providing load modulation, and includes an active element for receiving an impedance matched signal and for amplifying the impedance matched signal to supply an amplified signal, and an output matching network having a load impedance and coupled to the active element for receiving the amplified signal, the output matching network matches the load impedance to an optimum load impedance of the active element.

17 Claims, 56 Drawing Sheets

(51) Int. Cl.
  *H03F 3/24* (2006.01)
  *H03F 3/68* (2006.01)
(58) Field of Classification Search
  USPC .............................. 330/302, 295, 124 R, 296
  See application file for complete search history.

(56) References Cited

OTHER PUBLICATIONS

International Search Report and Written Opinion issued in the Application Serial No. PCT/IB2020/058894 on Feb. 22, 2021.
Kim Joonhyung: "Highly Efficient Asymmetric Class-F-1/F GaN Doherty Amplifier", IEEE Transactions on Microwave Theory and Techniques, Plenum, USA, vol. 66, No. 9, Sep. 4, 2018 (Sep. 4, 2018), pp. 4070-4077, XP011689771, ISSN: 0018-9480, DOI: 10.1109/TMTT.2018.2839195 [retrieved on Sep. 3, 2018].
Pengelly Raymond et al: "Doherty's Legacy: A History of the Doherty Power Amplifier from 1936 to the Present Day", IEEE Microwave Magazine, Ieeeservice Center, Piscataway, NJ, US, vol. 17, No. 2, Jan. 14, 2016 (Jan. 14, 2016), pp. 41-58, XP011591942, ISSN: 1527-3342, DOI: 10.1109/MMM.2015.2498081 [retrieved on Jan. 12, 2016].
Ishikawa Ryo et al: "Fully Integrated Asymmetric Doherty Amplifier Based on Two-Power-Level Impedance Optimization", 2018 48th European Microwave Conference (EUMC), European Microwave Association, Sep. 23, 2018 (Sep. 23, 2018), pp. 1221-1224, XP033450591, DOI: 10.23919/EUMC.2018.8541803 [retrieved on Nov. 20, 2018].
G. Reza Nikandish et al., Unbalanced Power Amplifier: An Architecture for Broadband Back-Off Efficiency Enhancement. IEEE Journal of Solid-State Circuits. © 2020 IEEE. https://www.ieee.org/publications/rights/index.html.

\* cited by examiner

| | This Work | [25] | [26] | [27] | [28] | [29] | [30] |
|---|---|---|---|---|---|---|---|
| Bandwidth (GHz) | 4.5-6.5 | 4.5-6.0 | 2.1-2.7 | 6.6-8.5 | 5.8-8.8 | 5.1-5.9 | 4.5-5.2 |
| Fractional BW (%) | 37.0 | 28.9 | 25.2 | 22.4 | 42.0 | 14.6 | 14.5 |
| $P_{sat,app}$ (dBm) | 32.2-34.3 | 35-36 | 40-41 | 34.5-35.5 | 35-36 | 36.0-38.7 | 40.4-41.2 |
| $\eta_{PA}$ (%) | 27-37 | 43-49 | — | 34-57 | 34-51 | 44-48 | 35-63 |
| $\eta_{DE}$ (%) | 27-40 | 24-32 | 48-62 | 26-40 | 35-45 | 33-51 | 47-50 |
| OPBO (dB) | 5.6 | 6 | 7.6 | 5.9 | 6 | 6 | 6 |
| Gain (dB) | 6.7-9.1 | 7.6-11.6 | 12-14 | 5.9 | 8.5-9 | 14.4-17.3 | 2.9 |
| Modulation | 256-QAM | 64-QAM | LTE | 256-QAM | 256-QAM | 64/256-QAM | LTE |
| $BW_m$ (MHz) | 100/200 | 100 | 10 | 10 | 20 | 80 | 40 |
| PAPR (dB) | 7.2 | ∞ | 7.2 | 7.8 | 8.2 | — | 7.7 |
| Center Freq. (GHz) | 5.0 | 5.0 | — | 7.4 | 7.0 | 5.8 | 4.9 |
| $EVM_{rms}$ (dB) | -28.4/-26.0 | -30.5 | — | — | — | -28/-32 | — |
| $P_{out,avg}$ (dBm) | 25.5 | 29.3 | — | 27.5 | 27.6 | 23.5/21.5 | 33.0 |
| $\eta_{avg}$ (%) | 30 | 29 | — | 48 | 40 | — | 51 |
| Chip Area (mm×mm) | 2.8×2.8 | 3.0×2.8 | 2.65×1.9* | 2.1×1.5 | 2.9×2.9 | 2.5×1.6 | 2.2×2.1 |
| GaN Process (nm) | 250 | 250 | 250 | 250 | 250 | 250 | 250 |

*Partially off-chip output matching network realized using bond wires.

Figure 52

POWER AMPLIFIERS

RELATED APPLICATION

This application is a continuation-in-part of PCT International Application No. PCT/IB2020/058894, filed on 23 Sep. 2020, which claims the benefit of Great Britain Patent Application No. 1913708.2, filed on 23 Sep. 2019 and claims the benefit of European Patent Application No. 20158862.1, filed on 21 Feb. 2020. The entire contents of each application are incorporated herein by reference.

AIM

The present invention relates to power amplifiers, in particular to broadband power amplifier circuits with high efficiency over a broad bandwidth.

BACKGROUND OF THE INVENTION

Gallium Nitride (GaN) has enabled the creation of power amplifiers (PAs) with a high efficiency and output power. This has made GaN an attractive option in many new applications. For example, GaN monolithic microwave integrated circuit (MMIC) PAs will be extensively used in cellular base-stations for fifth generation wireless networks (5G), offering size reduction and enhanced system integration. Such applications impose strict requirements on the linearity and efficiency of PAs over a broad bandwidth.

However, complex-modulated signals with non-constant envelope are used in modern communications to efficiently employ the available frequency spectrum. These signals feature large peak-to-average ratio (PAPR) that degrades average efficiency of conventional PA structures. Therefore, special architectures such as Doherty PA, Outphasing PA, and envelope tracking PA are employed to improve the average efficiency. However, these architectures suffer from severe limitations including limited bandwidth and degraded linearity. In addition, in conventional PAs the efficiency degrades when the PA is operated in back-off from the peak power, because active device consumes almost the same power from supply but produces less output power.

Moreover, broadband PAs normally have a low efficiency, for example, in distributed amplifiers, where optimum load impedance cannot be easily provided to transistors. and power transferred to the drain line termination degrades efficiency of the PA. In most of the harmonic tuned PAs, high efficiency can only be obtained over a narrow bandwidth. Furthermore, hybrid circuits, because of their large size, cannot be used in specific applications of integrated circuit PAs.

The present invention aims to at least ameliorate the aforementioned disadvantages by providing circuit network developed to provide optimum load impedance for integrated circuit broadband PAs.

SUMMARY

According to a first aspect of the present invention, there is provided, a broadband power amplifier circuit, said amplifier circuit comprising: an active element for receiving an impedance matched signal and for amplifying the impedance matched signal to supply an amplified signal; and an output matching network having a load impedance and coupled to the active element for receiving the amplified signal; and wherein the impedance of the output matching network is configured to match to the optimum load impedance of the active element.

The output matching network may comprise two reactance elements. In order to match the impedance of the output matching network to the optimum load impedance of the active element, the two reactance elements may take specific values at the centre of the frequency band. These values may be determined by the loaded quality factor of the output matching network and the optimum load impedance of the active element. This may be achieved by designing or selecting elements of the output matching network with inductors and capacitors such that they take specific values of inductance and capacitance. The inductors and capacitors may be arranged in parallel or in series, or in a combination thereof.

In an embodiment, the output matching network may transform a load impedance into the optimum load resistance of the transistor over a frequency bandwidth. The frequency bandwidth has a lower and upper limit. A reactive load impedance may then be in the second-harmonic bandwidth to maximize efficiency of the power amplifier.

Typically, the optimum load impedance may be greater than the load impedance. This may be the case for GaN transistors. Neglecting loss of passive components, at the centre of the frequency band, which may be equal to the root of the product of the upper and lower frequency limit, optimum load resistance may be equal to the product of the reactance of one of the reactance elements and a loaded quality factor of the network, whilst the reactance of the second reactance element is equal to the product of the loaded quality factor of the network and the load resistance. The loaded quality factor may be equal to the root of the ratio of the optimum and load resistance minus 1.

In embodiments, having a first inductor and a second inductor in parallel to a capacitor and a further capacitor in series, this can act as an open-circuit at a frequency equal to inverse root of the product of the two inductors, and as a short-circuit at a frequency equal to the root of the sum of the two capacitors. It can be appreciated that by choosing a resonance frequency of the inductor-capacitor circuit equal to twice the frequency of the capacitance, an almost reactive impedance composed of L∥C maybe is achieved at a second-harmonic band, which can achieve a high efficiency. Moreover, the frequency of the reactance of the short circuit frequency can be adjusted within the frequency of the frequency of the capacitance and the open circuit frequency to control bandwidth.

The broadband power amplifier circuit further comprises an input matching network having a source impedance that receives an input signal and supplies the impedance matched signal to the active element.

In some embodiments, the input matching network matches the source impedance to the optimum load impedance of the active element.

The active element may be a transistor.

In a preferred embodiment, the amplifier circuit may be implemented on Gallium Nitride (GaN) on silicon carbide (SiC). This can reduce the chip area of the circuit allowing an overall size reduction and enhanced system integration.

In one embodiment, the output matching network may be an embedded minimum inductor band-pass filter configured to match the load impedance to the impedance of the active element for a continuous-mode operation of the power amplifier. In some embodiments, load impedance may be substantially resistive, and close to optimum load resistance of the active device, in the fundamental harmonic frequency band, and substantially reactive in the second harmonic frequency band. This may be beneficial to achieve high efficiency of the power amplifier.

In other embodiments, the output matching network is configured to match the impedance of the active element over fundamental and second harmonic frequency bands of the active element.

In addition, the band-pass filter may be further configured to suppress transmission of harmonic frequencies towards the load resistance. A large out-of-band attenuation can help to improve efficiency by providing reactive load impedance in the second-harmonic bandwidth. A simple network topology, composed of only four circuit elements, may aid enabling of implementation of the band-pass filter with low loss and compact chip area.

According to another embodiment, to improve the efficiency of the amplifier further, the input matching network may be configured to match the source impedance to the optimum source impedance of the active element over the fundamental frequency band.

In other embodiments, the power amplifier may be configured as a monolithic microwave integrated circuit. This can reduce the chip area of the circuit allowing an overall size reduction and enhanced system integration.

In some embodiments, the active element may comprise: a main amplifier for supplying the amplified signal at a first set of input signal conditions; and an auxiliary amplifier for also supplying the amplified signal at a second set of input signal conditions. A width of the auxiliary amplifier may typically be larger than a width of the main amplifier.

The main amplifier may comprise one or more active elements or unit cells, and the auxiliary amplifier may be electrically connected in parallel with the main amplifier and additionally may comprise at least two active elements or unit cells. The number n of active elements or unit cells in the auxiliary amplifier may be given by $n=2^k-1$, where k is the number of control bits.

These active elements or unit cells may have separate gate bias controls and are turned on and off depending on the power received from the input matching network. In some embodiments, substantially all power from the input matching network and/or the input asymmetric quadrature coupler may be delivered to the main amplifier at low bias voltages, and may be shared substantially equally between the first and the auxiliary amplifier at high bias voltages. This configuration may improve the gain and efficiency of the power amplifier at back-off.

To improve the efficiency further, the output matching network and/or the auxiliary output matching network may be configured to match the load impedance to the optimum impedance of the active element over fundamental, second and third harmonic frequency bands. Optimum load impedance may be achieved when the load impedance is the optimum load resistance, short-circuit, and open-circuit, respectively, at the fundamental, second and the third harmonic frequency bands.

In some embodiments, the amplifier may further comprise an input power divider, optionally an input asymmetric quadrature coupler, for dividing the power of the input signal between the main and auxiliary amplifier. In some embodiments the coupling may be determined by an input asymmetric quadrature coupling coefficient of the input asymmetric quadrature coupler.

In other embodiments, the input matching network may be coupled to the main amplifier, and wherein the amplifier further comprises an auxiliary input matching network coupled to the auxiliary amplifier such that the input matching network supplies part of the power from the input asymmetric quadrature coupler to the main amplifier and the auxiliary input matching network supplies the remaining power from the input asymmetric quadrature coupler to the auxiliary amplifier.

Furthermore, to achieve a high efficiency, a harmonic output matching network may be used for this PA to provide harmonic load impedances for the class-F operation. This network can provide the optimum load resistance at the fundamental frequency, a short-circuit impedance at the second harmonic, and an open-circuit at the third harmonic.

The network typically features low loss and compact chip area that are essential for integrated circuit implementation of the PA. The network may absorb the parasitic drain-source capacitance of the transistors and the drain bias feed as its constituent elements. These features can enable fully integrated implementation of the PA.

The input power divider network typically exploits voltage-dependency of the transistors' gates-source capacitance to adaptively divide the input power between the main and auxiliary cells. For a Gallium Nitride (GaN) monolithic microwave integrated circuit (MMIC) process used for implementation of the PA circuit, the gates-source capacitance of the transistors typically decreases approximately by a factor of two when their gate bias voltage reduces from ON to OFF state. At low input power levels, all auxiliary cells are OFF, and their input capacitance is smaller than that of the main amplifier ($C_{aux}<C_{main}$). The input impedance of the main amplifier is then smaller, and more power is delivered to the input of the main amplifier. This can improve back-off gain and efficiency of the PA. At high input power levels, the main and auxiliary cells have the same gate bias voltage, and hence the same gate-source capacitance ($C_{aux}=C_{main}$). Thus, the input power is divided equally between the main and auxiliary amplifiers.

This network can also provide optimum load impedance in the fundamental, second-harmonic, and third-harmonic frequency bands. The network typically features low loss and compact chip area that are desirable requirements for integrated circuit realizations. The multi-harmonic matching network may be composed of three resonators that their resonant frequencies determine broadband behaviour of the load impedance presented to the transistor. The network may absorb parasitic drain-source capacitance of the transistor and provides drain bias feed.

In an embodiment, an input asymmetric quadrature coupler may be provided for dividing the power of the input signal between the main and auxiliary amplifier.

The passive network may comprise an additional input matching network such that input matching network supplies part of the power from the input asymmetric quadrature coupler to the main amplifier and the additional input matching network supplies the remaining power from the input asymmetric quadrature coupler to the additional amplifier.

Furthermore, an output power combiner, optionally an asymmetric quadrature coupler, for combining the output power of the amplified signal from the main amplifier and the auxiliary amplifier may be provided. The output power of the output asymmetric quadrature coupler may be determined by an output asymmetric quadrature coupling coefficient of the output asymmetric quadrature coupler The passive network may also comprise an auxiliary output matching network, such that the output matching network matches the load impedance to the impedance of the main amplifier and the auxiliary output matching network matches the load impedance to the impedance of the auxiliary amplifier. This arrangement may allow load modulation over a broad bandwidth. The main amplifier may be biased at class-B, and the auxiliary amplifier biased at class-C.

As described above, the input asymmetric quadrature hybrid operates as the input power divider, and the output asymmetric quadrature hybrid operates as the output power combiner.

The amplifiers may be matched to the source and load impedances, normally 50 ohms, using the input and output matching networks. The size of auxiliary amplifier is typically larger than that of the main amplifier, by a factor that determines the output power back-off where efficiency is maximized.

The coupling coefficient of the input hybrid may be chosen such that a larger portion of the input power be applied to the auxiliary amplifier. The output hybrid may be designed to combine output power of the two amplifiers based on a specific weighting. Its coupling coefficient can determine these weights. The bias of the auxiliary amplifier may be selected based on the desired back-off level.

To improve efficiency of the PA, the output matching networks of the main and auxiliary amplifiers can be designed such that they present optimum load impedances to the transistors at fundamental and harmonic frequencies. A broadband operation may then be achieved thanks to the use of amplifiers with broadband impedance matching networks and hybrid couplers implemented as broadband Lange couplers.

In an example, the power amplifier comprises a main amplifier biased at class-B, an auxiliary amplifier biased at class-C, an asymmetric quadrature coupler operating as the input power divider and an asymmetric quadrature coupler operating as the output power combiner. The input power is divided between the main and auxiliary sub power amplifiers based on the coupling coefficient of the input coupler, in this example. The main and auxiliary sub power amplifiers are respectively biased in class-B and class-C modes and so, at low input power levels, only the main sub power amplifier is working, and the auxiliary sub power amplifier is OFF. By increasing the power input levels, the auxiliary sub power amplifier gradually turns on and starts contributing to the output power. At this point, the main sub power amplifier can be either in linear operation or saturated.

In order to maximize efficiency at back-off, the main sub power amplifier should be at the onset of saturation at that stage—i.e., when the auxiliary sub power amplifier turns on, the main sub power amplifier should be at the edge of saturation. Both sub power amplifiers would ultimately become saturated upon further increasing the input power level.

The auxiliary sub power amplifier may comprise a larger transistor than the main sub power amplifier in this example, to provide larger gain and higher saturated output power.

The contributions of the main and auxiliary sub power amplifiers in the total output power are dependent on the coupling coefficient of the output coupler. Therefore, the output power back-off (OPBO) level can be controlled by both the transistors' width ratio and the output coupler's coupling coefficient. This provides more design flexibility compared with a conventional Doherty PA, for example.

In this example, the sub power amplifiers (main and auxiliary) are connected to the input and output matching networks that maintain their impedance matching almost independently of the input power level. In the unbalanced power amplifier architecture, these matching networks are broadband; thus, the impedance matching is not significantly affected by variations of the transistors' parasitic capacitances with the input power. The output signals of the two sub power amplifiers are combined through the output coupler. The hybrid couplers can be implemented using broadband structures, e.g., the Lange couplers, leading to a broadband PA architecture with a back-off efficiency enhancement.

Using the broadband impedance matching networks and Lange couplers improve the unbalanced PA bandwidth compared with the conventional Doherty PA using band-limiting impedance inverters.

As the two transistors operate in the class-B and class-C modes, nonlinearities of their transconductance and gate-source capacitance are, respectively, compressive and expansive with respect to power level and, therefore, can compensate for each other's effects. This helps to mitigate the AM-PM distortion of the unbalanced power amplifier, which is an important feature for complex-modulated signals conventionally used in modern communications. However, this requires a careful adjustment of the transistors' nonlinearity profiles.

In embodiments, the power amplifier operates in a continuous class-F mode, and the passive network may be a multi-harmonic output matching network, comprising said network and parasitic capacitances of the active devices.

According to an example of the present invention, there is provided a broadband power amplifier circuit for enhancing back-off output power efficiency, said amplifier circuit comprising: an active element for receiving an input signal and for amplifying the input signal to supply an amplified signal, said active element comprising a main amplifier and an auxiliary amplifier; an input asymmetric quadrature coupler for dividing the power of the input signal between the main and auxiliary amplifier; and an output asymmetric quadrature coupler for combining the output power of the amplified signal from the main amplifier and the auxiliary amplifier.

The main and the auxiliary amplifiers may each comprise an input matching network, a transistor, and an output matching network; said input matching network coupled to the input asymmetric quadrature coupler, the output matching network coupled to the output asymmetric quadrature coupler; and the transistor coupled to the both the input matching network and the output matching network.

According to another example of the present invention, there is provided a method for providing load modulation in a broadband power amplifier, said method comprising: receiving an input signal at an input matching network, said input matching network having a source impedance; matching the source impedance of the input matching network to an impedance of an active element; supplying an output signal from the input matching element to the active element; amplifying the output signal via the active element; matching the load impedance of an output matching network to the impedance of the active element; and supplying the amplified signal to the output matching network, said output matching network having a load impedance.

These and other aspects of the disclosure will be apparent from, and elucidated with reference to, the embodiments described hereinafter.

BRIEF DESCRIPTION OF DRAWINGS

Embodiments will be described, by way of example only, with reference to the drawings, in which

FIG. 2b shows an equivalent circuit of FIG. 2a;

FIG. 5 shows a network for integration into the circuit of FIG. 2a;

FIG. 52 shows a table entitled: COMPARISON OF BROADBAND FULLY INTEGRATED GaN PAs WITH BACK-OFF EFFICIENCY ENHANCEMENT;

Figure 1:
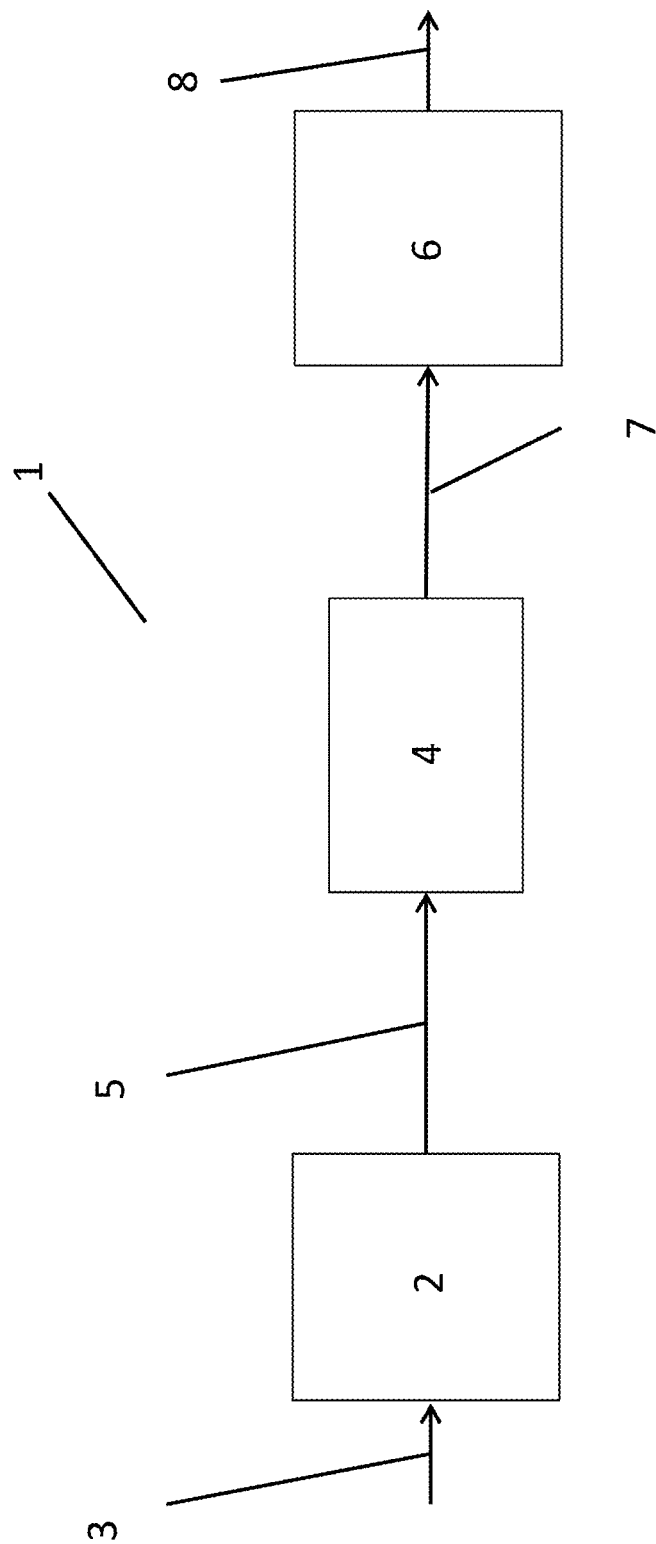
FIG. 1 shows a power amplifier circuit (PA) according to an embodiment of the present disclosure.

It should be noted that the figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF DRAWINGS

FIG. 1 shows a power amplifier circuit (PA) 1 comprising an input matching network 2, an active element 4, and an output matching network 6. The input matching network 2 is coupled to the active element 4. The input matching network 2 is configured to receive an input signal 3, and generate an impedance matched signal 5. The impedance matched signal 5 is then received by the active element 4, which amplifies the signal 5. The amplified signal 7 is then received by an output matching network 6, which then produces an output signal 8.

Figure 2A:
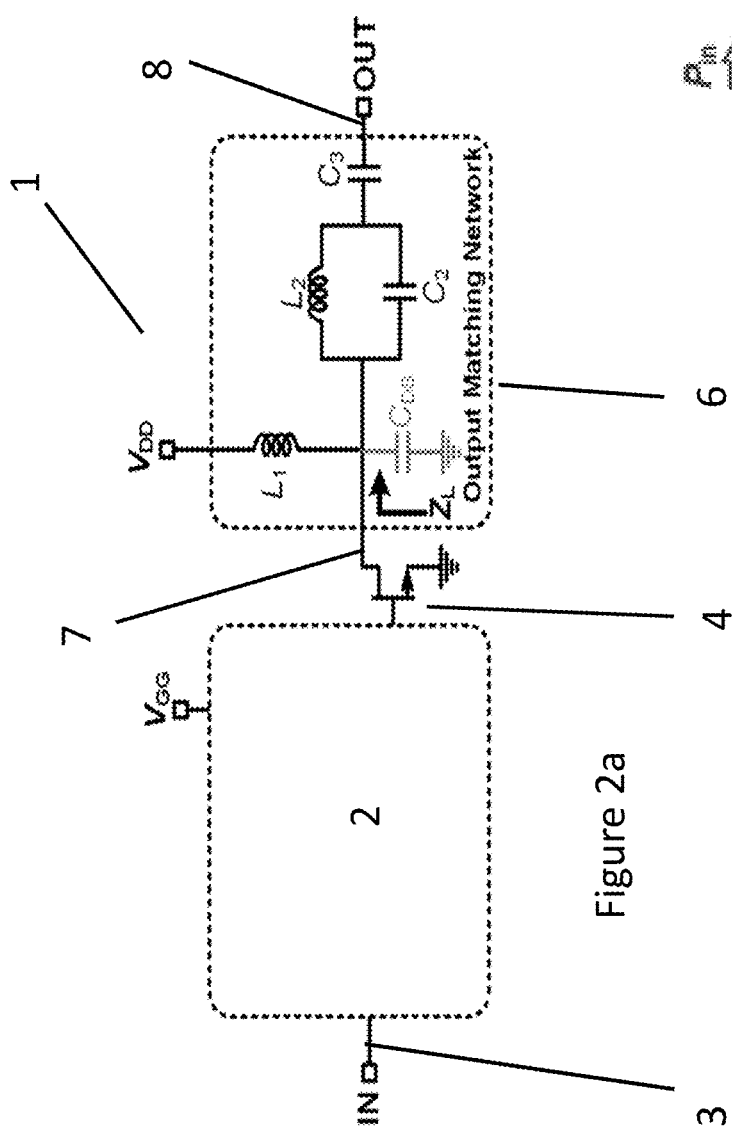
FIG. 2a shows an output matching network for use in the PA of FIG. 1.

FIG. 2a shows one embodiment of the output matching network 6 of the present invention. The output matching network 6 is minimum inductor band-pass filter (BPF) which can provide wide bandwidth and large out-of-band attenuation with smaller inductors compared to standard filter structures. In particular, the structure shown broadly comprises two reactance elements, $X_p(\omega)$ and $X_s(\omega)$. Each reactance element comprises capacitors and inductors (one or more of each) configured as shown in FIG. 2a.

The output matching network 6 transforms the load impedance $R_L$ into the optimum load resistance of the transistor $R_{opt}$ over the bandwidth $\omega L \leq \omega \leq \omega H$, where $\omega L$ and $\omega H$, respectively, is the lower and upper limit of the bandwidth. It should provide a reactive load impedance in the second-harmonic bandwidth to maximize efficiency of the PA 1. It is assumed that $R_{opt} > R_L$, which is usually the case for GaN transistors. Neglecting loss of passive components, it can be shown that the following conditions should be satisfied at the center of the frequency band, $\omega_c = \sqrt{\omega_L \omega_H}$, to achieve the optimum load resistance $$X_p(\omega_c) = \pm \frac{1}{Q_0} R_{opt} \quad (1)$$

where $$Q_0 = \sqrt{\left(\frac{R_{opt}}{R_L} - 1\right)}$$

is the loaded quality factor of the network. Assuming $C_1 = C_{ds}$, using the above with plus sign and $X_p(\omega) = L_1 \omega / (1 - L_1 C_1 \omega^2)$, $L_1$ is derived as $$X_s(\omega_c) = \mp Q_0 R_L \quad (2)$$

Where $$Q_0 = \sqrt{\left(\frac{R_{opt}}{R_L} - 1\right)}$$

is the loaded quality factor of the network. Assuming $C_1 = C_{ds}$, using (1) with plus sign and $X_p(\omega) = L_1 \omega / (1 - L_1 C_1 \omega^2)$, $L_1$ is derived as $$L_1 = \frac{R_{opt}}{\omega_C} \frac{1}{Q_0 + R_{opt} C_{ds} \omega_c} \quad (3)$$

Figure 2B:
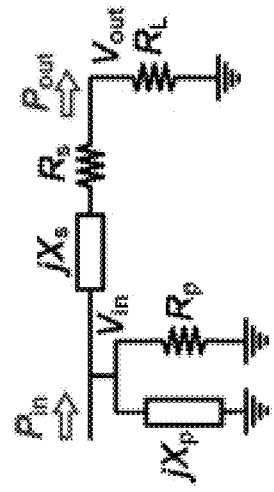

Using the circuit in FIG. 2(b), reactance $X_s(\omega)$ is derived as $$X_S(\omega) = \frac{\left(\frac{\omega}{\omega_s}\right)^2 - 1}{1 - \left(\frac{\omega}{\omega_0}\right)^2} \frac{1}{\omega C_3} \quad (4)$$

which acts as an open-circuit at $\omega_o = 1/\sqrt{(L_2 C_2)}$ and as a short-circuit at $\omega_s = 1/\sqrt{L_2 (C_2 + C_3)}$. By choosing $\omega_o = 2\omega_c$, an almost reactive impedance composed of $L_1 \| C_1$ is achieved at the second-harmonic band, which is required to achieve a high efficiency. Moreover, $\omega s$ can be adjusted within $\omega c < \omega s < \omega o$ to control bandwidth. With chosen $\omega_o$ and $\omega_s$, (2) with minus sign and (4) can be used to determine C3, C2, and L2 as follows $$C_3 = \frac{1 - \left(\frac{\omega_c}{\omega_s}\right)^2}{1 - \left(\frac{\omega_c}{\omega_0}\right)^2} \frac{1}{\omega_c Q_0 R_L} \quad (5)$$

$$C_2 = \frac{C_3}{\left(\frac{\omega_0}{\omega_s}\right)^2 - 1} \quad (6)$$

$$L_2 = \frac{1}{C_2 \omega_0^2} \quad (7)$$

Efficiency of the output matching network 6 is an important metric in integrated circuit PAs 1. Using the equivalent circuit shown in FIG. 2(b), and assuming that resistances representing losses meet the conditions $R_p \gg R_{opt}$ and $R_s \ll R_L$, it can be shown that the efficiency is derived as $$\eta_0 = \frac{1 - \frac{R_{opt}}{R_p}}{1 + \frac{R_s}{R_L}} \approx 1 - \frac{R_{opt}}{R_p} - \frac{R_s}{R_L} \quad (8)$$

Using FIG. 2 and eq (3)-(7), the efficiency can be derived in terms of the circuit parameters.

$$\frac{R_{opt}}{R_p} = \frac{Q_0 + R_{opt} C_{ds} \omega_c}{Q_{L1}} \quad (9)$$

$$\frac{R_s}{R_L} \approx \frac{Q_0}{Q_{L2}} \frac{\left(\frac{\omega_0}{\omega_s}\right)^2 - 1}{\left[1 - \left(\frac{\omega_c}{\omega_s}\right)^2\right]\left[\left(\frac{\omega_0}{\omega_c}\right)^2 - 1\right]} \quad (10)$$

where $Q_{L1}$ and $Q_{L2}$ denote quality factors of the inductors. The efficiency degrades for higher impedance transformation ratio $R_{opt}/R_L$, and hence higher $Q_0$, while it can be improved using inductors with larger quality factor. The efficiency is also dependent on the process parameter $R_{opt} C_{ds}$, the center frequency $\omega_c$, and the series reactance's open- and short-circuit frequencies, $\omega_o$ and $\omega_s$. We use this design approach for a broadband 2-4 GHz PA 1 in a 0.25-μm GaN-on-SiC technology. The device is composed of two parallel transistors with 6×125-μm width and 28 V supply voltage to achieve 37 dBm output power over the bandwidth. Using load-pull simulations, $R_{opt}$ and $C_{ds}$ are derived as 55Ω and 1 pF, respectively. The low impedance transformation ratio of 1:1 leads to a small $Q_o$ of 0.32. The single-section network of FIG. 2 is therefore used as output matching network 6 of the PA 1. Using $\omega_o = 2\omega_c$ and $\omega_s/\omega_c$ as a design parameter, the circuit elements are derived from eq (3) and (5)-(7). From the circuit frequency response (not shown due to limited space), $\omega_s/\omega_c$ is chosen as 1.2 to achieve a broadband optimum load resistance. Using ep (8)-(10), the efficiency of the output matching network 6 is derived as $$\eta_0 \approx 1 - \frac{1.29}{Q_{L_1}} - \frac{0.69}{Q_{L_2}} \quad (11)$$

indicating that $Q_{L1}$ is more critical for efficiency. As the inductor $L_1$ should also meet a minimum width based on electromigration current density limit (16 μm in this process), it is realized as a meandered microstrip transmission line, while a spiral inductor structure with small chip area is chosen for $L_2$. In this design, $Q_{L1} \approx 18$ and $Q_{L2} \approx 15$, leading to $\eta_o \approx 88.7\%$ (0.52 dB insertion loss).

Figure 3B:
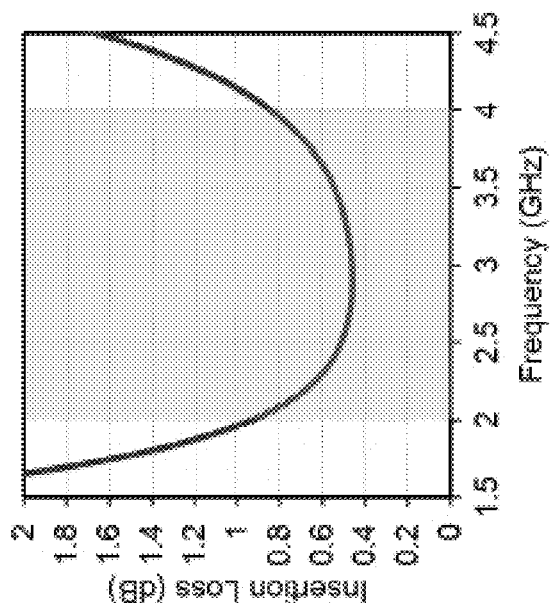
FIGS. 3a and 3b shows a response of real and imaginary load impedance across frequency.
Figure 3A:
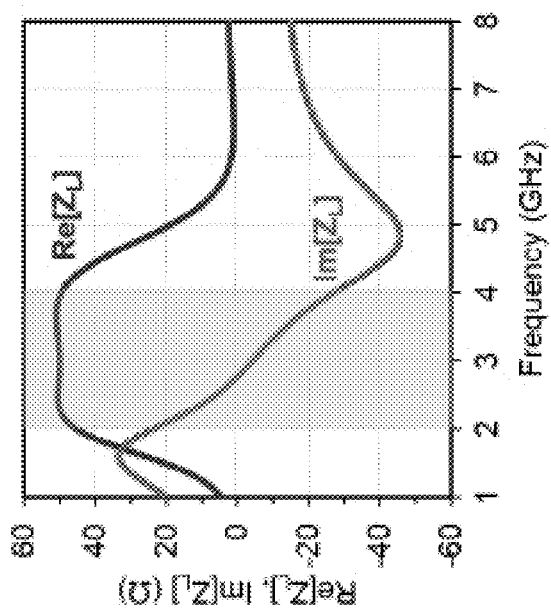

In FIGS. 3a and 3b, load impedance presented to intrinsic drain of the transistor and insertion loss of the designed output matching network 6 are shown versus frequency. In 2-4 GHz, the real part of the load impedance is almost flat and equal to $R_{opt}$, while in the second-harmonic band it rolls off to zero. The imaginary part of the load impedance is zero at the center of the frequency band, $f_c = \sqrt{f_L f_H} \approx 2.8$ GHz, as expected from the theory. In the second-harmonic band, load impedance is located inside high-efficiency area of Smith chart determined using load-pull simulations. Insertion loss of the output matching network 6 is 0.46-0.93 dB in the target 2-4 GHz frequency band. The simulated minimum insertion loss is close to the predicted theoretical insertion loss, while this increases toward edges of the frequency band as a result of imperfect impedance matching.

Figure 4:
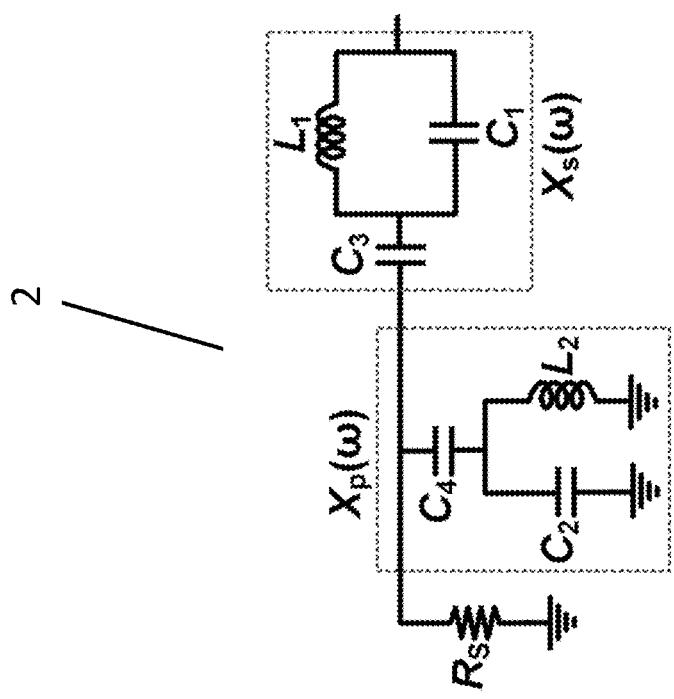
FIG. 4 shows an embodiment of an input matching network for use in the PA of FIG. 1.

The design of the input matching network 2 is less critical than that of the output matching network 6. The output power and efficiency are not as sensitive to source impedance mismatch, while a moderate insertion loss can be exploited to improve bandwidth and gain flatness of the PA 1. FIG. 4 shows an exemplary embodiment of the input matching network 2. As shown, the input matching network 2 comprises two reactance elements, $X_p(\omega)$ and $X_s(\omega)$. Each reactance element comprises capacitors and inductors (one or more of each), and in the embodiment shown each comprise two capacitors and an inductor. This circuit transforms the source impedance into the complex optimum source impedance $R_{S,opt} + jX_{S,opt}$ with $R_{S,opt} < R_S$. The short-circuit frequency of the parallel reactance can be adjusted to achieve a reactive source impedance at the second-harmonic frequency band, $\omega_{s,p} \approx 2\omega_c$. Furthermore, the source impedance contributes to the nonlinear mechanism that transforms the transistor's input capacitance nonlinearity into AM-PM distortion. It is shown that AM-PM is substantially increased when the input matching network 2 has a high quality factor. The input matching network 2 is designed to provide a moderate input matching $S_{11} < -8$ dB, but a low quality factor of 0.4-0.8 in the 2-4 GHz bandwidth.

The continuous class-F mode is described by the following optimum load impedance at fundamental, second-, and third-harmonic frequencies $$Z_L(f) = \left(\frac{2}{\sqrt{3}} + j\gamma\right) R_{opt} \quad (12)$$

$$Z_L(2f) = -j\frac{7\sqrt{3}\pi}{24} \gamma R_{opt} \quad (13)$$

$$Z_L(3f) = \infty \quad (14)$$

where $R_{opt} = 2V_{dc}/I_{max}$ is the optimum load resistance, $V_{dc}$ and Imax denote the drain dc voltage and the maximum current, and $-1 \leq \gamma \leq 1$.

In practice, it is difficult to meet all these conditions, especially in an MMIC PA where loss of passive components prohibits the use of high-order matching circuits. For example, eq (1) and (2) indicate that a constant ratio should be maintained between reactive parts of the second-harmonic and fundamental impedances, i.e., $X_L(2f)/X_L(f) \approx -1.59$, while eq (3) indicates that an open-circuit impedance is required at the third harmonic. These conditions, however, cannot be easily satisfied over a broad bandwidth. Furthermore, nonlinearity of the transistor's parasitic capacitances and output resistance limit accuracy of this model [6]. In order to develop practical design criteria, we use the optimum load impedance at fundamental frequency as per eq (1), while harmonic load-pull simulations are used to determine the optimum load impedances at harmonic frequencies.

In the following harmonic load-pull simulations, a 0.25-μm GaN-on-SiC process from WIN Semiconductors is used. The transistor is driven 2-3 dB into gain compression, to deliver about 37 dBm output power with 24 dBm input power at 5 GHz. The input source impedance is optimized at the fundamental frequency and short-circuited at higher order harmonics. The transistor parameters $R_{opt}$ and $C_{out}$ are roughly extracted as 70Ω and 0.5 pF, respectively. The second- and third-harmonic load-pull simulation results are, respectively, shown in FIGS. 1 and 2. The impedances are given at the extrinsic drain of the transistor. The results are given for $\gamma = 0$, while further simulations indicate that the harmonic load-pull contours do not significantly change with $\gamma$.

To enable the continuous class-F mode operation, an harmonic matching network shall provide optimal load impedance in the fundamental and harmonic frequency bands. Unfortunately, a traditional single-frequency multi-harmonic matching network cannot support these conditions over a broad bandwidth. For MMIC implementation, this network should have a simple architecture to reduce loss and save chip area. Moreover, the network should absorb the drain-source parasitic capacitance of the transistor and include a parallel inductor to provide the drain bias path. As an example, simple network for an integrated GaN PA has been previously proposed in, but it is applicable only to class-J mode.

Figure 5:
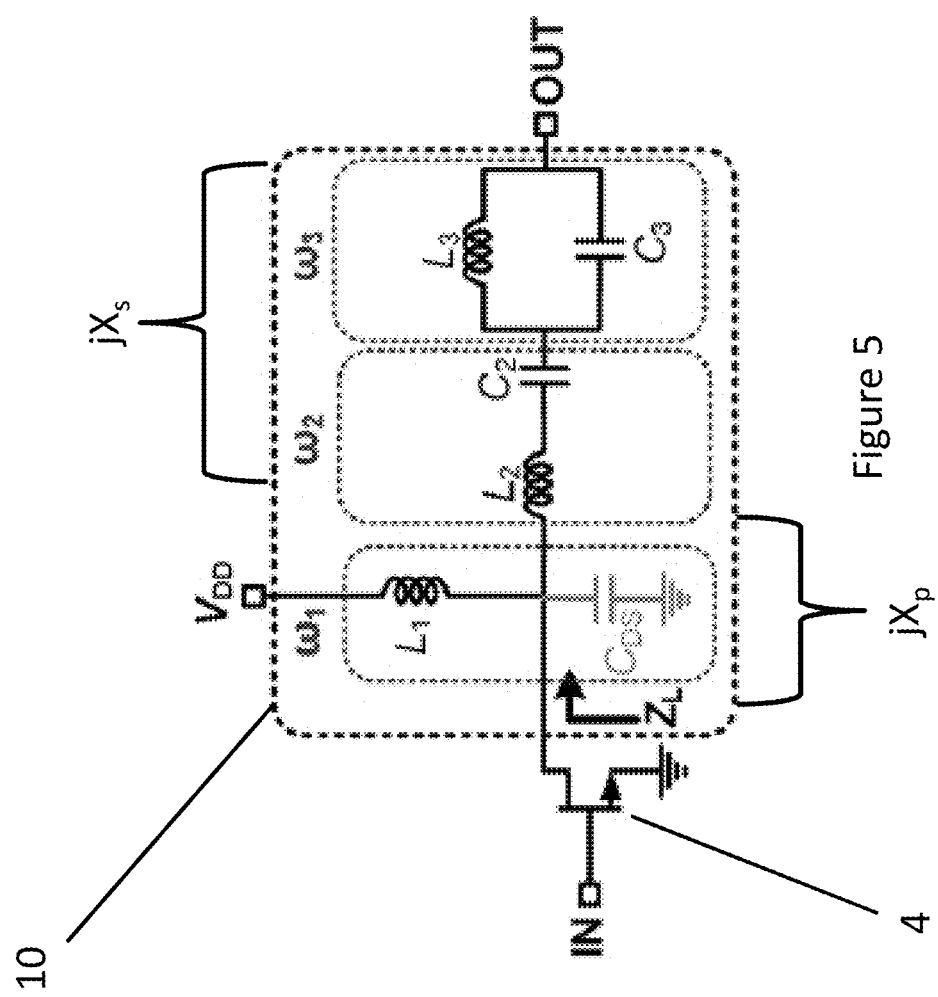

In this work, a network 10 is proposed, shown in FIG. 5, that is capable of meeting the continuous class-F mode conditions over a wide bandwidth for MMIC PAs. This network 10 can be integrated into the circuit shown in FIG. 2a, replacing circuit 6 Broadband frequency response of the load impedance at fundamental and harmonics can be controlled via resonant frequencies of the three resonators ($\omega_{1,2,3}$). We present an intuitive analysis to provide insights into the circuit operation. Then, the circuit can be optimized in a circuit simulator to achieve the desired broadband response in the presence of loss and parasitics of the passive elements.

The input impedance of the circuit in FIG. 5 is derived as $$Z_{in}(j\omega) = jX_p(\omega) \| [jX_s(\omega) + R_L] \quad (15)$$

where $X_p(\omega)$ and $X_s(\omega)$ are respectively given by $$X_p(\omega) = \frac{\omega L_1}{1 - \omega^2 L_1 C_1} \quad (16)$$

$$X_s(\omega) = \omega L_2 - \frac{1}{\omega C_2} + \frac{\omega L_3}{1 - \omega^2 L_3 C_3} \quad (17)$$

By equating the respective real and imaginary parts of (12) and (15) at center of the band $\omega_0 = 2\pi f_0$, it can be shown that $$X_p(\omega_0) = \left( -B_L(f_0) \mp G_L(f_0) \sqrt{\frac{1}{R_L G_L(f_0)} - 1} \right)^{-1} \quad (18)$$

$$X_s(\omega_0) = \mp R_L \sqrt{\frac{1}{R_L G_L(f_0)} - 1} \quad (19)$$

where $G_L(f_0)$ and $B_L(f_0)$ are real and imaginary parts of the optimum fundamental load admittance $1/Z_L(f_0)$. We assume that the resonant frequency of the first resonator $\omega_1$ is placed at $\omega_0 < \omega_1 < 2\omega_0$. Therefore, the resonator operates as an inductive reactance at the fundamental and a capacitive reactance at harmonics frequencies. It can be shown that this choice leads to the desired frequency response behavior at harmonic bands. Moreover, we choose $C_1 = C_{out}$, and hence using eq (16), the inductor $L_1$ is derived as $$L_1 = \frac{1}{\omega_0} \frac{X_p(\omega_0)}{1 + \omega_0 C_{out} X_p(\omega_0)} \quad (20)$$

The input impedance of the network should be reactive at harmonics to achieve high efficiency. Using eq (15), it is shown that the condition $R_{in}(n\omega_0) \ll X_{in}(n\omega_0)$ is simplified as $$X_p(n\omega_0) \ll R_L + \frac{1}{R_L} X_s(n\omega_0)[X_s(n\omega_0) + X_p(n\omega_0)] \quad (21)$$

Figures 6A, 6B:
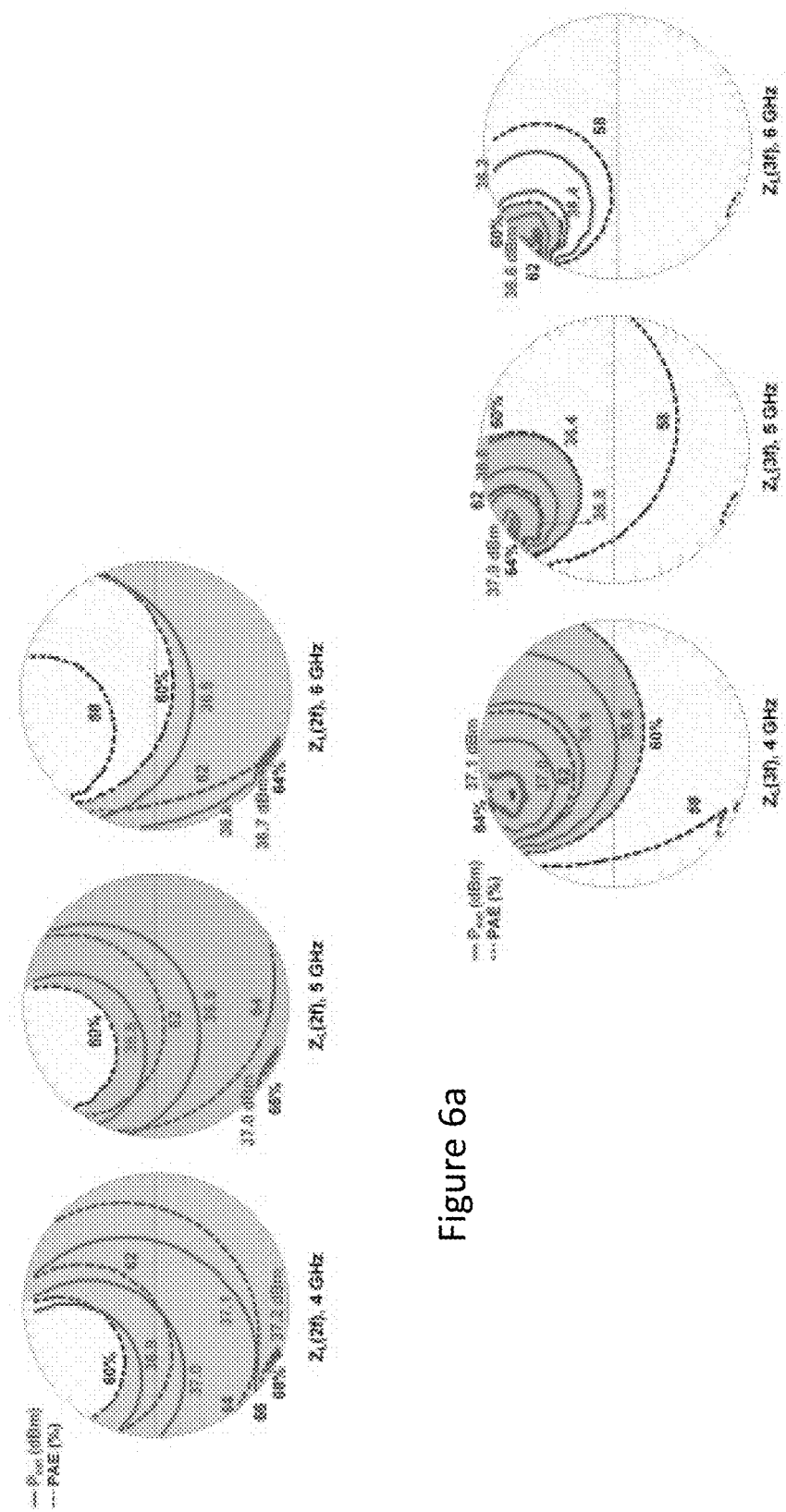
FIGS. 6a and 6b show harmonics at differing frequencies.

This condition is automatically satisfied at sufficiently high frequencies, e.g., the third harmonic, as $X_p(n\omega_0) \approx 1/n\omega_0 C_1$ becomes much smaller than $R_L$. At the second harmonic, we can choose $\omega_3 \approx 2\omega_0$, to obtain a large $X_s(2\omega_0)$. At the third harmonic, an inductive impedance is required (see FIGS. 6a and 6b), which can be obtained by adjusting the resonant frequency $\omega_2$ and circuit elements to make $X_s(3\omega_0)$ inductive.

The layout structure of the harmonic matching network has significant effects on performance of the broadband integrated PA. In addition to the optimum load impedance conditions, other issues, including the losses and parasitics of passive elements, electromigration current density limit of transmission lines, and chip area should also be considered in the layout design. Properties of the double-metal transmission lines on the 100-μm SiC substrate are summarized in Table I below. The line width should be chosen based on these trade-offs.

TABLE I

PROPERTIES OF TRANSMISSION LINES IN THE GAN PROCESS.

| Width (μm) | $Z_0$ (Ω) | Q | $I_{max}$ (mA) |
|---|---|---|---|
| 10 | 104 | 18 | 296 |
| 20 | 88 | 30 | 592 |
| 30 | 78 | 40 | 888 |
| 40 | 71 | 50 | 1184 |
| 50 | 66 | 57 | 1480 |

To proceed, we present the design of a PA 1 operating in 4-6 GHz using the developed technique. In the proposed circuit 10 of FIG. 5, inductor $L_1$ should tolerate a dc current of 300 mA at the maximum output power. Moreover, simulations indicate that the layout of this inductor is critical in the PA's 1 broadband performance. The other inductors are not burdened by such current density constraint and so their widths are optimized based on insertion loss and chip area. The inductors $L_{1, 2,3}$ are implemented as meandered microstrip transmission lines with the width of 30, 15, and 30 μm, respectively. The circuit elements are roughly estimated as $L_{1,2,3} = [1.4\ 0.6\ 1.1]$ nH and $C_{1,2,3} = [0.5\ 0.5\ 0.3]$ pF. The resonant frequencies of the resonators are derived as $f_{1,2,3} = [6.0\ 9.1\ 8.7]$ GHz, indicating that the conditions set on these resonant frequencies are maintained as $f_0 < f_1 < 2f_0$, $f_2 \approx 2f_0$, and $f_3 \approx 2f_0$. The insertion loss of the matching network is 0.6-1.1 dB over the bandwidth.

Figure 7:
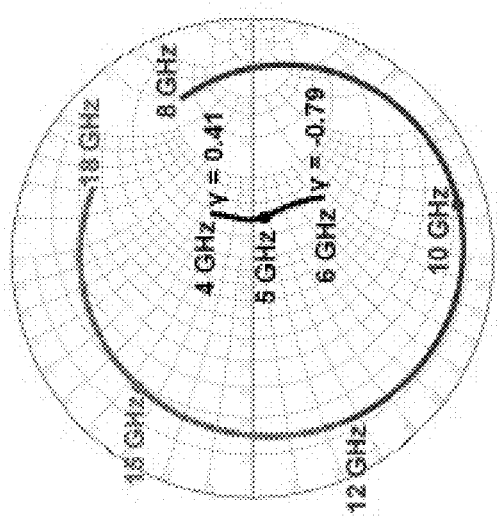
FIG. 7 shows harmonic frequency bands.
Figure 8:
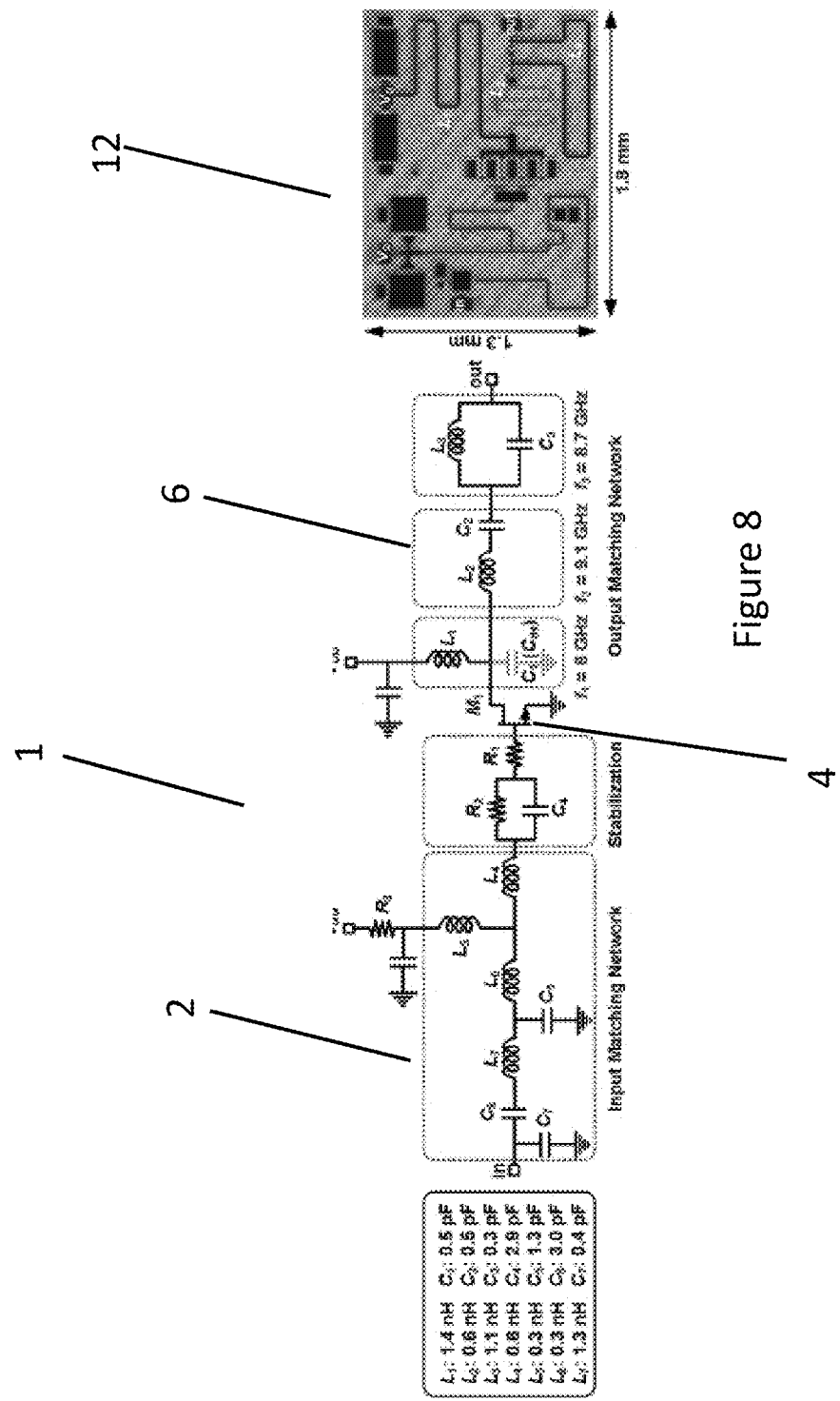
FIG. 8 shows a chip micrograph architecture of an equivalent circuit to FIG. 1.

The input impedance of the harmonic matching network 10 in the fundamental (intrinsic drain) and harmonics (extrinsic drain) frequency bands is shown in FIG. 7. It is noted that load impedance in the fundamental band is almost placed on the constant resistance arc of the Smith chart, as theoretically expected from (1), while traces of the load impedance in the second- and third-harmonic bands are close to the high-efficiency areas shown in FIGS. 6a and 6b. The PA circuit schematic 1 and chip micrograph 12 are shown in FIG. 8.

Figure 9:
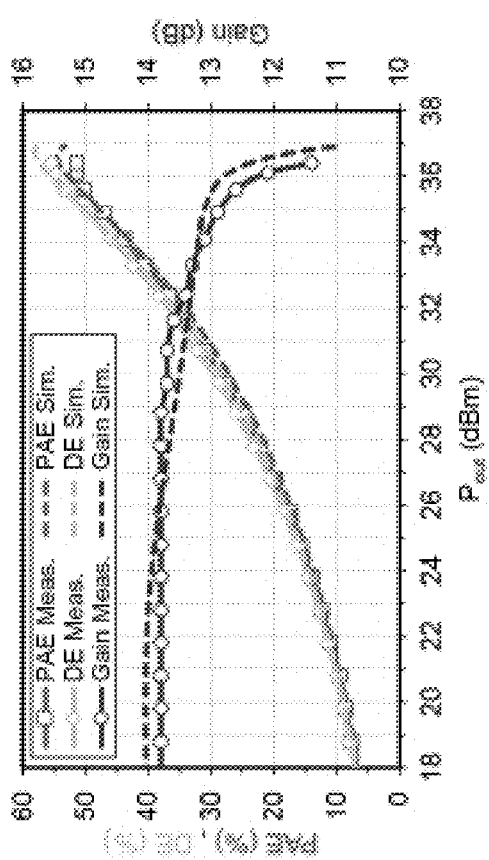
FIGS. 9 and 10 show CW measurement results.
Figure 10:
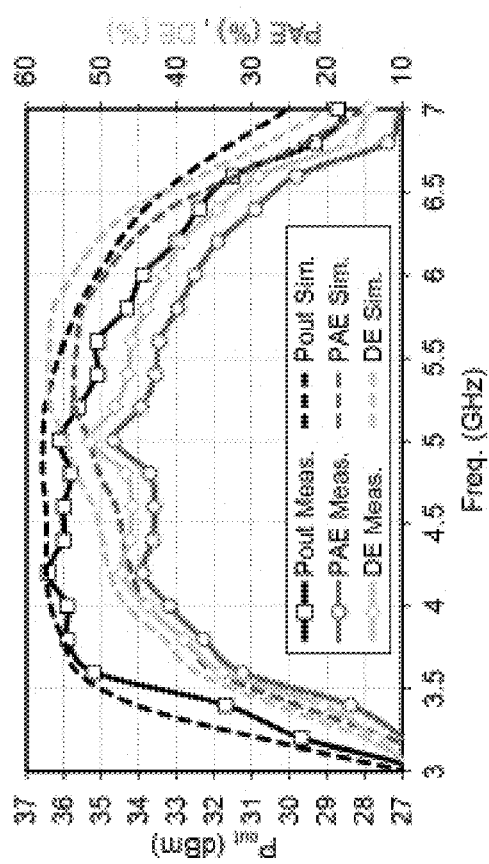

CW measurement results are shown in FIGS. 9 and 10. The chip is fabricated in a 0.25-μm GaN-on-SiC process from WIN Semiconductors. The PA 1 is biased at $V_{GS} = -2.4$ V and $V_{DS} = 28$ V, consuming 17 mA of bias current. The gate-source bias voltage is chosen such that soft gain compression of the PA 1 be minimized. Measured drain efficiency (DE), power-added efficiency (PAE), and gain versus output power are shown in FIG. 9. The PA 1 achieves maximum output power of 36.1 dBm and maximum DE/PAE of 51/48%, with associated power gain of 12.2 dB. In FIG. 10, output power and DE/PAE are shown versus frequency, at the fixed input power of 24 dBm. The PA 1 achieves 33.9-36.1 dBm output power, 42-51% DE, 38-48% PAE, and 10-12.2 dB power gain in 4.0-6.0 GHz. The output power 1-dB bandwidth is 3.6-5.6 GHz.

Figure 11:
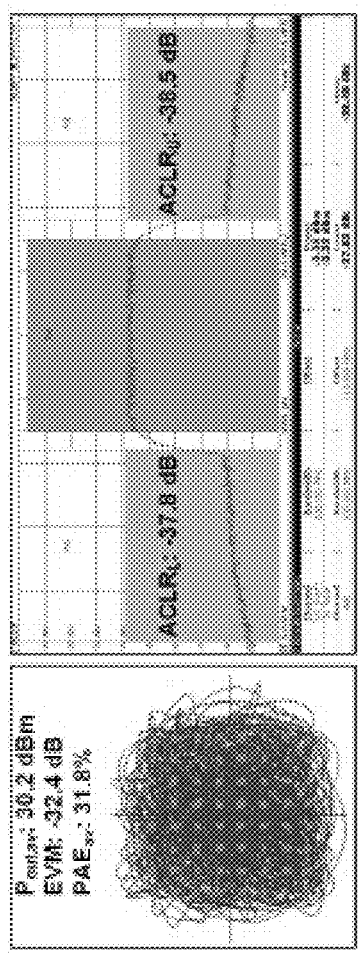
FIG. 11 shows a measured output signal constellation and spectrum for a 64-QAM signal.
Figure 12:
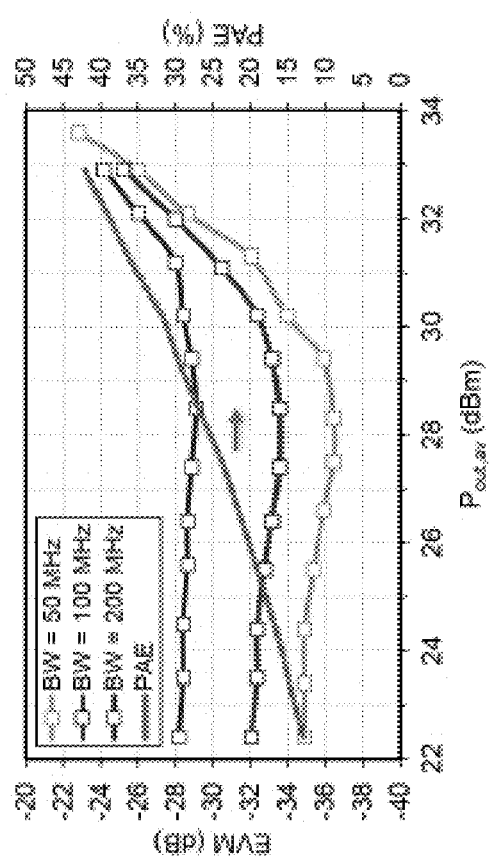
FIG. 12 shows EVM and average PAE versus average output power for different modulation bandwidths.

The modulated signal measurements are performed by using R&S SMW200A vector signal generator and R&S FSW43 vector signal analyzer. In FIG. 11, measured output signal constellation and spectrum are shown for a 64-QAM signal with 100 MHz modulation bandwidth and 8 dB PAPR, at 5.0 GHz. An error vector magnitude (EVM) of −32.4 dB (2.4%) is achieved at average output power of 30.2 dBm. Also, adjacent channel leakage ratio (ACLR) of the output spectrum is −37.8 dBc for the lower channel and −38.5 dBc for the upper channel. In FIG. 12, EVM and average PAE are given versus average output power for different modulation bandwidths. The EVM degrades with an increased modulation bandwidth. For EVM<−28 dB, average output power of 32.1/32.0/30.2 dBm and average PAE of 39/38/32% are achieved for 50/100/200 MHz modulation bandwidth. The effect of higher modulation bandwidth is more pronounced when a more stringent EVM condition should be satisfied.

In Table II shown below, performance of the designed PA is compared with broadband GaN MMIC PAs. The PA achieves a high efficiency over 4-6 GHz (40.8% fractional bandwidth), while it features a small chip area using the proposed harmonic matching network. Moreover, a low EVM of −32 dB is obtained for a 64-QAM signal with 100 MHz modulation bandwidth ($BW_m$), which is essential for 5G applications.

TABLE II

COMPARISON OF BROADBAND GAN MMIC PAs

| | This Work | [7] | [8] | [9] | [10] |
|---|---|---|---|---|---|
| BW (GHz) | 4-6 | 2.2-3.1 | 6.4-8.3 | 5.2-6.8 | 4.9-5.9 |
| $P_o$ (dBm) | 33.9-36.1 | 24-27 | 36-36.6 | 45.7-46.4 | 37-37.7 |
| PAE (%) | 38-48 | 40-52 | 40-50 | 52-57 | 48-55 |
| Gain (dB) | 10-12.2 | 7-10 | 10-12 | 22 | 28.5-31.7 |
| Modulation | 64-QAM | — | 256-QAM | — | 256-QAM |
| $BW_m$ (MHz) | 100 | — | 7 | — | 80 |
| PAPR (dB) | 8.0 | — | 7.4 | — | 11.25 |
| $f_c$ (GHz) | 5 | — | 7 | — | 5.7 |
| EVM (dB) | −32 | — | — | — | −32 |
| $P_{o,av}$ (dBm) | 30.2 | — | 28.7 | — | 30.6 |
| $PAE_{av}$ (%) | 32 | — | 26 | — | 27 |
| Area (mm²) | 2.3 | 4.0 | 7.8 | 12.5 | 4.7 |
| Process | 0.25 μm | 0.8 μm | 0.25 μm | 0.25 μm | 0.25 μm |

Figure 13:
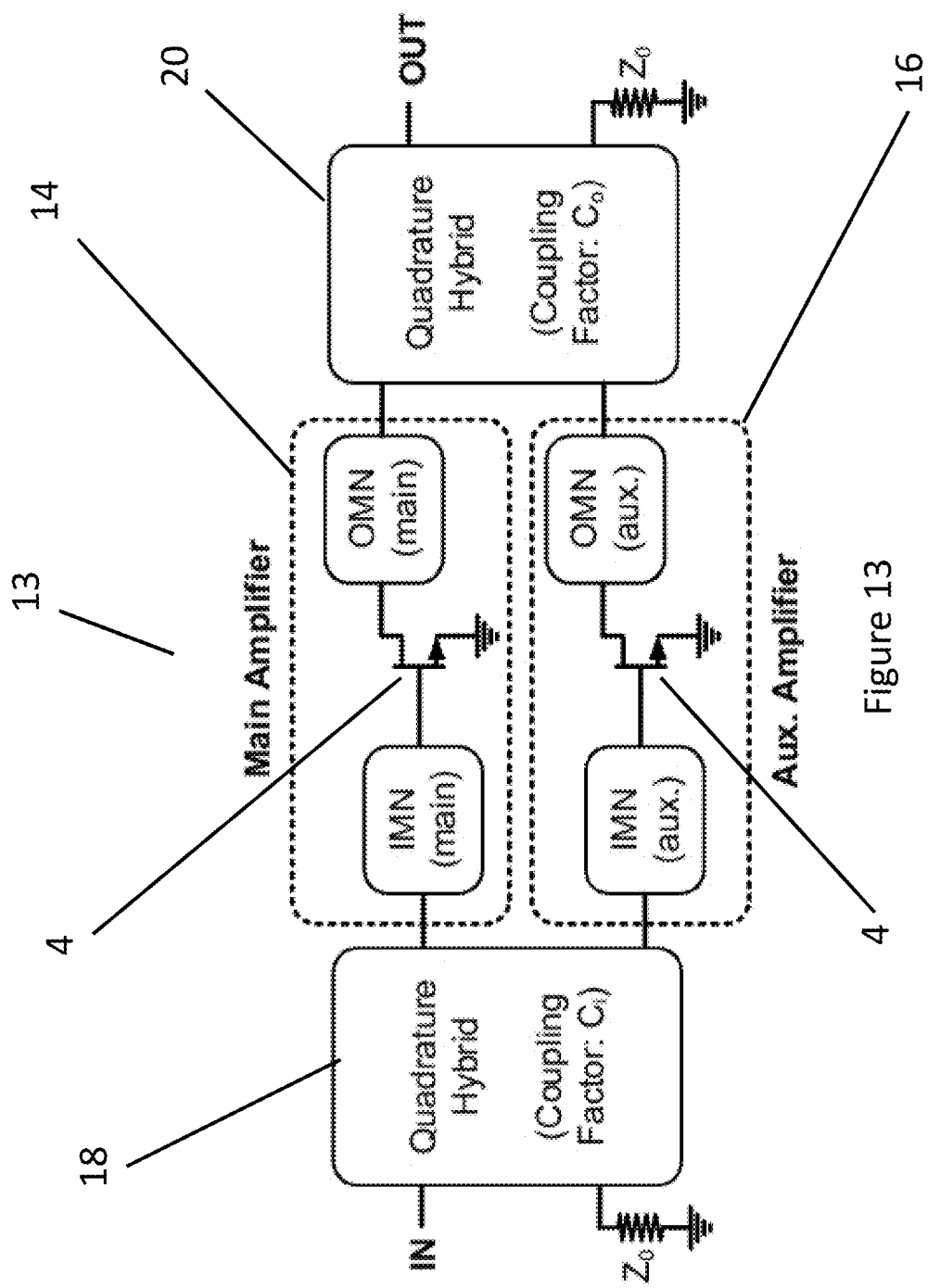
FIG. 13 shows a PA circuit based on a modified balanced amplifier structure.

A PA circuit 13 based on a modified balanced amplifier structure is shown in FIG. 13. This PA architecture can provide load modulation over a broad bandwidth. The PA shown in the FIG. 13 is composed of a main amplifier 14 biased at class-B, an auxiliary amplifier 16 biased at class-C, an asymmetry quadrature hybrid 18 operating as the input power divider, and an asymmetry quadrature hybrid 20 operating as the output power combiner. The amplifiers 14, 16 are matched to the source and load impedances, normally 50 ohms, using input 2 and output matching 10 networks. The size of auxiliary amplifier 16 is larger than that of the main amplifier 14, by a factor that determines the output power back-off where efficiency is maximized. The coupling coefficient of the input hybrid is chosen such that a larger portion of the input power be applied to the auxiliary amplifier 16. The output hybrid 20 is designed to combine output power of the two amplifiers 14, 16 based on a specific weighting. Its coupling coefficient determines these weights. The bias of the auxiliary amplifier 16 is selected based on the desired back-off level.

Figure 33:
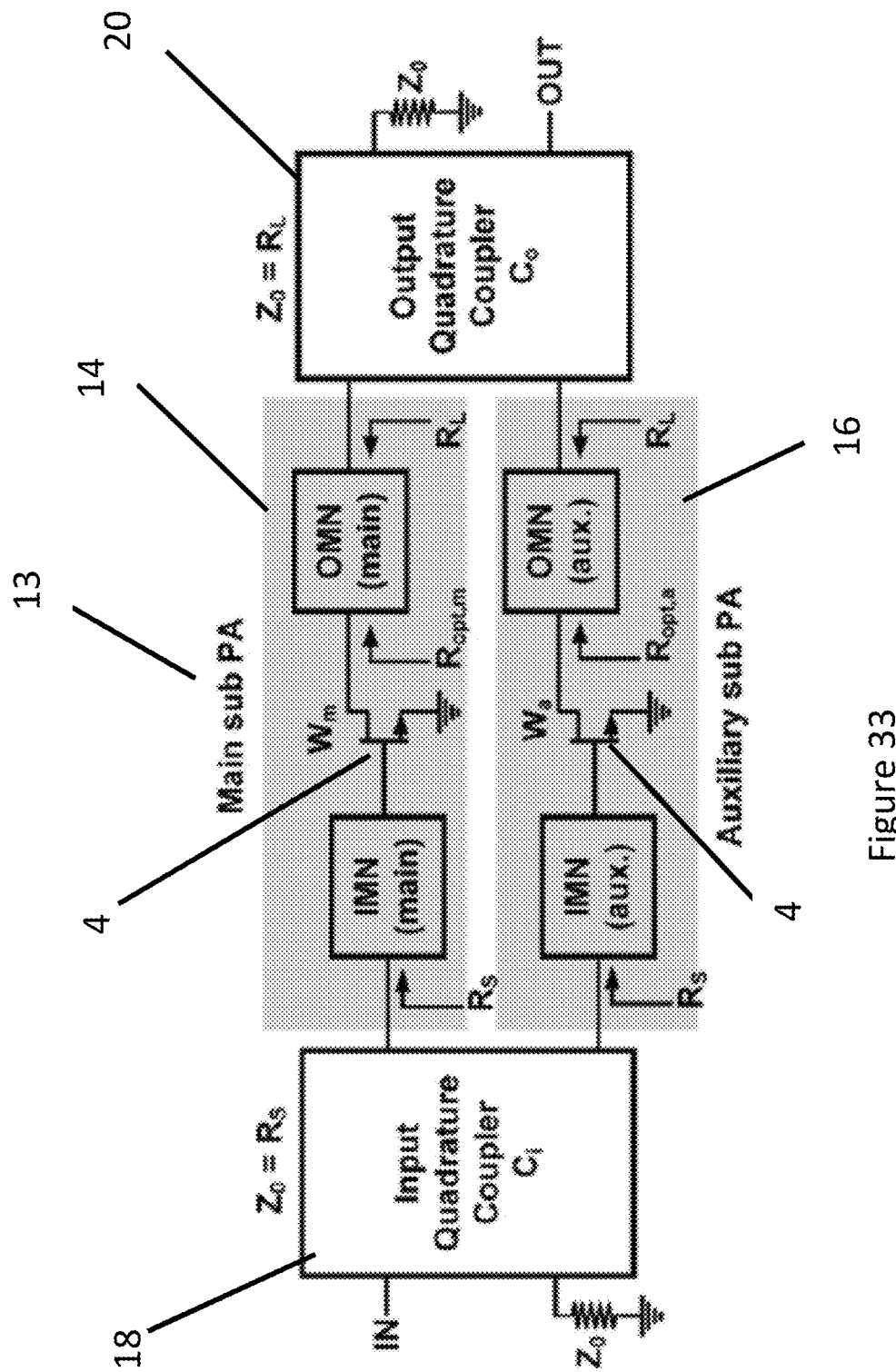
FIG. 33 shows a PA circuit having unbalanced architecture.

FIG. 33 shows an example unbalanced PA architecture including the main amplifier 14 biased at class-B, the auxiliary amplifier 16 biased at class-C, the asymmetry quadrature hybrid 18 operating as the input power divider, and the asymmetry quadrature hybrid 20 operating as the output power combiner. The input power is divided between the main amplifier 14 and auxiliary amplifier 16 based on the coupling coefficient of the input coupler 18 in the example of FIG. 33.

Back-Off Efficiency Enhancement

Figure 14:
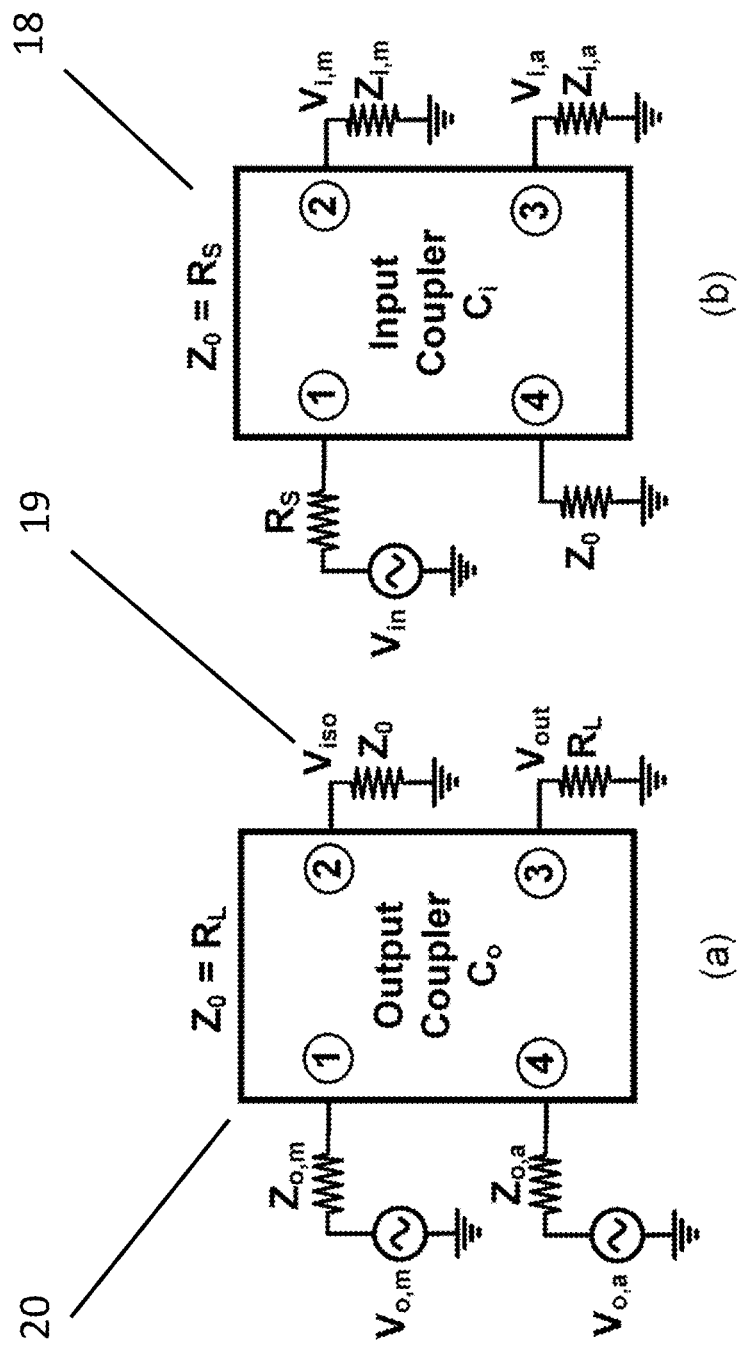
FIG. 14 shows equivalent circuits used for analysis of the unbalanced PA (14a is an output circuit and 14b is an input circuit)

A directional coupler can be described by the following matrix of scattering parameters:

$$S = \begin{bmatrix} 0 & a & -jb & 0 \\ a & 0 & 0 & -jb \\ -jb & 0 & 0 & a \\ 0 & -jb & a & 0 \end{bmatrix} \quad (22)$$

where a and b are related to the coupling coefficient of the coupler and $0<C<1$ as a=C and b=$\sqrt{1-C^2}$. FIG. 14 shows equivalent circuits used for analysis of the unbalanced PA. Using the circuit of FIG. 14 (14(a) is an output circuit and 14(b) in an input circuit) and assuming that output impedance of the main and auxiliary sub PAs 14, 16 is matched to the load impedance and the output coupler 20, i.e., $Z_{o,m}=Z_{o,a}=Z_0=R_L$, the output voltage is derived as $$V_{out}=V_3^-=S_{31}V_1^+ + S_{34}V_4^+ \quad (23)$$

leading to $$V_{out}=-j\sqrt{1-C_o^2}V_{0,m}+C_0V_{0,a} \quad (24)$$

It should be noted that because the input hybrid coupler 18 provides 90 phase shift between the input voltages of the main and auxiliary amplifiers, there is also a 90 phase difference between their output voltages, i.e., these can be considered as $V_{0,m}=|V_{0,m}|$ and $V_{0,a}=-j|V_{0,a}|$. For small output coupling coefficients, $|V_{out}|\sim|V_{out,m}|$, while for large coupling coefficients, $|V_{out}|\sim|V_{o,a}|$. Therefore, a moderate coupling coefficient should be chosen to achieve proper back-off efficiency enhancement. The power delivered to the load $P_{out}=|V_{out}|^2/2R_L$, can be determined using equation 25 as $$P_{out}=(1-C_o^2)P_{0,m}+C_o^2P_{0,a}+2C_0\sqrt{1-C_o^2}\sqrt{P_{0,m}P_{0,a}} \quad (25)$$

where $P_{0,m}=|V_{o,m}|^2/2R_L$ and $P_{0,a}=|V_{o,a}|^2/2R_L$ respectively denote output power of the main and auxiliary sub PAs 14, 16. A part of the power generated by the main and auxiliary sub PAs 14, 16 is delivered to the isolated port 19. Using FIG. 14, voltage of the isolated port 19 can be obtained as $$V_{iso}=V_2^-=S_{21}V_1^+ + S_{24}V_4^+ \quad (26)$$

resulting in $$V_{iso}=C_0V_{0,m}-j\sqrt{1-C_o^2}V_{o,a} \quad (27)$$

If the output voltage ratio of the main and auxiliary PAs 14,16 can be maintained as $|V_{o,a}|/|V_{0,m}|=C_o/\sqrt{1-C_o^2}$ then $V_{iso}=0$ and the power delivered to the isolated port 19 becomes zero. However, this is not a requisite to achieve a high efficiency at back-off where $V_{o,a}=0$. The power delivered to the isolated port 19 is derived as $$P_{iso}=C_o^2P_{0,m}+(1-C_o^2)P_{0,a}-2C_0\sqrt{1-C_o^2}\sqrt{P_{0,m}P_{0,a}} \quad (28)$$

It is noted that $P_{out}+P_{iso}=P_{o,m}+P_{o,a}$ as expected from power conservation. The $P_{iso}$ should be minimized to improve the efficiency of the output power combiner 20, e.g., through using a small coupling coefficient $C_o$.

Figure 15:
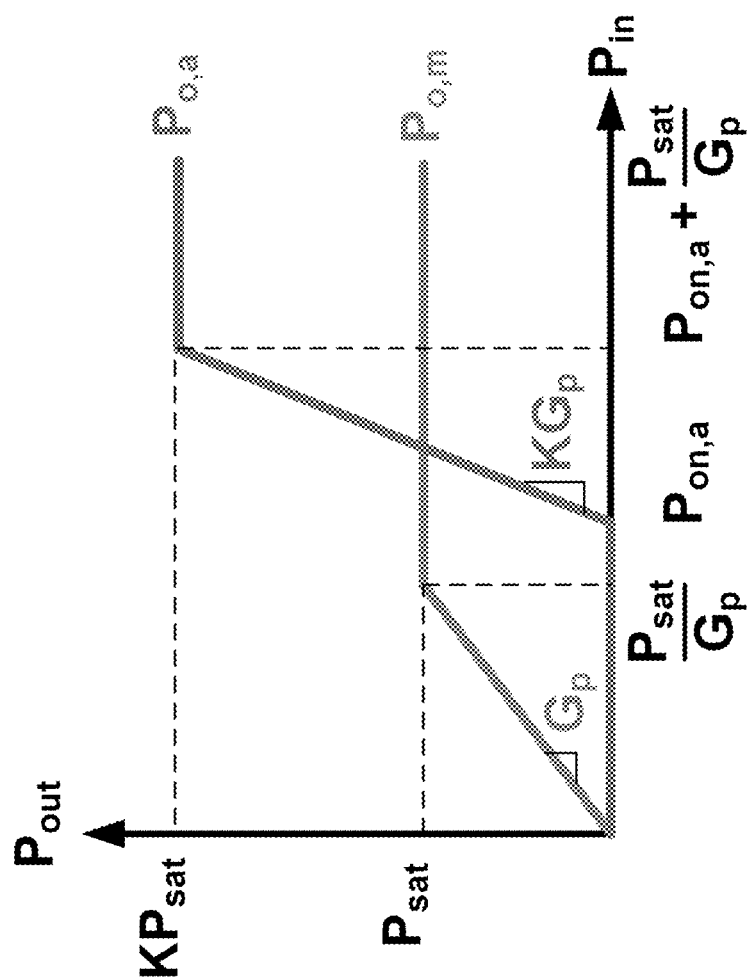
FIG. 15 shows simplified models of sub PA's input-output characteristics

The input-output characteristics of the two sub PAs 14, 16 can be modelled as shown in FIG. 15. It is assumed that the main sub PA 14 is biased at class-B and features a linear power gain of $G_P$ and saturated output power level of $P_{sat}$. The input saturation power level is given by $P_{sat}/G_p$. The auxiliary sub PA 16 is biased at class-C with input turn-on power level of $P_{on,a}$. The auxiliary sub PA 16 can turn on either before or after saturation of the main sub PA 14. We choose the PA parameters such that the onset of the main sub PA 14 saturation coincides with the turnon of the auxiliary sub PA 16, and define associated input power to the PA as the input back-off power $P_{in,bo}$. The width of auxiliary transistor $W_a$ is larger than that of the main transistor $W_m$ by a factor of K, thus its linear power gain and saturated output power level are roughly given by $KG_p$ and $KP_{sat}$ $$K = \frac{G_{p,a}}{G_{p,m}} = \frac{P_{sat,a}}{P_{sat,m}} = \frac{W_a}{W_m} \qquad (29)$$

This simplified model is useful to provide an understanding on operation of the unbalanced PA.

Using Equation 25 and 29, the output power level at peak-power and back-off can be derived as $$P_{out,pp} = (\sqrt{1-C_o^2} + \sqrt{K}C_0)^2 P_{sat} \qquad (30)$$

$$P_{out,bo} = (1-C_o^2) p_{sat} \qquad (31)$$

resulting in the output power back-off (OPBO) level of $$OPBO = 20\log_{10}\left[1 + \frac{\sqrt{K}\,c_0}{\sqrt{1-C_o^2}}\right] \qquad (32)$$

Figure 16:
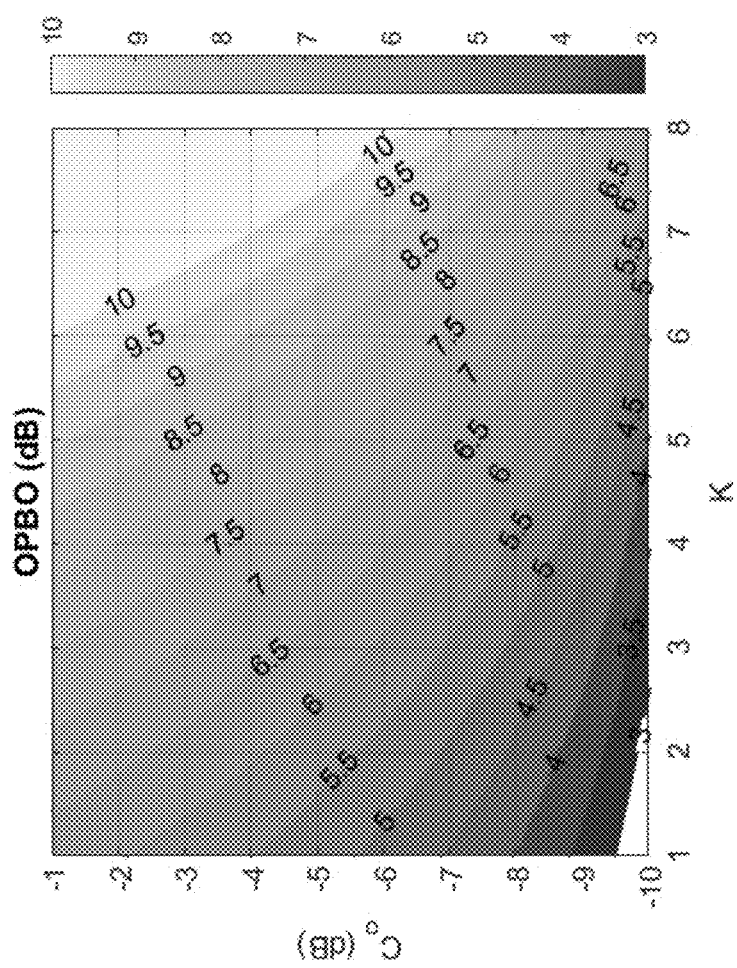
FIG. 16 shows output power back-off level versus the width ratio of the transistors K and coupling coefficient of the output coupler $C_O$

It is noted that back-off level is dependent on the transistors' width ratio and the coupling coefficient of the output coupler 20. In FIG. 16, OPBO is shown versus the parameters K and $C_o$. For a 3-dB coupler ($C_o=1/\sqrt{2}$), the 6-dB back-off requires K=1, which is the same as in the Doherty PA. For smaller coupling coefficients, e.g., 4.8 dB ($C_o=1/\sqrt{3}$), the transistors' width ratio should be larger (K=2).

The input power applied to the PA is distributed between the main and auxiliary sub PAs 14, 16. Using the circuit of FIG. 14(b), assuming that input impedance of the sub PAs 14, 16 is matched to the input coupler 18 and input source impedance, i.e., $Z_{i,m}=Z_{i,a}=Z_0=R_S$, it can be shown that $$V_{in,m}=V_2^-=S_{21}V_1^+=C_iV_{in} \qquad (33)$$

$$V_{in,a}=V_3^-=S_{31}V_1^+=-j\sqrt{1-C_i^2}\,V_{in} \qquad (34)$$

where $C_i$ is the coupling coefficient of the input hybrid coupler 18. The input power delivered to the main and auxiliary sub PAs 14, 16 are given by $$P_{i,m}=C_i^2 P_{in} \qquad (35)$$

$$P_{i,a}=(1-C_i^2)P_{in} \qquad (36)$$

Therefore, output power of the main and auxiliary sub PAs 14, 16 are derived in terms of the input power as follows.

$$P_{o,m} = \begin{cases} G_p C_i^2 P_{in} & P_{in} < P_{in,bo} \\ P_{sat} & P_{in} \geq P_{in,bo} \end{cases} \qquad (37)$$

$$P_{o,a} = \begin{cases} 0 & P_{in} < P_{in,bo} \\ KG_p(1-C_i^2)(P_{in}-P_{in,bo}) & P_{in,bo} \leq P_{in} < P_{in,pp} \\ KP_{sat} & P_{in} \geq P_{in,pp} \end{cases} \qquad (38)$$

where $P_{in,bo}$ and $P_{in,pp}$ are respectively the input power level at the back-off and peak-power, given by $$P_{in,bo} = \frac{P_{sat}}{C_i^2 G_p} = \frac{P_{on,a}}{1-C_i^2} \qquad (39)$$

$$P_{in,pp} = \frac{P_{sat}}{c_i^2(1-c_i^2)G_p} \qquad (40)$$

Using equation 40, the required turn-on power level of the auxiliary sub PA 16 can be derived. The input-output power characteristic of the unbalanced PA can be derived using equations 25, 37, and 38.

The total efficiency of the unbalanced PA can be derived as $$\eta = \frac{(1-C_o^2)P_{o,m} + C_o^2 P_{0,a} + 2C_0\sqrt{1-C_o^2}\,\sqrt{P_{o,m}P_{0,a}}}{\frac{1}{\eta_m}P_{o,m} + \frac{1}{\eta_a}P_{o,a}} \qquad (41)$$

where $\eta_m$ and $\eta_a$ respectively denote efficiency of the main and auxiliary sub PAs 14, 16. Using equations 37, 38, and 41, the efficiency at back-off and peak-power is given by $$\eta_{bo} = (1-C_o^2)\eta_m \qquad (42)$$

$$\eta_{pp} = \frac{\left(\sqrt{1-C_o^2} + \sqrt{K}\,C_0\right)^2}{\frac{1}{\eta_m} + \frac{K}{\eta_a}} \qquad (43)$$

It is noted that the efficiency at back-off and peak-power can be different. Using equations 32, 42, and 43, it can be shown that $$\frac{\eta_{bo}}{\eta_{pp}} = \left[1 + K\frac{\eta_m}{\eta_a}\right]10^{-OPBO/20} \qquad (44)$$

which is larger than unity for $K>(10^{OPBO/20}-1)\eta_a/\eta_m$. For the 6-dB back-off level and $\eta_a=\eta_m$, it can be satisfied for K>1, i.e., $C_o<1/\sqrt{2}$. Therefore, a smaller output coupling coefficient is preferred to achieve higher back-off efficiency.

In the output power levels other than the peak-power and back-off, the efficiency described by equation (41) is power-dependent through $P_{o,m}$, $P_{o,a}$, and $\eta_m$ and $\eta_a$. To obtain $\eta_m$ and $\eta_a$ in terms of the input power, we first note that the drain current of a short-channel transistor in the saturation is given by $$I_D \approx k_0 W(V_{GS}-V_T) \qquad (45)$$

where $k_0$ is a process-dependent parameter, W is width of the transistor, $V_{GS}$ is the gate-source voltage, and $V_T$ denotes the threshold (pinch-off) voltage of the enhancement (depletion) mode transistor. We assume an RF signal in the form of $$V_{GS}(t)=V_{GS0}+V_{RF}\cos(\omega_0 t) \qquad (46)$$

is applied to the transistor. The drain current waveform is dependent on the bias mode. If the transistor is biased in the class-B mode, i.e., $V_{GS0}=V_T$, as in the main sub PA, the resulting drain current is an half-wave sinusoid with the peak of $k_0 W V_{RF}$. Both the DC and fundamental components of this waveform, $I_{D0}$ and $I_{D1}$, are proportional with $V_{RF}$. As a result, the DC and RF power change as $P_{DC}=V_{DD}I_{D0} \propto V_{RF}$ and $P_{RF} \propto R_{opt}I_{D1}^2 \propto V_{RF}^2$, leading to $\eta=P_{RF}/P_{DC} \propto V_{RF}$. For a matched transistor, $P_{in} \propto V_{RF}^2$, thus $\eta \propto \sqrt{P_{in}}$. Therefore, the efficiency of the main sub PA 14 can be expressed as $$\eta_m(P_{in}) = \begin{cases} \eta_m \sqrt{\dfrac{P_{in}}{P_{in,bo}}} & P_{in} < P_{in,bo} \\ \eta_m & P_{in} \geq P_{in,bo} \end{cases} \quad (47)$$

where $\eta_m$ denotes the maximum efficiency at saturation, e.g., $\eta_m=\pi/4=78.5\%$ in the class-B mode.

If the transistor is biased in the class-C mode, i.e., $V_{GS0}<V_T$, as in the sub auxiliary PA 16, a different situation should be considered. The conduction angle of the current waveform is derived using equation 45 and equation 46 as $$\alpha = 2\cos^{-1}\left[\dfrac{V_T - V_{GS0}}{V_{RF}}\right] \quad (48)$$

which is dependent on the RF voltage amplitude. Conventionally, the conduction angle is defined at the maximum RF voltage which leads to the PA saturation. It can be shown that the current waveform components $I_{D0}$ and $I_{D1}$ are derived as $$I_{Do}(\alpha) = \dfrac{k_0 W V_{RF} 2\sin\left(\frac{\alpha}{2}\right) - \alpha\cos\left(\frac{\alpha}{2}\right)}{2\pi\left(1 - \cos\left(\frac{\alpha}{2}\right)\right)} \quad (49)$$

$$I_{D1}(\alpha) = \dfrac{k_0 W V_{RF}(\alpha - \sin(\alpha))}{2\pi\left(1 - \cos\left(\frac{\alpha}{2}\right)\right)} \quad (50)$$

The DC power is given by $P_{DC}=V_{DD}I_{D0}(\alpha)$, while the RF power is derived as $P_{RF}=(1/2)R_{opt}(\alpha)I_{D1}^2(\alpha) \sim (1/2)[V_{DD}/I_{D1,max}(\alpha)]I_{D1}^2(\alpha)$, where $I_{D1,max}$ denotes the fundamental drain current components at the maximum RF voltage $V_{RF,max}$. Therefore, using equations 49 and 50, the efficiency can be expressed as $$\eta(\alpha) \approx \dfrac{1}{2}\dfrac{I_{D1}^2(\alpha)}{I_{D1,max}(\alpha)I_{D0}(\alpha)} = \eta_{max}(\alpha)\dfrac{V_{RF}}{V_{RF,max}} \quad (51)$$

where $\eta_{max}(\alpha)$ is the maximum efficiency of class-C PA at saturation $$\eta_{max}(\alpha) = \dfrac{1}{4}\dfrac{\alpha - \sin(\alpha)}{\sin\left(\frac{\alpha}{2}\right) - \frac{\alpha}{2}\cos\left(\frac{\alpha}{2}\right)} \quad (52)$$

The parameter $V_{RF}/V_{RF,max}$ can be related to the input power using $V_{RF} \propto \sqrt{P_{in}}$ and noting that the auxiliary sub PA 16 turns on at $P_{in,bo}$ and reaches the saturation at $P_{in,pp}$. Therefore, the efficiency of the sub auxiliary PA 16 can be expressed as $$\eta_a(P_{in}) = \begin{cases} 0 & P_{in} < P_{in,bo} \\ \eta_a \sqrt{\dfrac{P_{in} - P_{in,bo}}{P_{in,pp} - P_{in,bo}}} & P_{in,bo} \leq P_{in} < P_{in,pp} \\ \eta_a & P_{in} \geq P_{in,pp} \end{cases} \quad (53)$$

where $\eta_a$ is given by (51).

Figure 17:
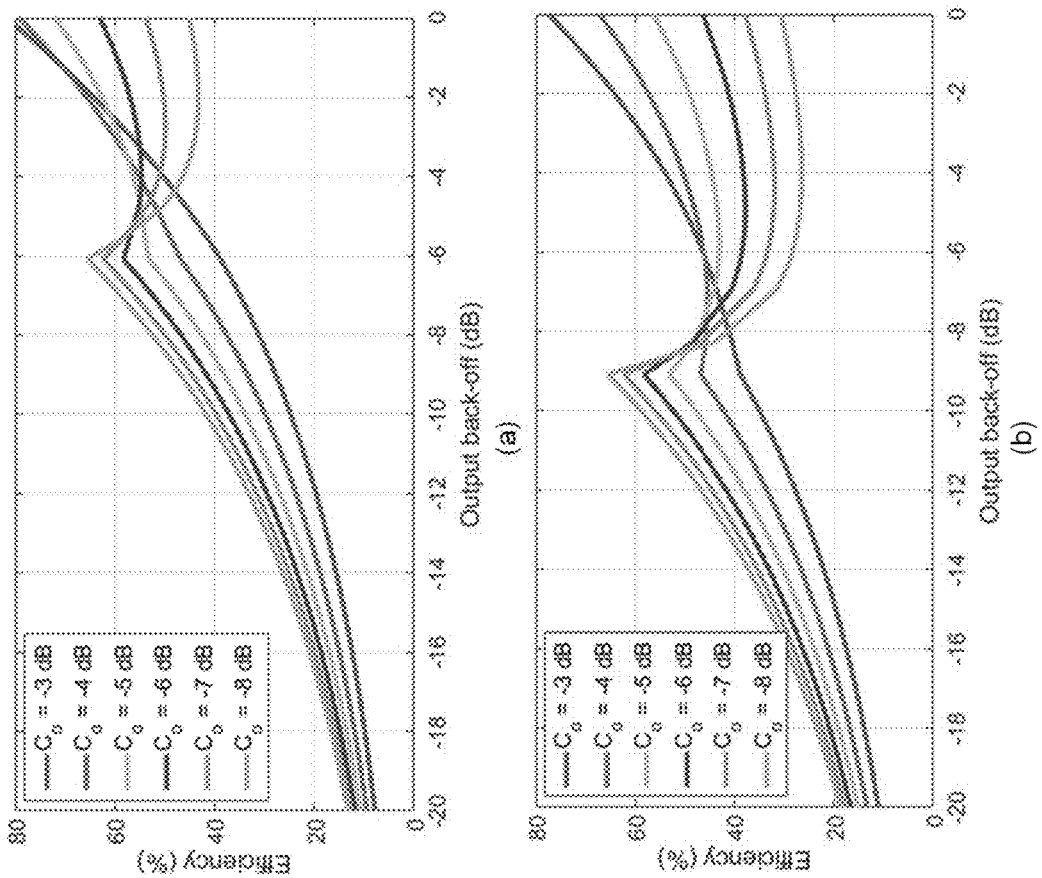
FIG. 17 shows efficiency of the unbalanced PA versus normalised output power.

The total efficiency of the unbalanced PA (equation 41) can be derived versus the output power as shown in FIG. 17. FIG. 17(a) is for 6-dB OPBO and FIG. 17(b) is for 9-dB OPBO. It is assumed that the maximum efficiency of the main and auxiliary sub PAs 14, 16 are respectively $\eta_m=78.5\%$ (class-B) and $\eta_a=85.5\%$ (class-C with conduction angle of $\alpha=0.8\pi$), while the coupling coefficient of the input coupler 18 is $C_i=-3$ dB. It is noted that by decreasing the coupling coefficient of the output coupler 18 ($C_o$), the back-off efficiency $\eta_{bo}$ improves at the cost of the reduced peak-power efficiency $\eta_{pp}$. For small $C_o$, $\eta_{bo} \to \eta_m$, as expected from equation 42. It is also possible to achieve a Doherty-like behavior, e.g., for $C_o \sim -6$ dB, but higher efficiency at back-off is preferred for modulated signals with large PAPR which their probability density function (PDF) is mostly concentrated around the back-off.

Figure 34:
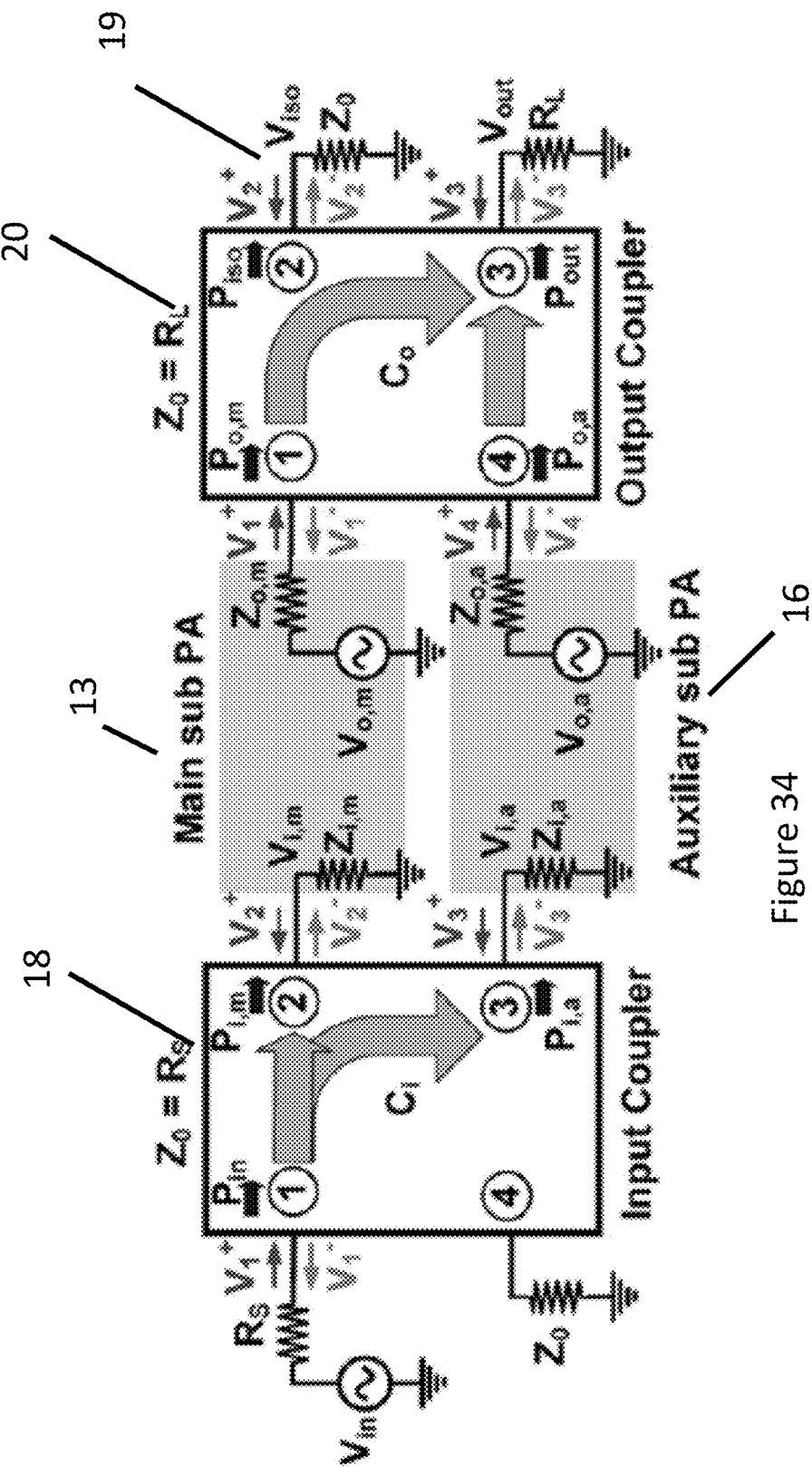
FIG. 34 shows an equivalent circuit used for analysis of the unbalanced PA of FIG. 33.

FIG. 34 shows an example equivalent circuit used for analysis of the unbalanced PA of the example in FIG. 33. The wide arrows in FIG. 34 show the desired power flow paths.

Figure 35:
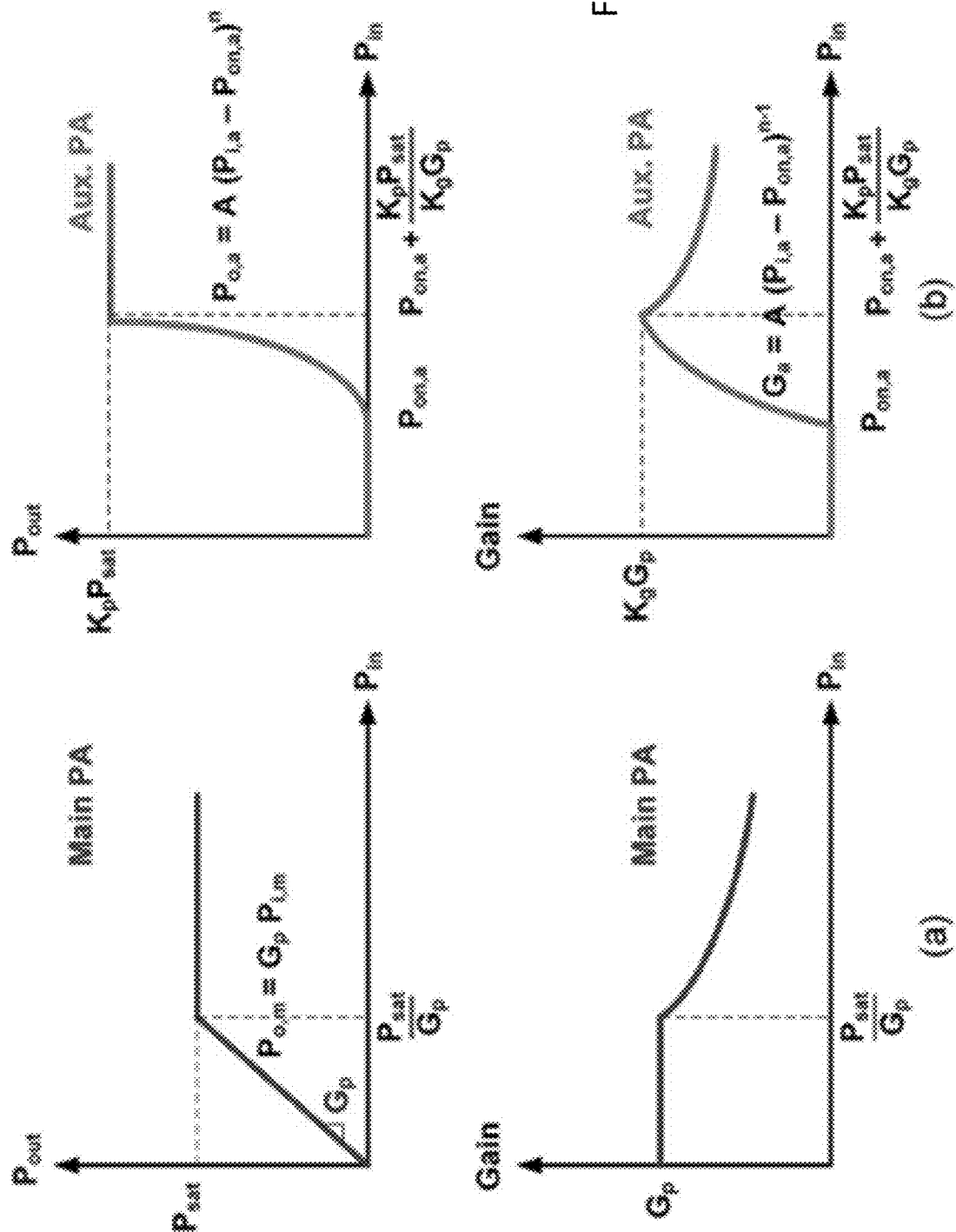
FIG. 35 shows simplified models of the sub-PAs' of FIG. 33 output power and gain versus input power characteristics.

We refer to the example of FIG. 33. The output power and gain versus input power characteristics of the two sub-PAs can be modeled as shown in FIG. 35. The main sub-PA biased in class-AB is modeled by a linear power gain of GP up to saturation where the output power is assumed to be constant at $_{Psat}$. The input saturation power level is given by $P_{sat/Gp}$. The auxiliary sub-PA is biased in class-C with an input turn-on power level of $P_{on,a}$. Both the output power and gain are zero for the input power levels below $P_{on,a}$ and gradually increase after the turn on. The dependence of the output power and gain on the input power is nonlinear, and we describe this as:

$$P_{o,a}=A(P_{i,a}-P_{on,a})^n \quad (53a)$$

$$G_a=A(P_{i,a}-P_{on,a})^{n-1} \quad (53b)$$

where n is a bias- and process-dependent parameter (typically 1<n<2). Parameter A can be determined as follows. We assume that the output power at saturation and power gain of the auxiliary sub-PA are, respectively, given by $K_p$ Psat and KgGp. The parameters $K_p$ and $K_g$ are defined as $$K_p=P_{sat,a}/P_{sat,m} \quad (53c)$$

$$K_g=G_{p,a}/G_{p,m} \quad (53d)$$

Using (53a)-(53d), $A=(K_g G_p)^n/(K_p{}_{Psat})^{n-1}$, while the input saturation power of the auxiliary sub-PA is derived as $_{Pon,a}+K_p{}_{Psat/KgGp}$, as shown in FIG. 35. The width of auxiliary transistor $W_a$ is larger than that of the main transistor $W_m$ by a factor of $K_w$ $$K_w=W_a/W_m \quad (53e)$$

Therefore, its linear power gain and saturated output power level are also scaled with respect to that of the main transistor. Relationship between the saturated power ratio $K_p$, power gain ratio $K_g$, and the transistors' width ratio $K_w$ is dependent on the process and, somehow, the frequency of operation. The output power level of transistors is roughly scaled with their width, $K_p \approx K_w$, while the gain of transistors usually does not scale proportionally but tends to remain constant or even degrade for larger devices due to increased losses (in this design, $K_g \approx 1$). Furthermore, as the auxiliary transistor is based in class-C, its power gain can be lower than that of the class-AB biased main transistor. The auxiliary sub-PA can turn on either just before or after the saturation of the main sub-PA. We choose the PA parameters, such that the onset of the main sub-PA saturation coinciding with the turn-on of the auxiliary sub-PA, and define the associated input power to the PA as the input back-off power Pin,bo.

Using (25) and (53c), the output power level at peak-power and back-off can be derived as $$P_{out,pp} = (\sqrt{1-C_O^2} + \sqrt{K_p}C_O)^2 P_{sat} \qquad (53f)$$

$$P_{out,bo} = (1-C_o^2) P_{sat} \qquad (53g)$$

resulting in the OPBO level of $$OPBO = 20\log_{10}\left[1 + \frac{\sqrt{K_p}\,C_O}{\sqrt{1-C_O^2}}\right] \qquad (53h)$$

Figure 36:
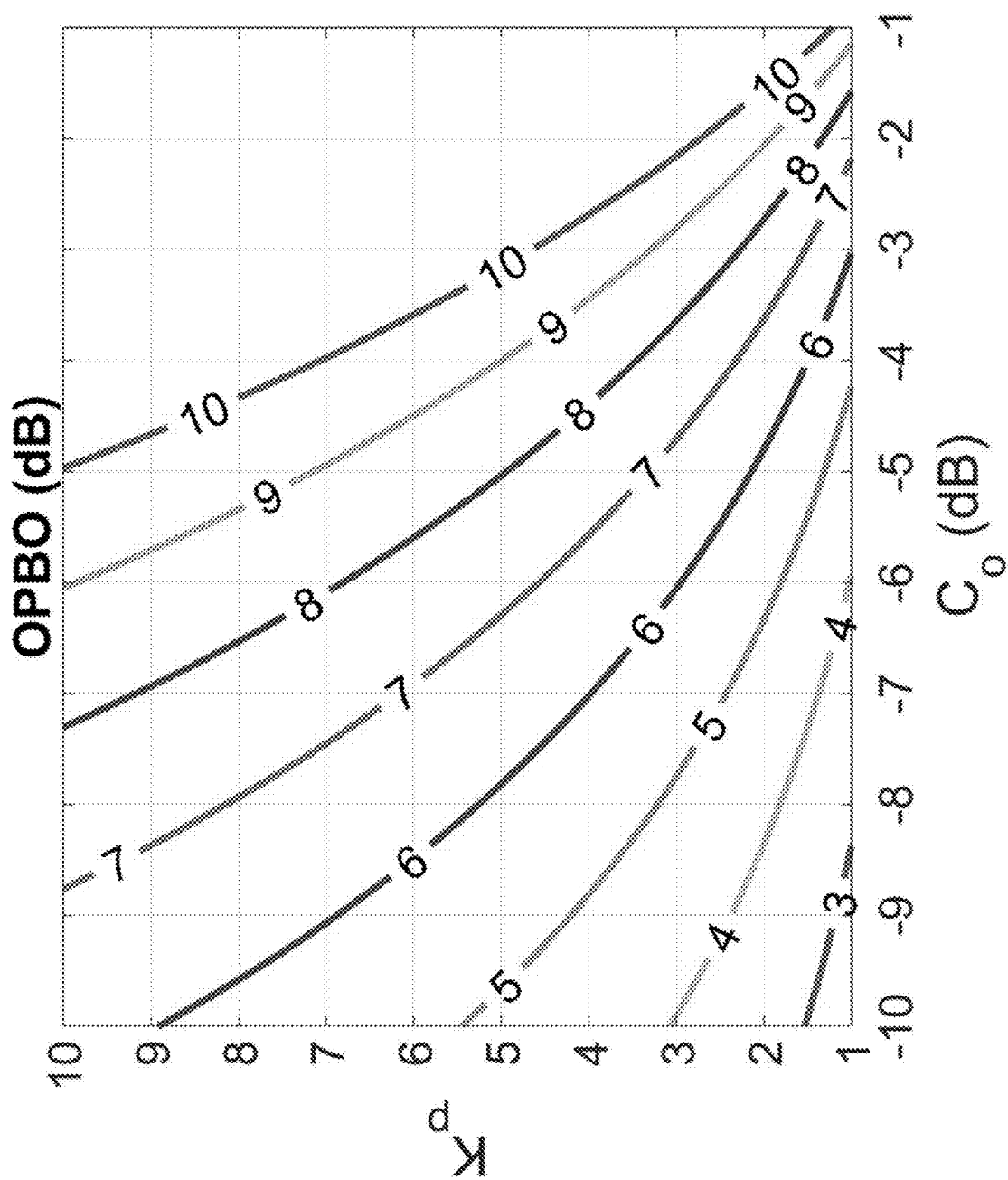
FIG. 36 shows OPBO versus parameters $K_p$ and $C_o$ for the example of FIG. 33.

In line with (30)-(32) above. As above, the back-off level is dependent on the transistors' power ratio and the coupling coefficient of the output coupler. In FIG. 36, OPBO is shown versus parameters $K_p$ and $C_o$. For a 3-dB coupler ($C_o=1/\sqrt{2}$), the 6-dB back-off requires $K_p=1$, which is the same as in the Doherty PA. For lower coupling coefficients, e.g., $-4.8$ dB ($C_o=1/\sqrt{3}$), the transistors' power ratio should be greater ($K_p=2$).

At this point, we note that the back-off level can be controlled by two parameters in the unbalanced PA, while it can only be adjusted by the transistors' width ratio in the Doherty PA. If we assume that the width of the auxiliary transistor is twice of the main transistor and $K_p=K_w=2$, the back-off level of the Doherty PA is derived as $OPBO=20\log_{10}(1+K_p)=9.5$ dB, while, in the unbalanced PA, it can be controlled within a wide range, as indicated by (53h) and FIG. 36.

The output power combiner, as discussed earlier, features an imperfect efficiency due to the power loss in the isolated port. We derive the efficiency of the combiner and investigate effects of the output coupler's coupling coefficient on its performance. The combiner's efficiency is given by $$\eta_{comb} = \frac{P_{out}}{P_{out} + P_{iso}} = \frac{P_{out}}{P_{o,m} + P_{o,a}} \qquad (53i)$$

Using (25), it can be expressed as $$\eta_{comb} = \frac{\left(\sqrt{(1-C_O^2)} + C_O\sqrt{P_{O,a}/P_{O,m}}\right)^2}{1 + P_{O,a}/P_{O,m}} \qquad (53j)$$

which is a function of $C_o$ and the power ratio Po,a/Po,m.

Figure 37:
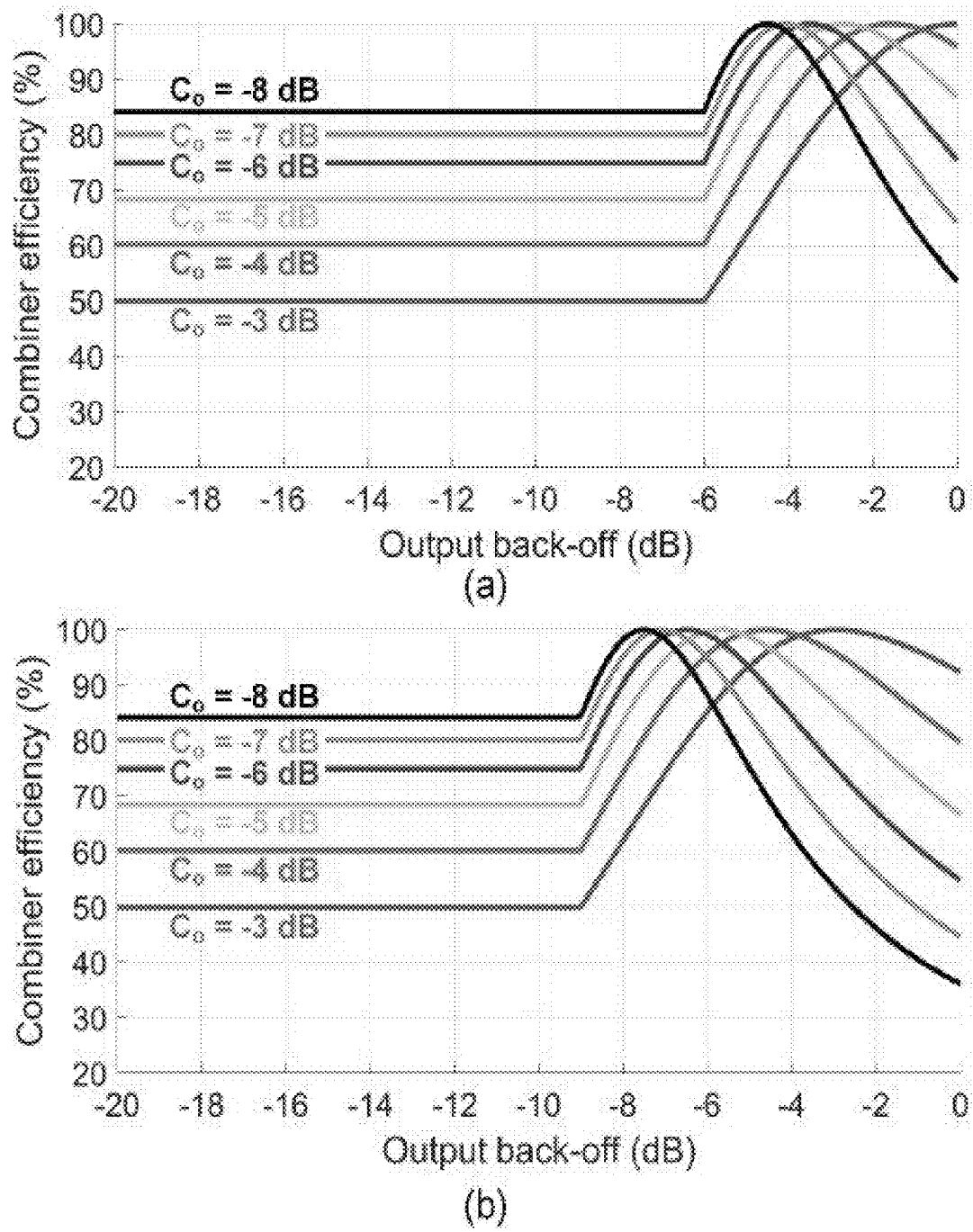
FIG. 37 shows output combiner efficiency versus normalized output power for different coupling coefficients of the output combiner. (a) 6-dB OPBO. (b) 9-dB OPBO.

In FIG. 37, the combiner efficiency is shown versus normalized output power for different $C_o$ values. In the back-off, $\eta_{comb,bo}=1-C_o^2$; therefore, using lower coupling coefficients is preferred for higher efficiency. At the peak power, Po,a/Po,m=$K_p$, where $K_p$ is derived from (53h) for a given OPBO. The combiner efficiency $\eta_{comb,pp}$ reduces for lower coupling coefficients. There is a power level between the back-off and peak power where the combiner efficiency becomes 100%. This is the point where power delivered to the isolated port is zero, which, per (7), is derived as Po,a/Po,m=$C_o^2/(1-C_o^2)$. It can be shown that this happens at the normalized output power level of $-OPBO-20\log_{10}(1-C_o^2)$, e.g., at $-4.5$-dB back-off level for OPBO=6 dB and $C_o=-8$ dB. The input power applied to the PA is distributed as above—see equations (33) and (34).

Figure 18:
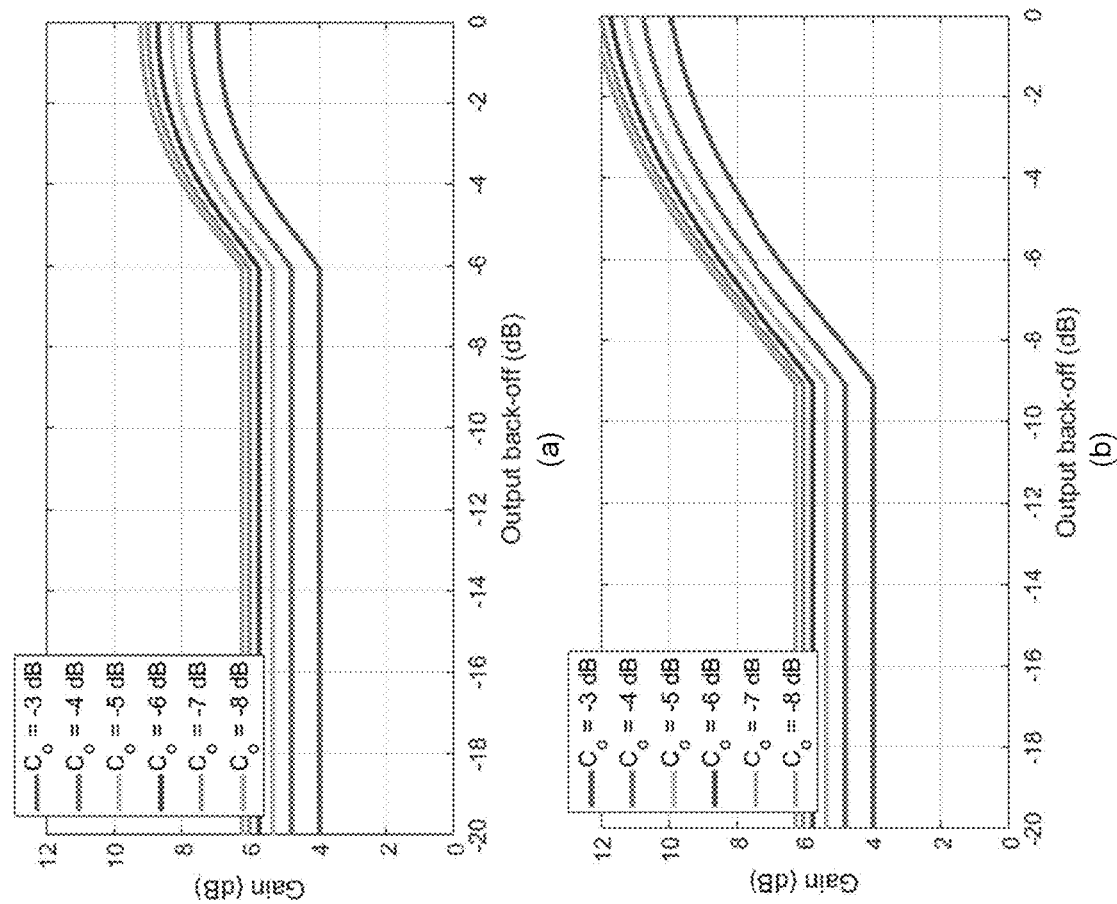
FIG. 18 shows gain of the unbalanced PA versus normalised output power

In FIG. 18 (FIG. 18(a) for 6-dB OPBO, and figure for 18(b) 9-dB OPBO), gain of the unbalanced PA 21 is shown versus the output power. It is assumed that gain of the main and auxiliary sub PAs 14, 16 are respectively $G_p=10$ and $KG_p$, where K is determined based on OPBO and $C_o$ using equation 32. Also, $C_i=-3$ dB is considered in simulations. The gain at back-off, using equations 25 and 36, is given by $(1-C_2)C_i^2G_p$, while it increases at higher output power levels as the auxiliary sub PA 16 turns on. In practice, the gain of auxiliary sub PA 16, biased at the class-C mode, is lower than $KG_p$ and gradually increases with the output power, resulting in lower gain enhancement from the back-off to peak-power range.

Figure 19:
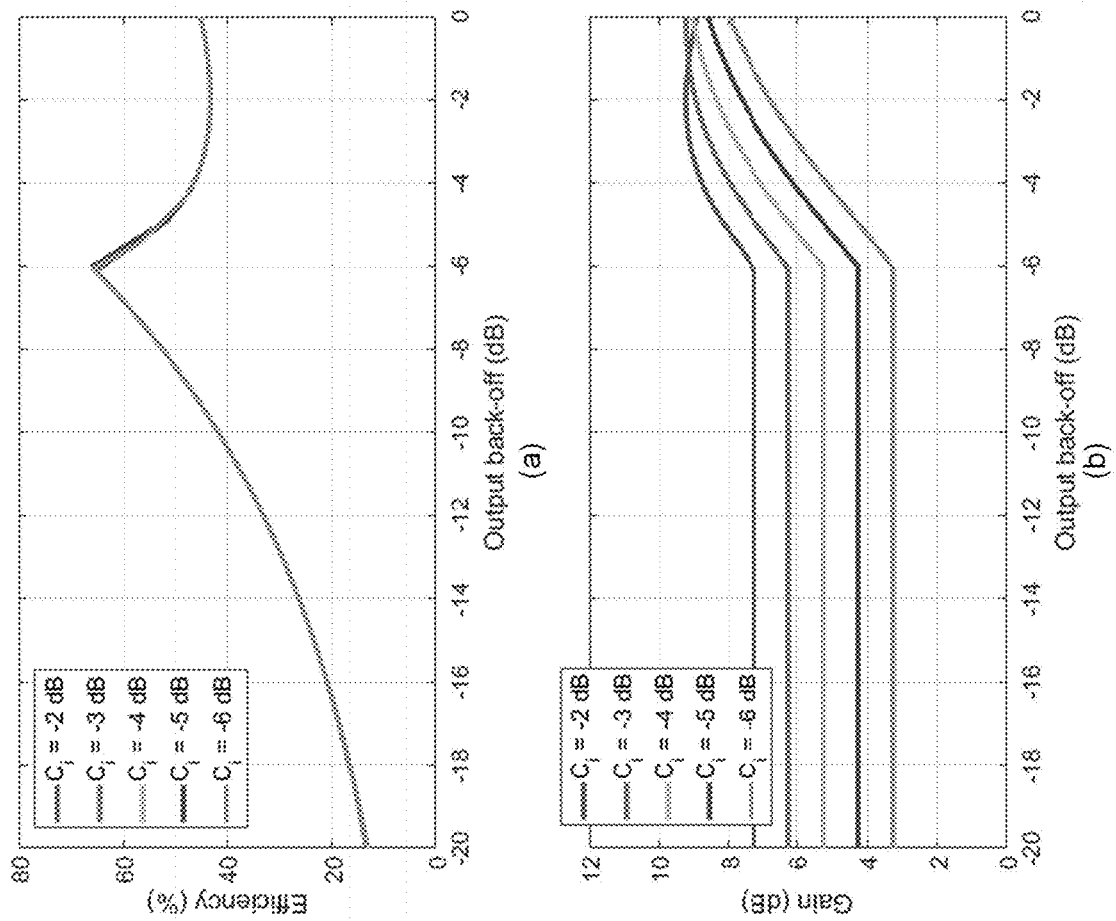
FIG. 19 shows the effects of the input coupler coupling coefficient on the efficiency and gain of the unbalanced PA of FIG. 13.

The effects of the coupling coefficient of the input coupler 18 on the efficiency and gain of the unbalanced PA are illustrated in FIGS. 19(a) and (b), respectively. The efficiency is very slightly affected by $C_i$, only between the back-off and peak-power levels, while a larger $C_i$ is preferred to achieve higher gain. However, based on the input power requirements of the main and auxiliary sub PAs 14, 16, equations 35 and 36, $C_i$ can be derived as $$C_i = 1/\sqrt{1 + \frac{P_{i,a}}{P_{i,m}}}\,.$$

Theoretically, it is assumed that saturated output power and gain of the auxiliary sub PA are K times those of the main sub PA 14, thus both need the same output power levels and $C_i=-3$ dB is derived. In practice, the larger auxiliary transistor, due to nonlinearity and loss effects, requires higher input power drive, leading to smaller $C_i$. The $C_i$ should therefore be chosen based on this trade-off.

For the example of FIG. 33, the efficiency is very slightly affected by Ci, while a larger Ci helps to achieve a higher gain. Furthermore, it is noted that for some Ci values, e.g., $-5$ dB<Ci<$-4$ dB, gain variations in the back-off range can be minimized. This reduces the AM-AM distortion of the PA, which is especially important for high-PAPR modulated signals.

The gain of the unbalanced PA can be derived using the models developed for the output combiner, input splitter, and sub-PAs. Especially, the gain at output back-off and peak power, using (53f), (53g), (39), and (40), can be derived as $$G_{bo} = C_i^2(1 - C_O^2)G_p \qquad (53k)$$

$$G_{pp} = \frac{\left(\sqrt{(1-C_O^2)} + \sqrt{(K_p C_O)}\right)^2}{C_i^2 + \frac{K_p}{K_g}\frac{1}{1-C_i^2}} G_p \qquad (53l)$$

We can set Ci to achieve Gbo=Gpp, which, using (53k), (53l), and (25), results in $$C_i = \left[ \frac{10^{\frac{OPBO}{10}} - 1}{10^{\frac{OPBO}{10}} - 1 + \frac{K_p}{K_g}} \right]^{1/2} \quad (53\text{m})$$

For OPBO=6 dB, $C_o$=−8 dB, and $K_g$=1, the optimum Ci is derived as Ci=−4.4 dB. It should be noted that still there are some gain variations in the back-off to peak-power range, dependent on the nonlinearity profiles of two sub-PAs, e.g., the parameter n, but are usually small.

There is another important consideration to determine Ci based on the input power requirements of the main and auxiliary sub-PAs. Using (35) and (36) in saturation, Ci can be derived as $$C_i = \frac{1}{\sqrt{\left(1 + \frac{P_{i,a}}{P_{i,m}}\right)}} = \frac{1}{\sqrt{\left(1 + \frac{K_p}{K_g}\right)}} \quad (53\text{n})$$

For OPBO=6 dB, $C_o$=−8 dB, and $K_g$=1, this results in Ci=−8.0 dB. So far, we discussed three criteria to set Ci based on gain, gain variations, and input power drive requirements. If the sub-PAs are realized as single-stage amplifiers, Ci should be chosen based on the input power drive requirement to ensure proper operation of the unbalanced PA. However, in the case that the sub-PAs use multistage amplifiers, Ci can be set to minimize gain variations, while gain requirements are satisfied by driver stages.

Figure 40:
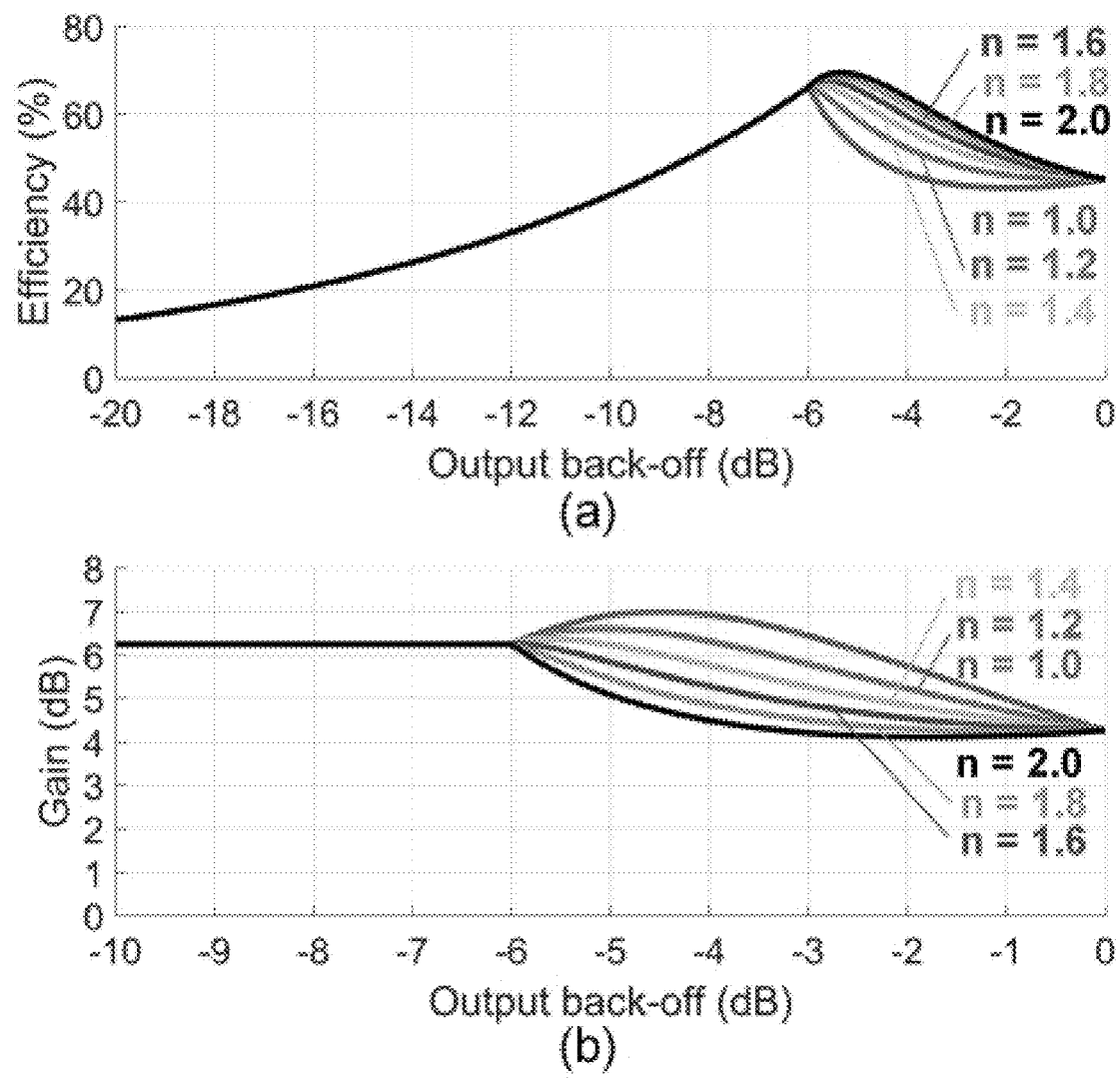
FIG. 40 shows effects of the class-C auxiliary sub-PA nonlinearity parameter n, in Po,a=A(Pi,a−Pon,a)$^n$, on the efficiency and gain of the unbalanced PA. (a) Efficiency. (b) Gain. OPBO=6 dB, $C_o$=−8 dB, and Ci=−3 dB are assumed.

The last point is the effect of auxiliary sub-PA's nonlinear model parameter n on the unbalanced PA performance. In FIG. 40, the efficiency and power gain versus output back-off are shown for 1≤n≤2. Larger n results in slightly higher efficiency in the back-off to peak-power range, while the efficiency at the back-off and peak-power is independent of this parameter. Furthermore, minimum gain variations are achieved at moderate values of n.

Figure 38:
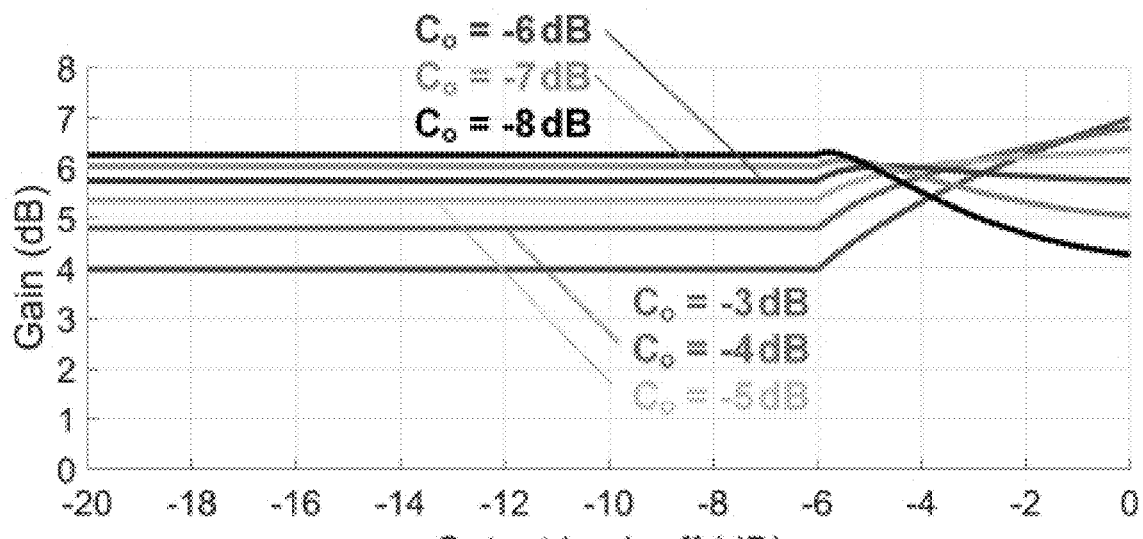
FIG. 38 shows Gain of the unbalanced PA versus normalized output power. (a) 6-dB OPBO. (b) 9-dB OPBO. Gains of the main and auxiliary sub-PAs are, respectively, G p=10 and $K_g$G p=10. Ci=−3 dB and n=1.5 are assumed.
Figure 38:
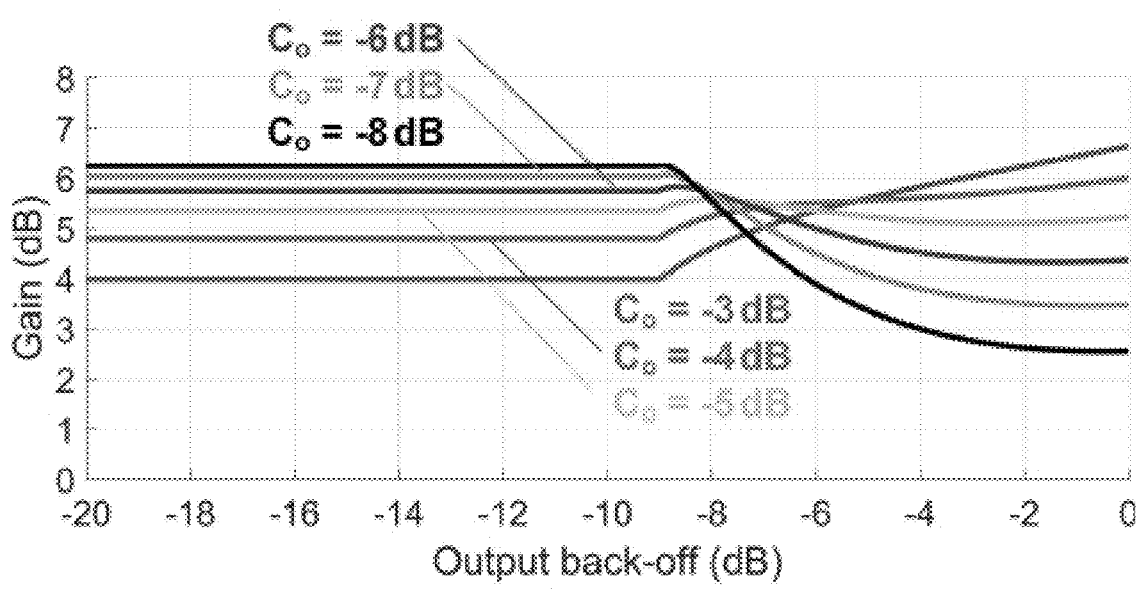
Figure 39:
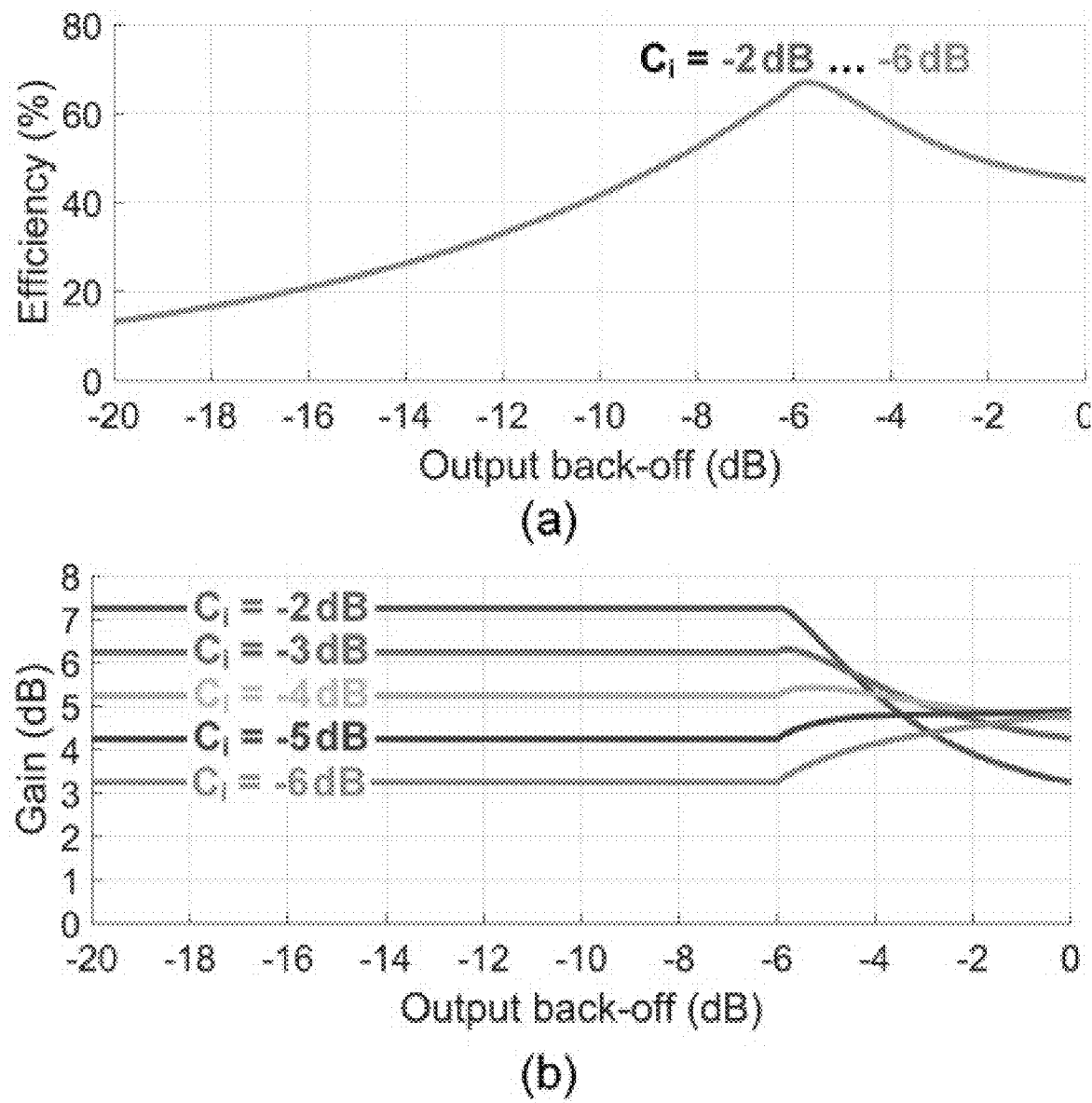
FIG. 39 shows effects of the input coupler coupling coefficient on the efficiency and gain of the unbalanced PA. (a) Efficiency. (b) Gain. OPBO=6 dB, $C_o$=−8 dB, and n=1.5 are assumed.

FIGS. 38-40 show gain versus normalized output power for the unbalanced PA of FIG. 33, effects of coupler coupling coefficient on the efficiency and gain of the unbalanced PA and effects of the class-C auxiliary sub PA nonlinearity parameter n.

Linear Operation

Figure 20:
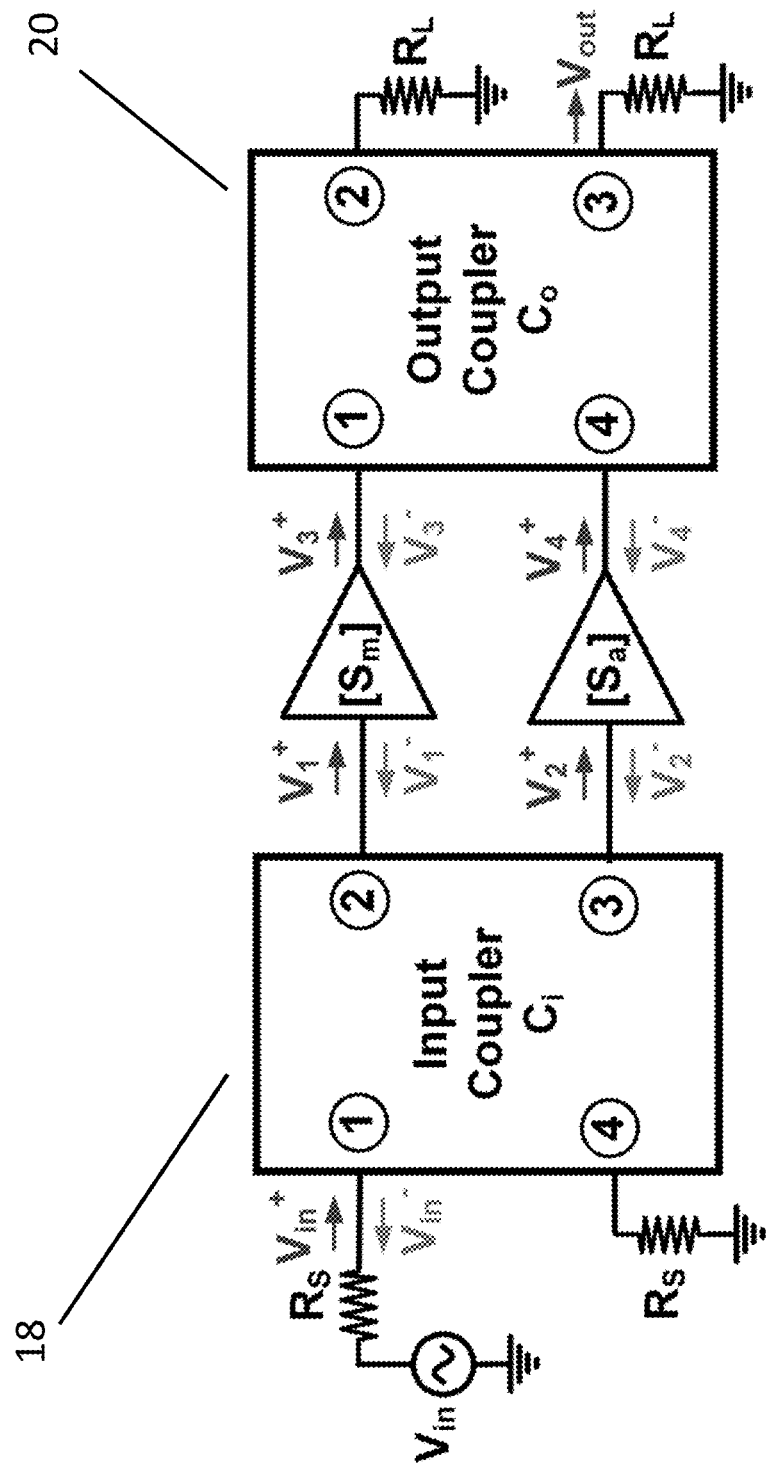
FIG. 20 shows a circuit used to derive scattering parameters of the unbalanced PA of FIG. 13.

We derive small-signal scattering parameters of the unbalanced PA 21 in terms of the sub PAs' scattering parameters and hybrid couplers' 18, 20 coupling coefficients. It is assumed that the sub PAs 14, 16 are unilateral, i.e., $S_{12}$=0, to simplify the analysis. Using the circuit of FIG. 20 and equation 22, the voltage waves $V_1^+$ and $V_2^+$ are derived as $$V_1^+ = C_i V_{in}^+ \quad (54)$$

$$V_2^+ = -j\sqrt{1-C_i^2} V_{in}^+ \quad (55)$$

Since the amplifiers 14, 16 are assumed to be unilateral, reflected voltage waves at their input ports are given by $$V_1^+ = S_{11,m} V_1^+ \quad (56)$$

$$V_2^+ = S_{11,a} V_2^+ \quad (57)$$

The input reflected wave is given by $$V_{in}^- = C_i V_1^- - j\sqrt{1-C_i^2} V_2^- \quad (58)$$

The input reflection coefficient of the unbalanced PA 21 can be derived using equations 54-58 and $S_{11,UPA} = V_{in}^-/V_{in}^+$ as $$S_{11,UPA} = C_i^2 S_{11,m} - (1-C_i^2) S_{11,a} \quad (59)$$

Similarly, it can be shown that the output reflection coefficient is derived as $$S_{22,UPA} = -(1-C_o^2) S_{22,m} + C_o^2 S_{22,a} \quad (60)$$

Moreover, voltage waves at output ports of the sub PAs 14, 16 are given by $$V_3^+ = S_{21,m} V_1^+ \quad (61)$$

$$V_4^+ = S_{21,a} V_2^+ \quad (62)$$

Therefore, the output voltage wave is derived as $$V_{out}^+ = -j\sqrt{1-C_o^2} V_3^+ + C_o V_4^+ \quad (63)$$

For the example of FIG. 33, voltage waves at the output ports of the sub PAs are given by $$V_3^- = S_{21,m} V_1^+ \quad (61\text{a})$$

$$V_4^- = S_{21,a} V_2^+ \quad (62\text{a})$$

Therefore, the output voltage wave is derived as $$V_{out}^+ = -j\sqrt{1-C_o^2} V_3^- + C_o V_4^- \quad (63\text{a})$$

Using equation 54-63, or 54-60 with 61a-63a, gain of the unbalanced PA $S_{21,UPA} = V_{out}^+/V_{in}^+$ is derived as follows $$S_{21,UPA} = -j[C_i \sqrt{1-C_o^2} S_{21,m} + C_o \sqrt{1-C_i^2} S_{21,a}] \quad (64)$$

If the two sub PAs are designed such that $S_{11,m} = S_{11,a}$ and $S_{22,m} = S_{22,a}$, equations 59 and 60 are simplified to $$S_{11,UPA} = -(1-2C_i^2) S_{11,PA} \quad (65)$$

$$S_{22,UPA} = -(1-2C_o^2) S_{22,PA} \quad (64)$$

indicating that the input and output reflection coefficients of the unbalanced PA 21 are smaller than that of the constituent sub PAs 14, 16 by the factors of $|1-2C_i^2|$ and $|1-2C_o^2|$, respectively. It is noted that the unbalanced PA still partially inherits the impedance matching improvement feature of the conventional balanced PA. This feature alleviates the design of output and input matching networks of the sub PAs 14, 16. Furthermore, this reduces the sensitivity of the PA to the load (e.g. antenna) impedance variations, which is an important challenge in 5G applications. In the case of balanced PA with identical sub PAs 14, 16 and 3-dB couplers, $C_i = C_o = 1/\sqrt{2}$, these results are simplified to $S_{11,UPA} = S_{22,UPA} = 0$ and $S_{21,UPA} = -jS_{21,PA}$, as expected.

Bandwidth Considerations

The unbalanced PA can potentially provide wider bandwidth compared with the Doherty PA as a result of using the broadband Lange couplers rather than the narrowband impedance inverters for load modulation. We elaborate on the bandwidth considerations for the unbalanced PA to clarify its advantages over the Doherty PA. The Lange couplers can provide wide bandwidth, e.g., a full octave, dependent on their layout structure and implementation process. Their coupling coefficient and phase response deviate from the targeted values at the edges of the frequency band, leading to degraded performance of the unbalanced PA. The bandwidth of the Lange couplers is usually much higher than that of other sub-circuits of the unbalanced PA.

Figure 41:
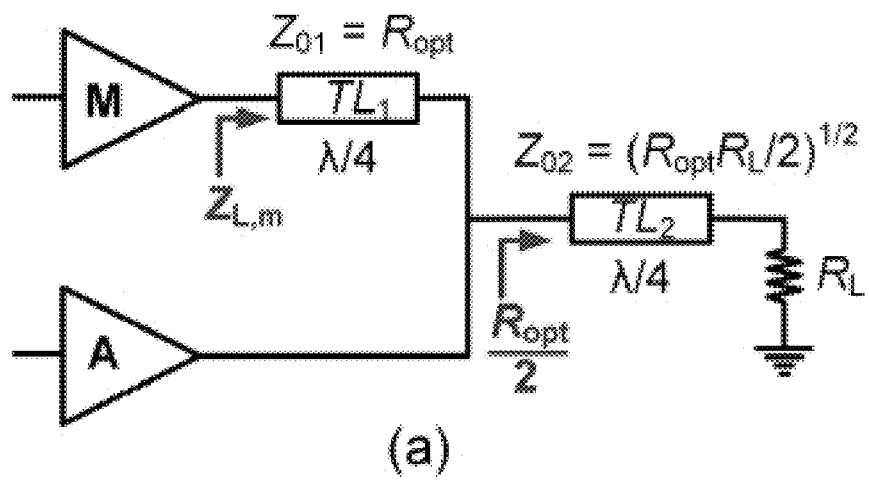
FIG. 41 shows a comparison of broadband performance of the Doherty and unbalanced PAs. (a) Doherty PA architecture. (b) Unbalanced PA architecture. (c) Impedance transformation ratio of transmission lines in the two architectures at back-off (BO) and peak-power (PP). In this comparison, it is assumed that the output matching networks of the unbalanced PA are realized using ¼ transmission lines
Figure 41:
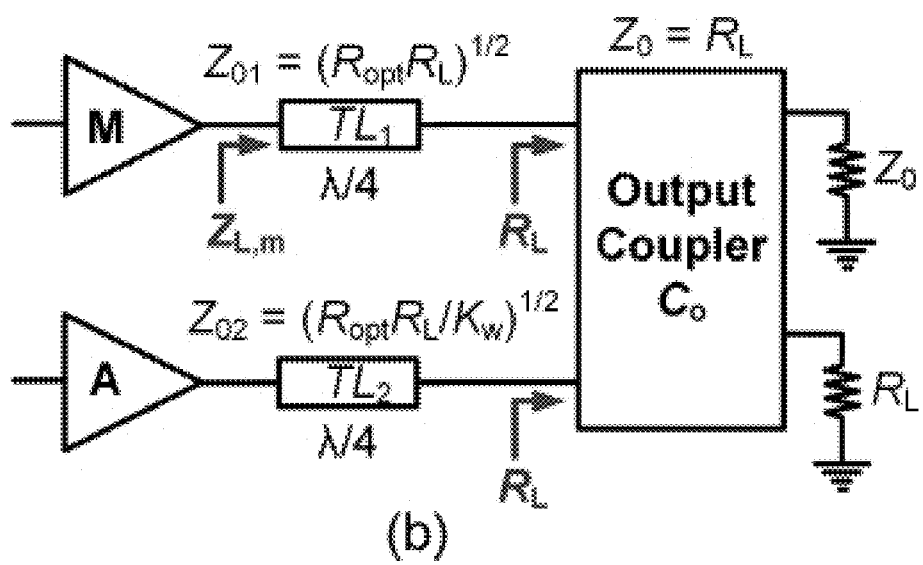

The Doherty PA has a limited bandwidth at back-off due to the high impedance transformation ratio of the impedance inverter. For a simple comparison between the unbalanced and Doherty PAs, we assume that the output matching networks of the unbalanced PA are realized using λ/4 transmission lines. In the circuits shown in FIG. 41, the characteristic impedance of the transmission lines is chosen for a 6-dB OPBO level. The impedance transformation ratio of the transmission lines in the two architectures is summarized in FIG. 41. In the Doherty PA at back-off, the impedance transformation ratio of the transmission lines TL1 and TL2 are, respectively, derived as 4 and Ropt/2RL; hence, the bandwidth would tend to be significantly limited by TL1. In the unbalanced PA, the impedance transformation ratios are given by $_{Ropt/RL}$ and $_{Ropt/Kw}$ RL (note that $W_a$=KwWm; $^{thus,}$ Ropt,a=Ropt/Kw), at both back-off and peak-power, where TL1 is mainly important at back-off. For typical circuit parameters, $_{Ropt/RL}$ is usually lower than 4, which indicates the potential of the unbalanced PA in providing wider bandwidth at back-off.

The output matching networks of the sub-PAs should transform the load resistance RL to the optimum resistance of the transistors, $_{Ropt,m}$ and $_{Ropt,a}$, while absorbing the output parasitic capacitance of the transistors, $_{Cout,m}$ and $_{Cout,a}$. The bandwidth of these matching networks is dependent on their impedance transformation ratio, $_{Ropt,m/RL}$ and Ropt,a/RL, as well as quality factors of the optimum load impedances, QL,m=$\omega_{cRopt,mCout,m}$ and QL,a= $\omega_{cRopt,aCout,a}$ ($\omega_c$ is center of the band). It should be noted that the bandwidth can be further extended by using higher order matching networks, while this is not possible for the impedance inverter in the Doherty PA. Nevertheless, there is a tradeoff between bandwidth and insertion loss of the output matching networks, dependent on their circuit structure and quality factor of passive components, which translates to an efficiency-bandwidth tradeoff for the unbalanced PA.

Furthermore, in the unbalanced PA, the impedance presented to the main sub-PA is independent of the output impedance of the auxiliary sub-PA. This is a fundamental feature of quadrature couplers that can be explained as follows. Using (22), for an incident voltage wave of $V_1^+$, when ports 2 and 3 are matched, i.e., $V_2^+=V_3^+=0$, $V_1^-=0$; thus, I'in=$V_1^-/V_1^+$=0. Therefore, port 1 is also matched independent of the port 4 termination impedance. However, in the Doherty PA, this impedance is affected by the output impedance of the auxiliary PA, which changes from peak-power to back-off and also with frequency. This leads to the additional improvement of the unbalanced PA's bandwidth over the Doherty PA.

PA Circuit Design

Figure 21:
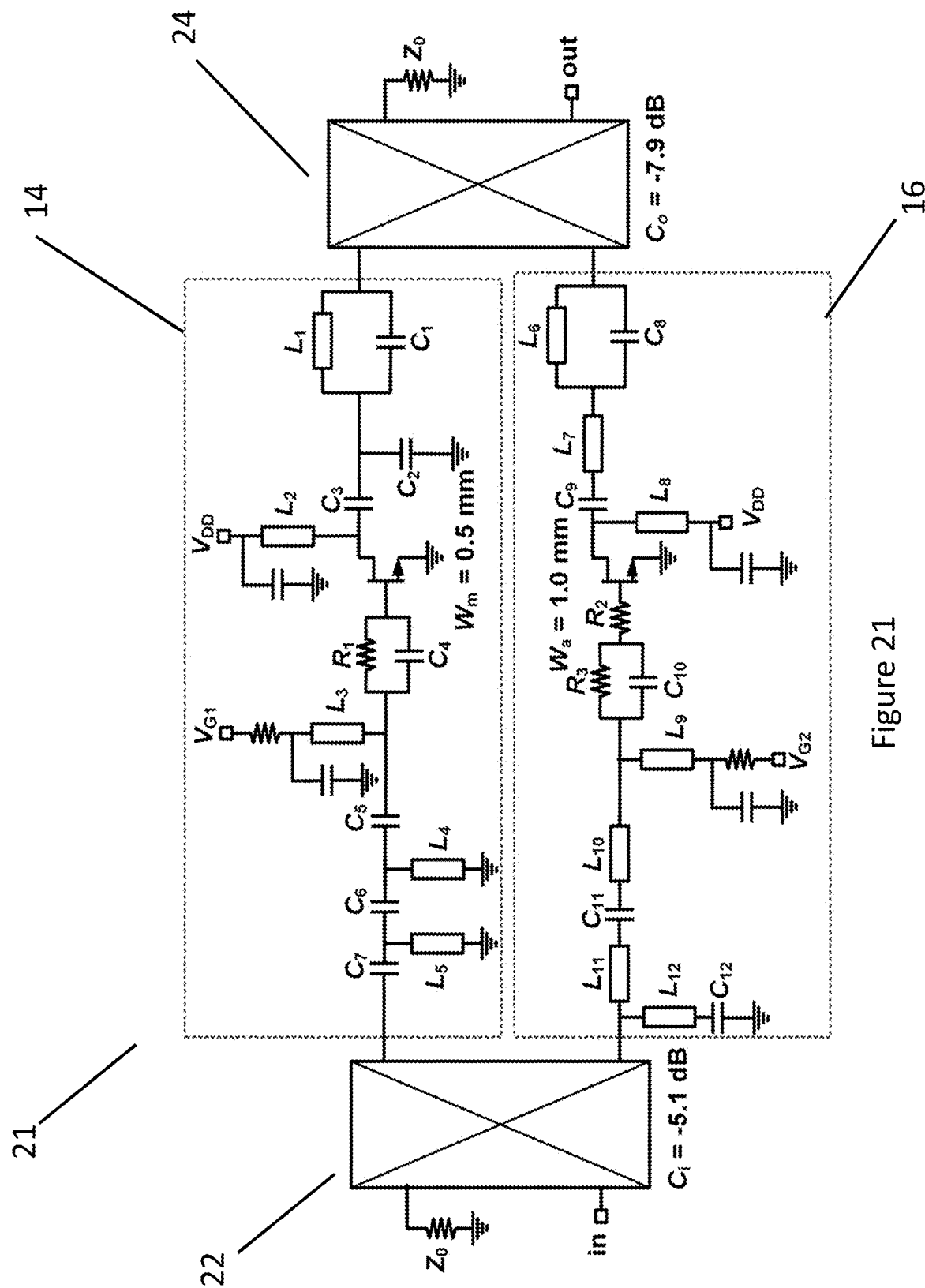
FIG. 21 shows a schematic of the implemented unbalanced PA.

A broadband fully integrated unbalanced PA 21 prototype is presented with peak efficiency at 6 dB back-off for 4-7 GHz bandwidth, and for 4.5-6.5 GHz for the example of FIG. 33. The PA is implemented using a 0.25 μm GaN-on-SiC process. The circuit schematic is shown in FIG. 21 The application of the developed theory and practical considerations in the circuit design are presented in the following.

A. Output and Input Lange Couplers

The output and input couplers 18, 20 are realized using meandered Lange couplers 22, 24 to achieve broadband performance and save chip area. The coupling coefficient of the output coupler is determined based on the 6-dB OPBO requirement (FIG. 16) and the efficiency versus output power profile (FIG. 17). A coupling coefficient of ≈−8 dB is chosen in this design to maximise back-off efficiency. A stronger coupling coefficient, e.g., −6 dB, could provide a more linear gain, as shown in FIG. 38, but at a lower back-off efficiency ['1bo=$(1-C_o^2)'1_m$]. In this design, however, a lower coupling coefficient is preferred to demonstrate the back-off efficiency enhancement feature of the unbalanced PA architecture. Furthermore, as indicated in FIG. 39, the coupling coefficient of the input coupler can be chosen such that the compressive gain of the main sub-PA can be compensated with the expansive gain of the auxiliary sub-PA in order to achieve a linear gain.

Figure 22:
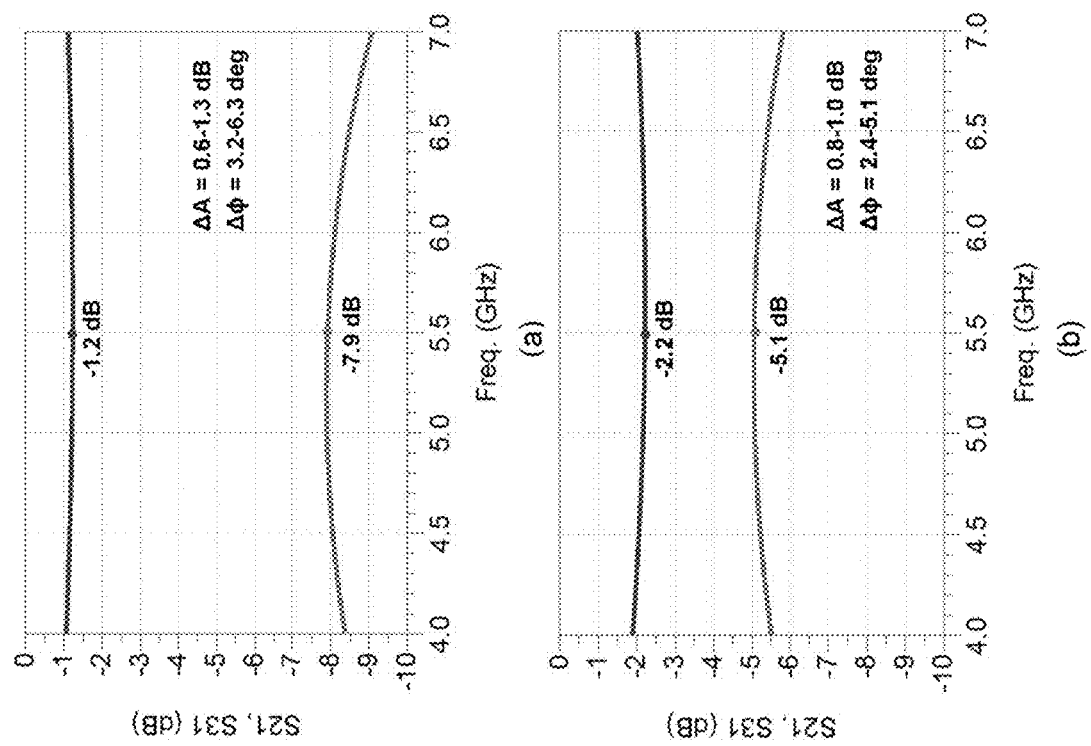
FIG. 22 shows simulated performance of the meandered Lange couplers realized in a GaN-on-SiC process.
Figure 23:
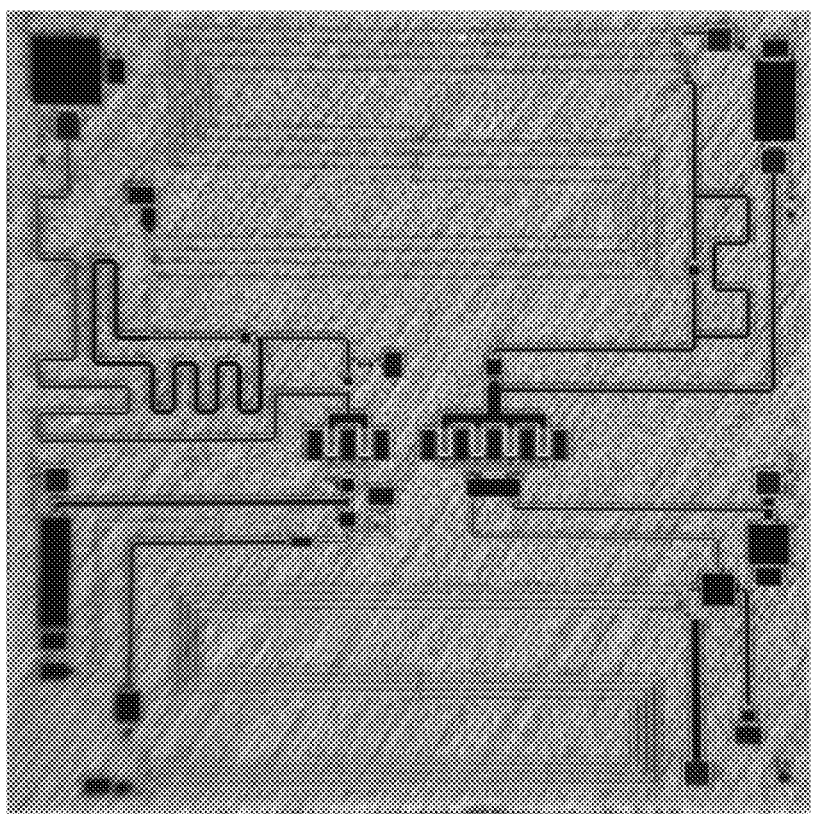
FIG. 23 shows a chip micrograph of the PA circuit.

The Lange coupler 22, 24 layout structure, e.g., width and spacing of the constituent transmission lines, is optimized using extensive EM simulations. The resulting performance of the output coupler 20 is shown in FIG. 22. The transmission coefficients of two output ports are −7.9 dB (=$C_o$) and −1.2 dB at 5.5 GHz. The amplitude imbalance, ΔA, and the deviation of the phase difference from −90°, ΔΦ, respectively read as 0.6-1.3 dB and 3.2°-6.3°, across 4.0-7.0 GHz. The insertion loss is 0.3-0.5 dB and the reflection coefficients of three ports are $|S_{ii}|$<−27 dB. The coupling coefficient of the input coupler 18 is chosen as −5 dB based on the gain and $P_{i,a}$ considerations. The coupler performance shown in FIG. 22 indicate transmission coefficients of −5.1 dB (=$C_i$) and −2.2 dB at 5.5 GHz. Furthermore, ΔA of 0.8-1.0 dB, ΔΦ of 2.4°-5.1°, the insertion loss of 0.3-0.5 dB, and $|S_{ii}|$<−27 dB are achieved across 4.0-7.0 GHz.

Figure 42:
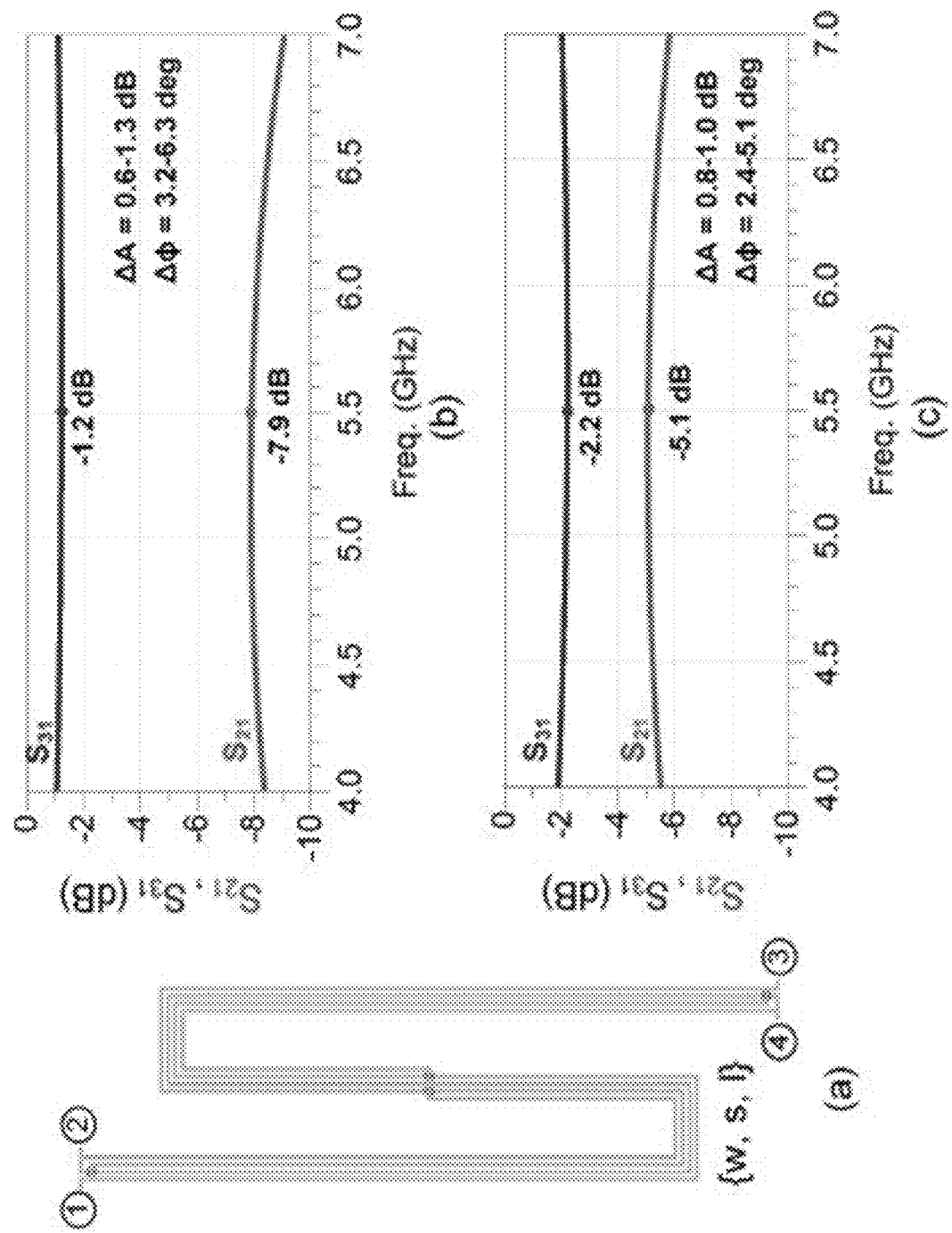
FIG. 42 shows physical structure and simulated performance of the meandered Lange couplers. (a) Physical structure. (b) Output coupler. (c) Input coupler. Physical dimensions including metal width, spacing, and total length, {w, s, l}, are {10, 40, 5400} um for the output coupler and {10, 20, 5500} um for the input coupler. The average insertion loss of both couplers is 0.3-0.5 dB, and the reflection coefficients of their three ports are |Sii|<−27 dB, across 4.0-7.0 GHz.

For the example of FIG. 33, the coupling coefficient of the input coupler is targeted as ≈−5 dB based on the gain and input power drive considerations. The coupler performance shown in FIG. 42 indicates transmission coefficients of −5.1 dB (=Ci) and −2.2 dB at 5.5 GHz. Furthermore, AA of 0.8-1.0 dB, Aφ of 2.4°-5.1°, the insertion loss of 0.3-0.5 dB, and $|S_{ii}|$<−27 dB are achieved across 4.0-7.0 GHz.

Figure 43:
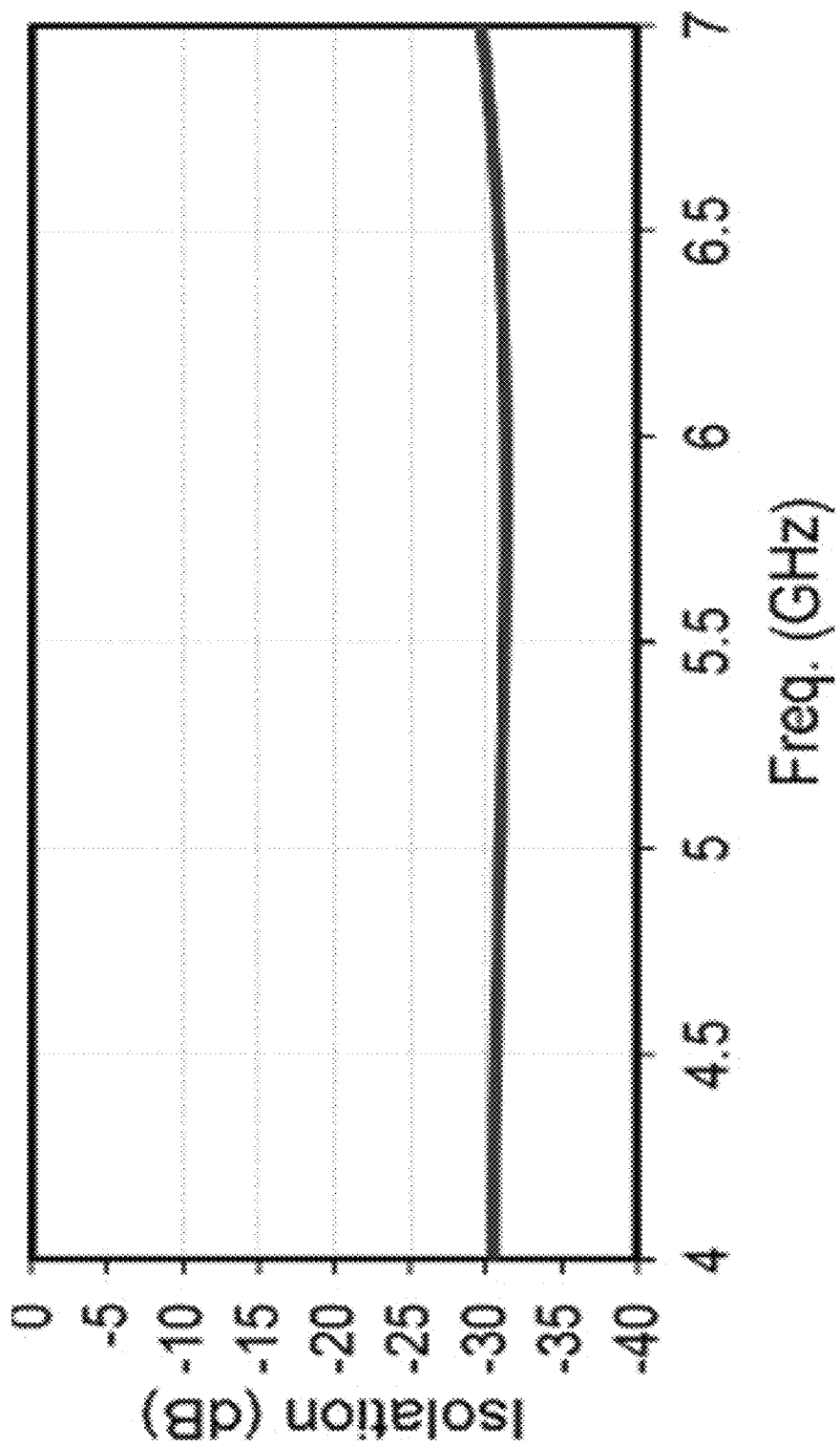
FIG. 43 shows simulated isolation between the main and auxiliary sub-Pas.

Isolation between the main and auxiliary sub-PAs is an important parameter in the unbalanced PA. In FIG. 43, the simulated isolation, i.e., |S14| of the output Lange coupler, is shown versus the frequency. The isolation reads <−29.7 dB across 4.0-7.0 GHz, which confirms that the impedance presented to the main transistor is independent of the auxiliary sub-PA's output impedance.

B. Main and Auxiliary Sub PAs

The width of transistors in the main and auxiliary sub PAs 14, 16 can be determined based on the output power target for the unbalanced PA 21 and the coupling coefficients of the couplers as derived herein. From the required peak output power $P_{out,pp}$ and OPBO level, the back-off output power is given by $P_{out,bo}=P_{out,pp}$−OPBO. Using equation 31 and estimated loss of the output matching network of the main sub PA 14 $L_{omn,m}$, the required output power of the main transistor can be derived as $P_{tr,m}=P_{out,bo}-10\log_{10}(1-C_o^2)+L_{omn,m}$.

This can be used in load-pull simulations to derive the width of the main transistor Wm. In this design, to achieve 36 dBm peak output power and 6-dB OPBO, with $C_o$=−8 dB and assuming $L_{omn,m}$~1 dB, the required power of the main transistor is 31.8 dBm. This is satisfied using a transistor width of 4×125 μm.

Furthermore, using FIG. 16 with $C_o$ chosen previously, the parameter K is obtained, giving to the width of the auxiliary transistor as $W_a$=K$W_m$. In practice, larger transistors have higher loss and thus lower efficiency which can degrade efficiency of the unbalanced PA 21. Moreover, larger parasitic capacitors of this transistor limits bandwidth of the PA. The optimum width of the auxiliary transistor should therefore be much smaller than the theoretical value. In this design, a transistor width of 8×125 μm results in the best efficiency and bandwidth performance. This reduces the OPBO level to roughly 5 dB.

The output matching networks of the main and auxiliary sub PAs 14, 16 should provide the optimum load resistances $R_{opt,m}$~150Ω and $R_{opt,a}$~70Ω the fundamental frequency band. In this design, we realize output matching networks such that enable operation of the sub PAs in the continuous class-F mode. This improves efficiency of the PA over a broad bandwidth through providing optimum load impedances in the fundamental, second, and third harmonic bands.

The networks are implemented using stacked metal microstrip transmission lines and metal-insulator-metal MIM) capacitors.

The stability of the transistors is ensured using resistive-capacitive networks in series with their gate, i.e., R1 and C4 for the main transistor and R2,3 and C10 for the auxiliary transistor. The resistors reduce the low-frequency gain of the transistors, which can be very high and lead to instability, while the capacitors bypass the resistors in the operational band to avoid unnecessary gain losses. The stability factor u is used to evaluate the stability of the transistors. Furthermore, the gate and drain bias pads are bypassed both internally using large on-chip capacitors and externally through multiple paralleled onboard capacitors.

Simulation results indicate the main sub PA provides 32 dBm output power, 56% efficiency, and 10 dB power gain, at 22 dBm input power and 5.5 GHz. For the auxiliary sub PA 16, these are respectively 36 dBm, 49%, and 10 dB, at 26 dBm input power. The unbalanced PA 21 achieves peak output power of 34 dBm, efficiency of 35% at peak power and 41% at 5 dB back-off. The efficiency reads 27%-38% at peak power and 28%-42% at back-off, across 4.5-6.5 GHz.

Figure 44:
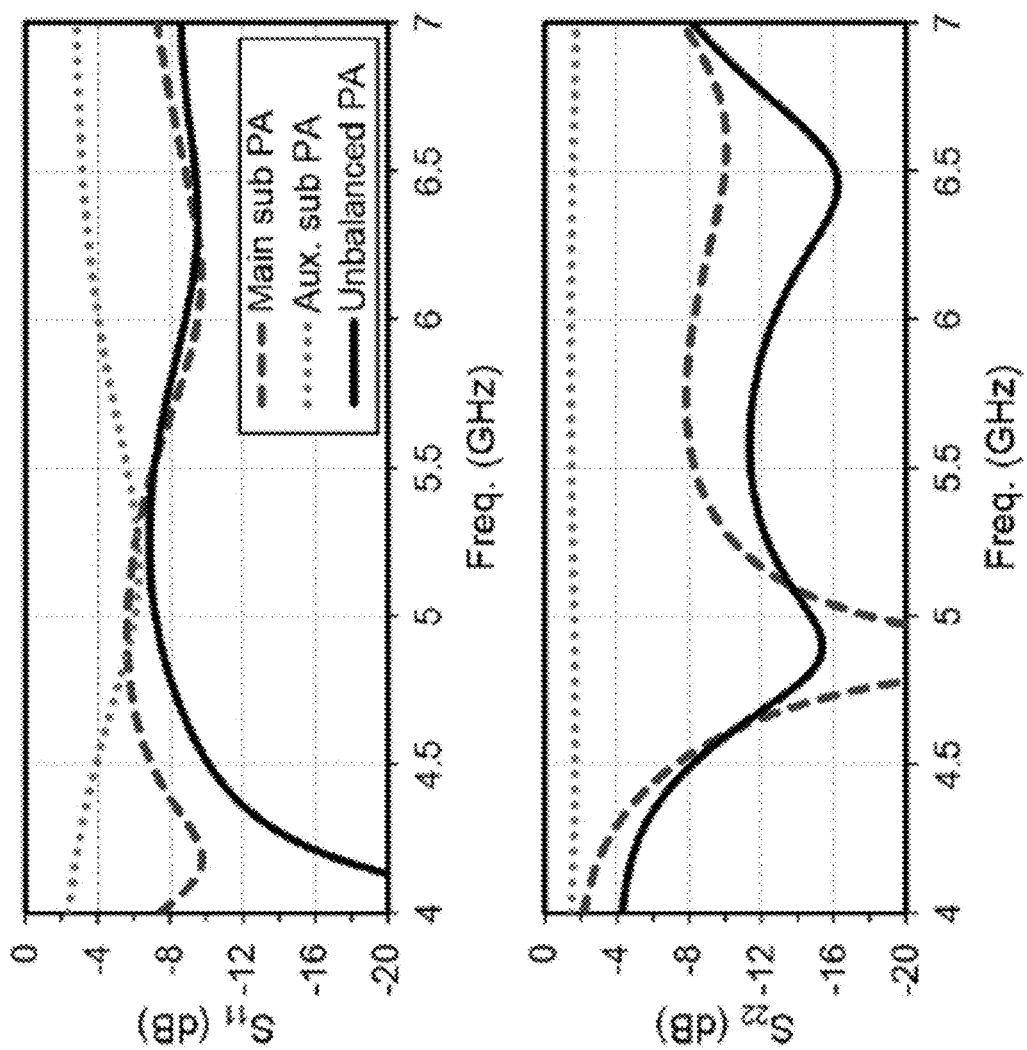
FIG. 44 shows simulated $S_{11}$ and $S_{22}$ of the main sub-PA, auxiliary sub-PA, and unbalanced PA.
Figure 45:
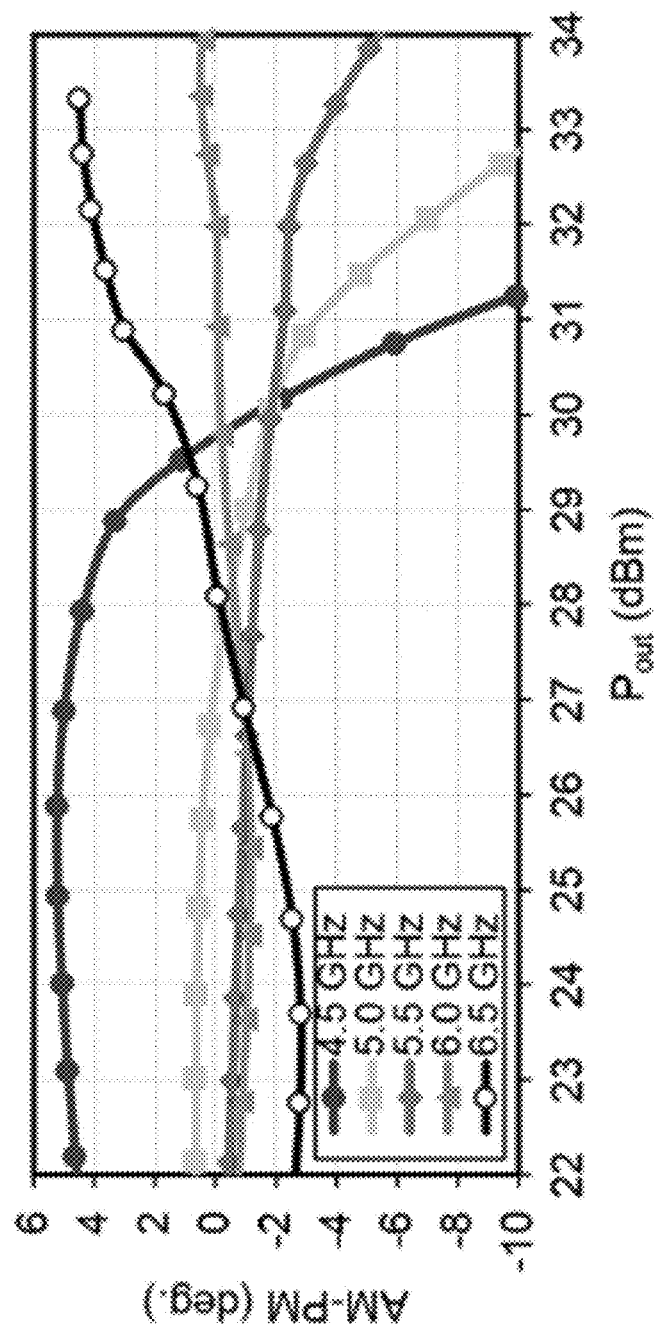
FIG. 45 shows simulated AM-PM distortion across 4.5-6.5 GHz

In FIG. 44, simulated S11 and S22 of the main sub-PA, auxiliary sub-PA, and unbalanced PA are shown. It is noted that the unbalanced PA structure improves input and output return losses compared with the sub-PAs. In FIG. 45, the simulated AM-PM distortion is shown across 4.5-6.5 GHz. A lower AM-PM is achieved close to the center of the band, e.g., 5.5-6.0 GHz, as a result of proper compensation of the compressive nonlinearity of the main transistor with the expansive nonlinearity of the auxiliary transistor.

To improve efficiency of the PA 1, the output matching networks 10 of the main 14 and auxiliary 16 amplifiers are designed such that they present optimum load impedances to the transistors at fundamental and harmonic frequencies. A broadband operation is achieved thanks to the use of amplifiers with broadband impedance matching networks and hybrid couplers implemented as broadband Lange couplers 22, 24.

Figure 24:
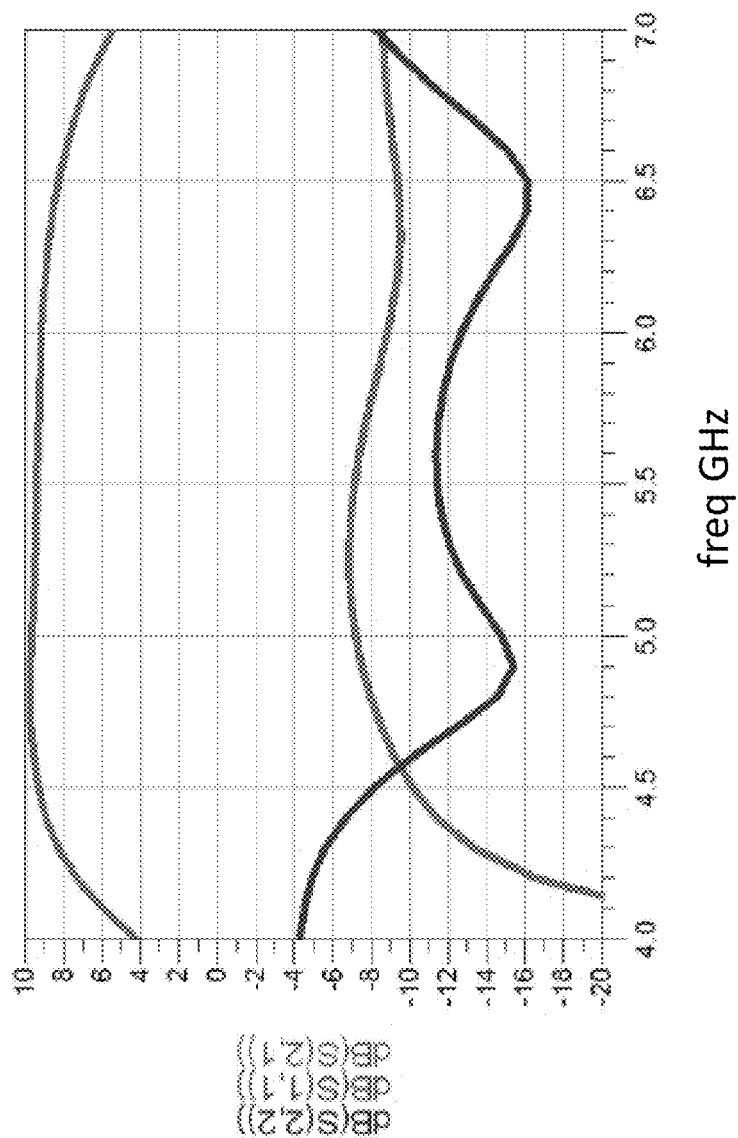
FIG. 24 shows circuit simulation results of a proof of concept PA circuit using the proposed structure of FIG. 1.
Figure 25:
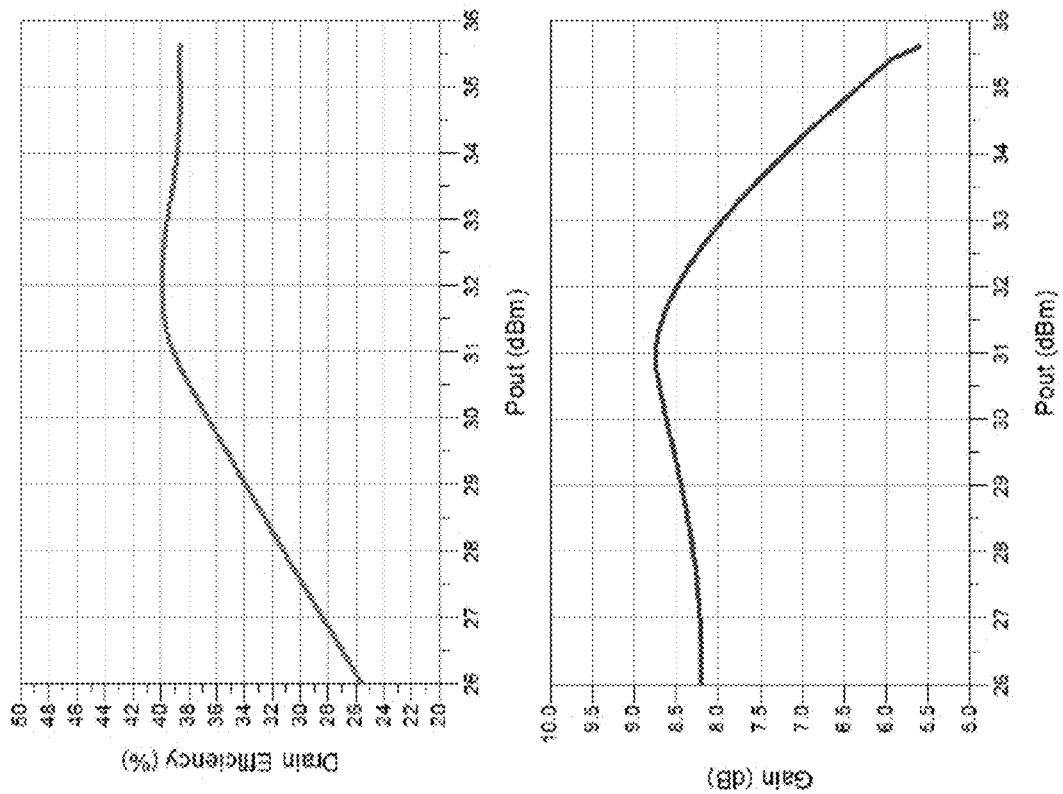
FIG. 25 shows plots of drain efficiency and large signal gain.
Figure 26:
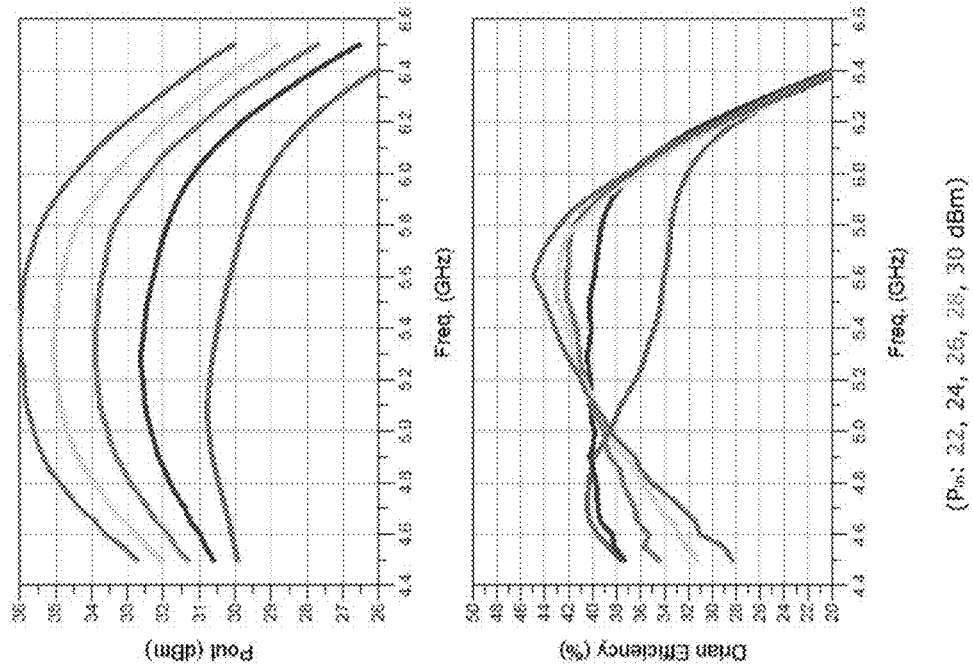
FIG. 26 shows the output power and drain efficiency at several input power levels.

Proof-of-concept PA circuit using the proposed structure is designed and implemented in a Gallium Nitride monolithic microwave integrated circuit (MMIC) process. The circuit simulation results are provided in FIG. 24. Small-signal S-parameters of the PA indicate higher than 8 dB gain over 4.3-6.6 GHz bandwidth. In the following plots, of FIG. 25 the drain efficiency and large-signal gain of the PA are shown versus output power at 5.0 GHz. Considering 35.5 dBm as the peak power, the drain efficiency is derived as 39% at peak power and 35% at 6-dB back-off. In the following plots of FIG. 26, the output power and drain efficiency are plotted versus frequency at several input power levels. The difference between efficiency at peak power and back-off is less than 10% over the bandwidth 4.5-6.5 GHz.

The PA architecture 13 of FIG. 13 can maintain efficiency in back-off power over a broad bandwidth, which is a desired component in wireless communications. The conventional PA architectures that provide enhanced back-off efficiency, normally have a narrow bandwidth. The proposed architecture is a possible solution for these issues.

Figure 27:
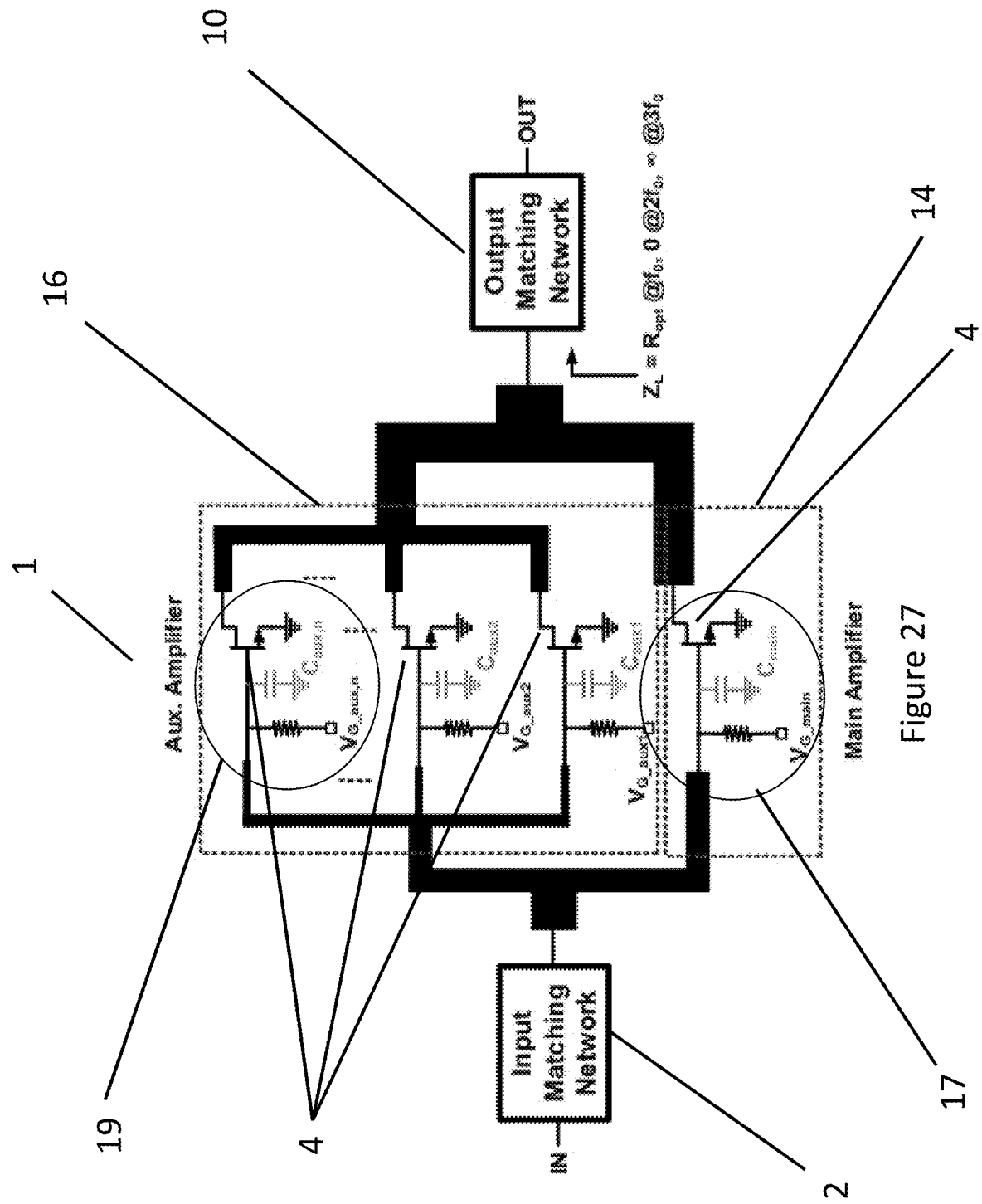
FIG. 27 shows a PA architecture composed of two amplifiers operating in parallel.

In conventional PAs, the efficiency degrades when the PA is operated in back-off from the peak power. The PA architecture 13, shown in FIG. 27, composed of two amplifiers operating 14, 16 in parallel, where the auxiliary amplifier 16 itself is composed of several unit cells 17, 19. These unit cells 17, 19 have separate gate bias controls, and depending on the output power, are turned on and off to achieve high peak power and improve the efficiency at back-off. The number of unit cells 17, 19 is $n=2^k-1$ where k is the number of control bits. All transistors have the same gate width.

Figure 28:
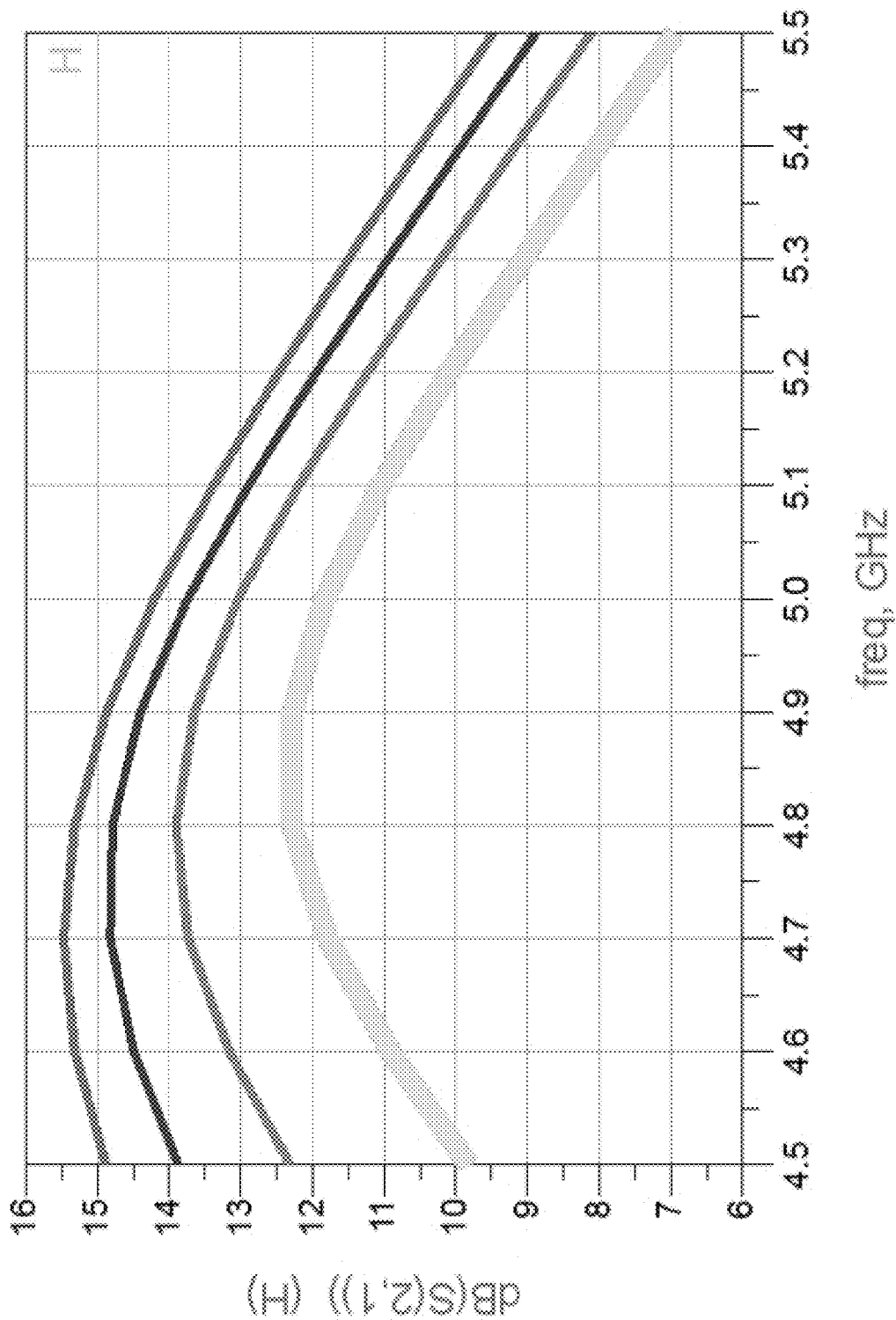
FIGS. 28 to 30 shows scattering parameters versus frequency for the circuit of FIG. 27.
Figure 29:
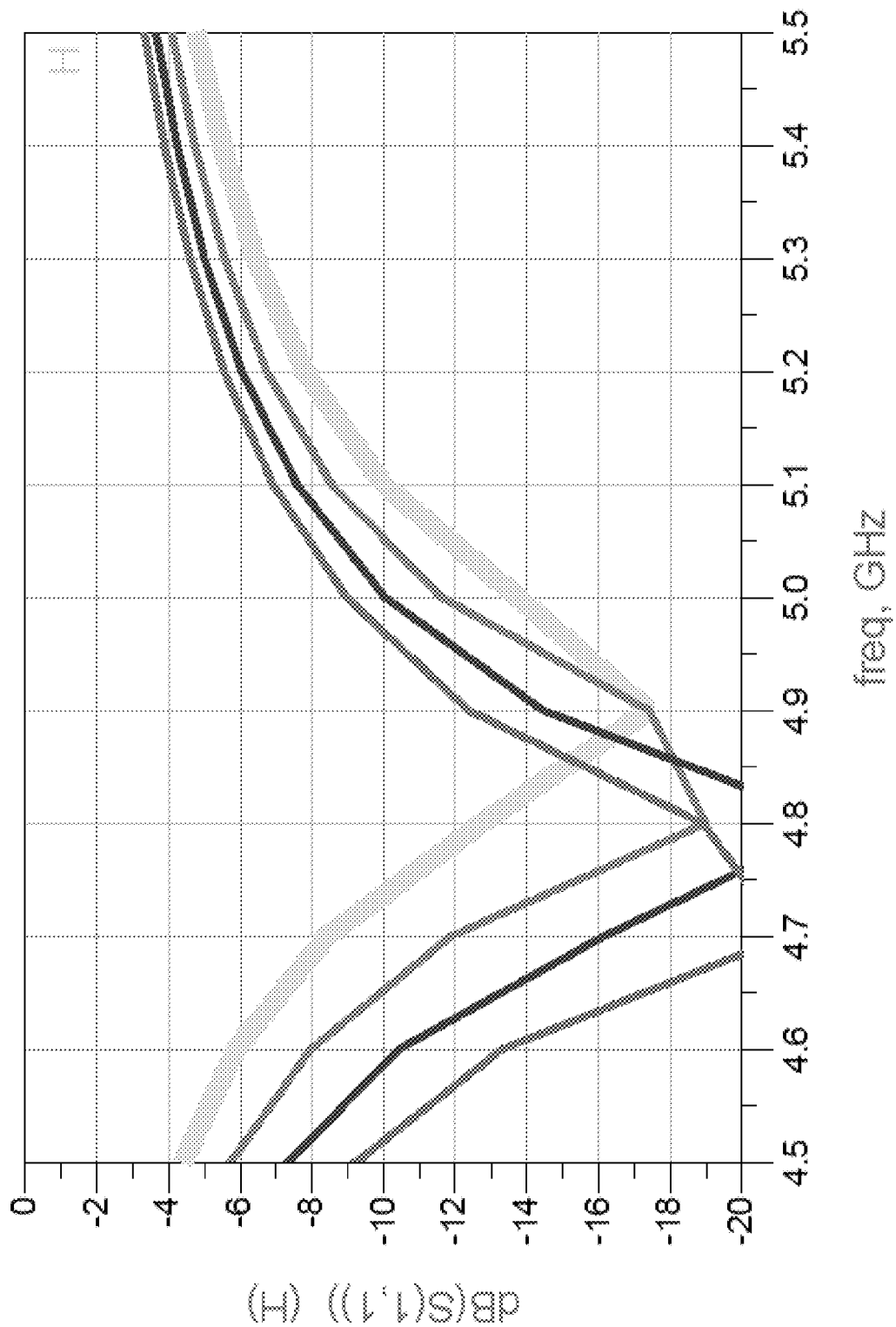
Figure 30:
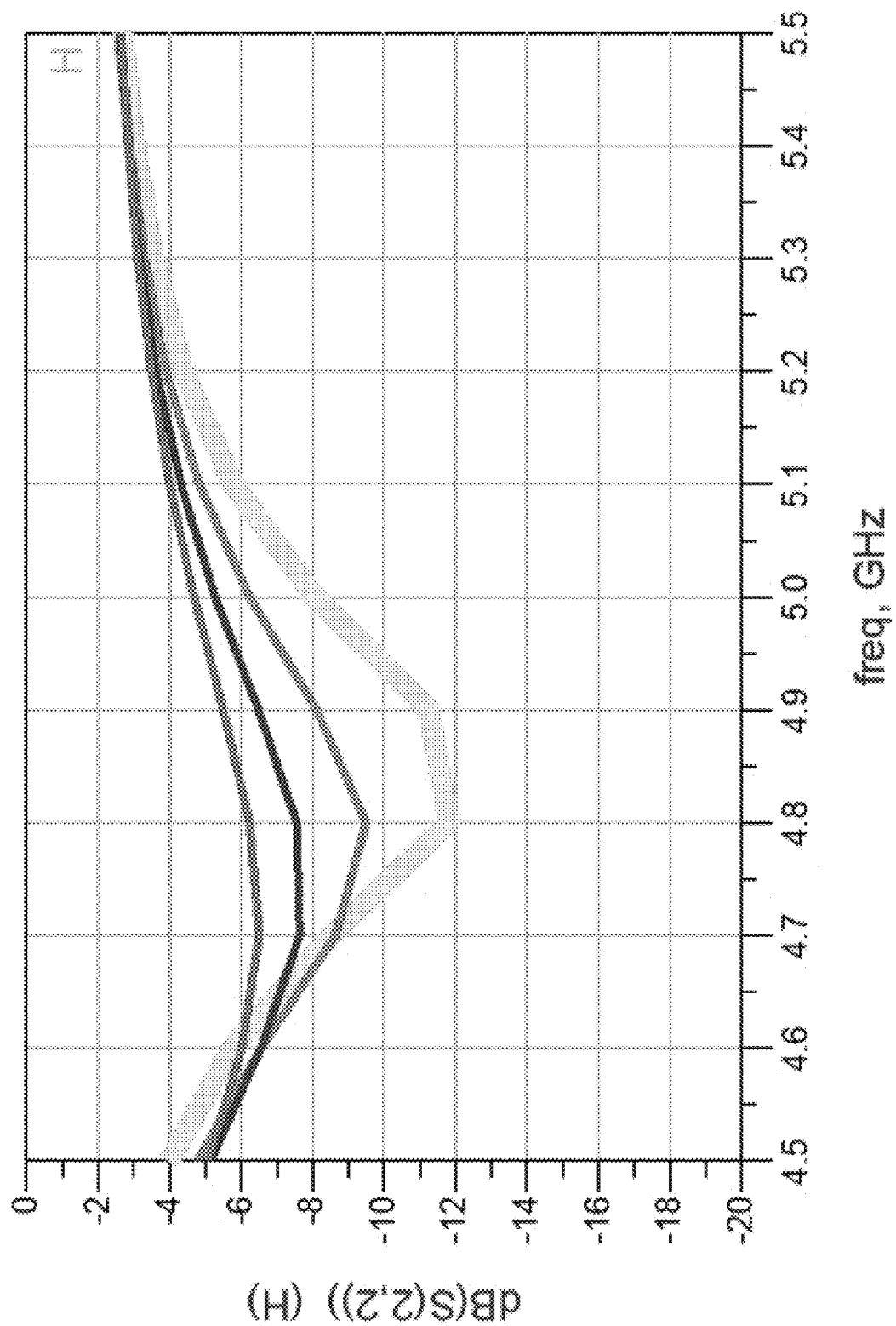

Furthermore, to achieve a high efficiency, a harmonic output matching network 10 is used for this PA 1 to provide harmonic load impedances for the class-F operation. This network 10 provides the optimum load resistance at the fundamental frequency, a short-circuit impedance at the second harmonic, and an open-circuit at the third harmonic. The network features low loss and compact chip area that are essential for integrated circuit implementation of the PA 1. The network 10 absorbs the parasitic drain-source capacitance of the transistors 4 and the drain bias feed as its constituent elements. These features enable fully integrated implementation of the PA 1. The input power divider network exploits voltage-dependency of the transistors' 4 gates-source capacitance to adaptively divide the input power between the main 17 and auxiliary 19 cells. For the Gallium Nitride (GaN) monolithic microwave integrated circuit (MMIC) process used for implementation of the PA circuit, the gates-source capacitance of the transistors decreases approximately by a factor of two when their gate bias voltage reduces from ON to OFF state. At low input power levels, all auxiliary cells 19 are OFF, and their input capacitance is smaller than that of the main amplifier 14 ($C_{aux} < C_{main}$). The input impedance of the main amplifier 14 would be smaller, and more power is delivered to the input of the main amplifier 14. This improves back-off gain and efficiency of the PA 1. At high input power levels, the main 17 and auxiliary cells 19 have the same gate bias voltage, and hence the same gate-source capacitance ($C_{aux} = C_{main}$). Thus, the input power is divided equally between the main 14 and auxiliary 16 amplifiers. A proof-of-concept PA 1 based on the proposed reconfigurable architecture with three auxiliary cells has been designed and fabricated in a GaN monolithic microwave integrated circuit (MMIC) process. The PA small-signal characteristics simulated using a nonlinear model provided by the foundry are shown in the following FIGS. 28 to 30. In the state 00, all the auxiliary cells 19 are turned off. By increasing the input power level, more number of auxiliary cells 19 are turned on, from one cell at the state 01, to two cells at the state 10, and finally all three cells at the state 11. The PA maintains its performance in all states.

Figure 31:
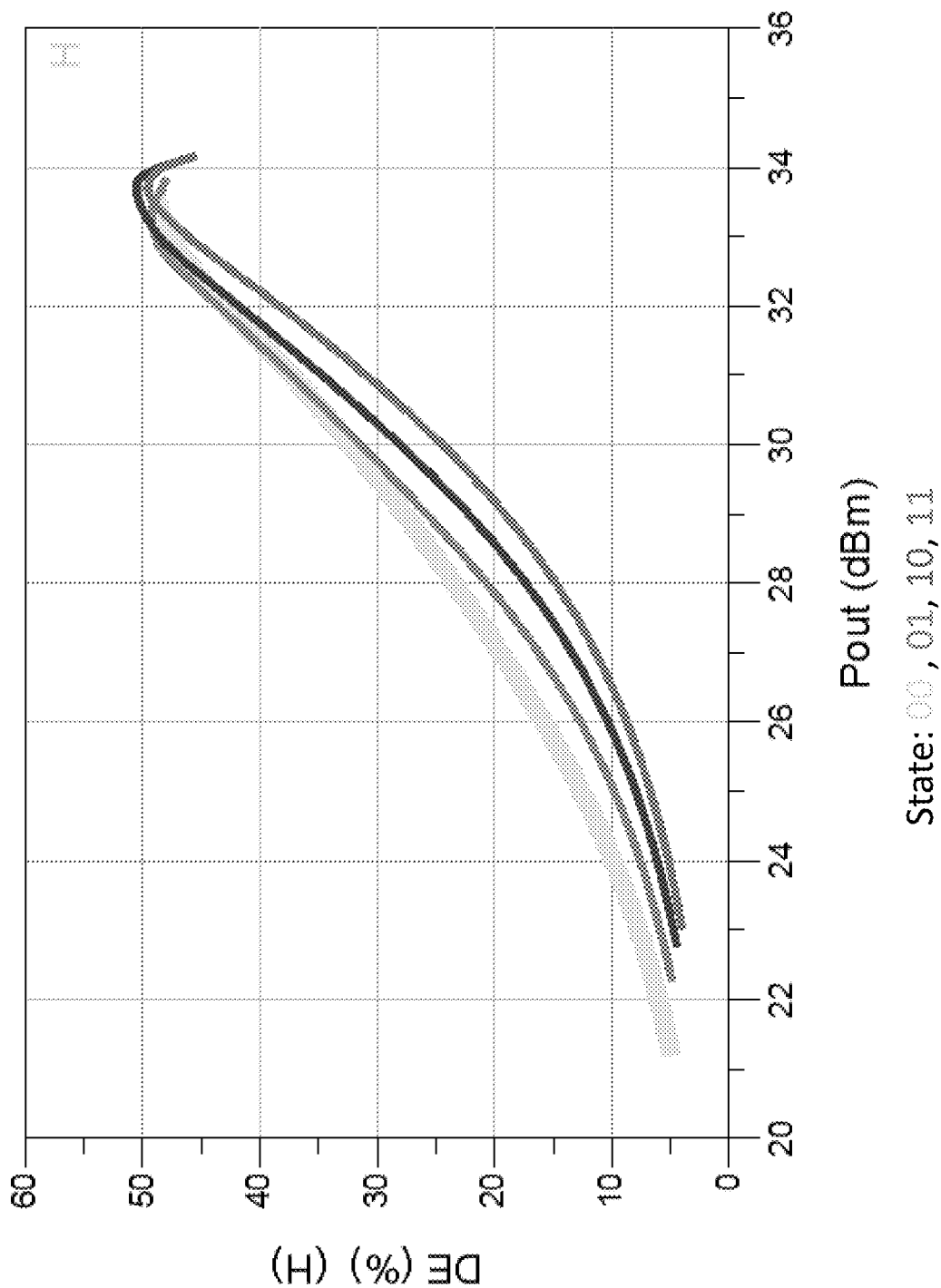
FIGS. 31 and 32 show signal simulations.
Figure 32:
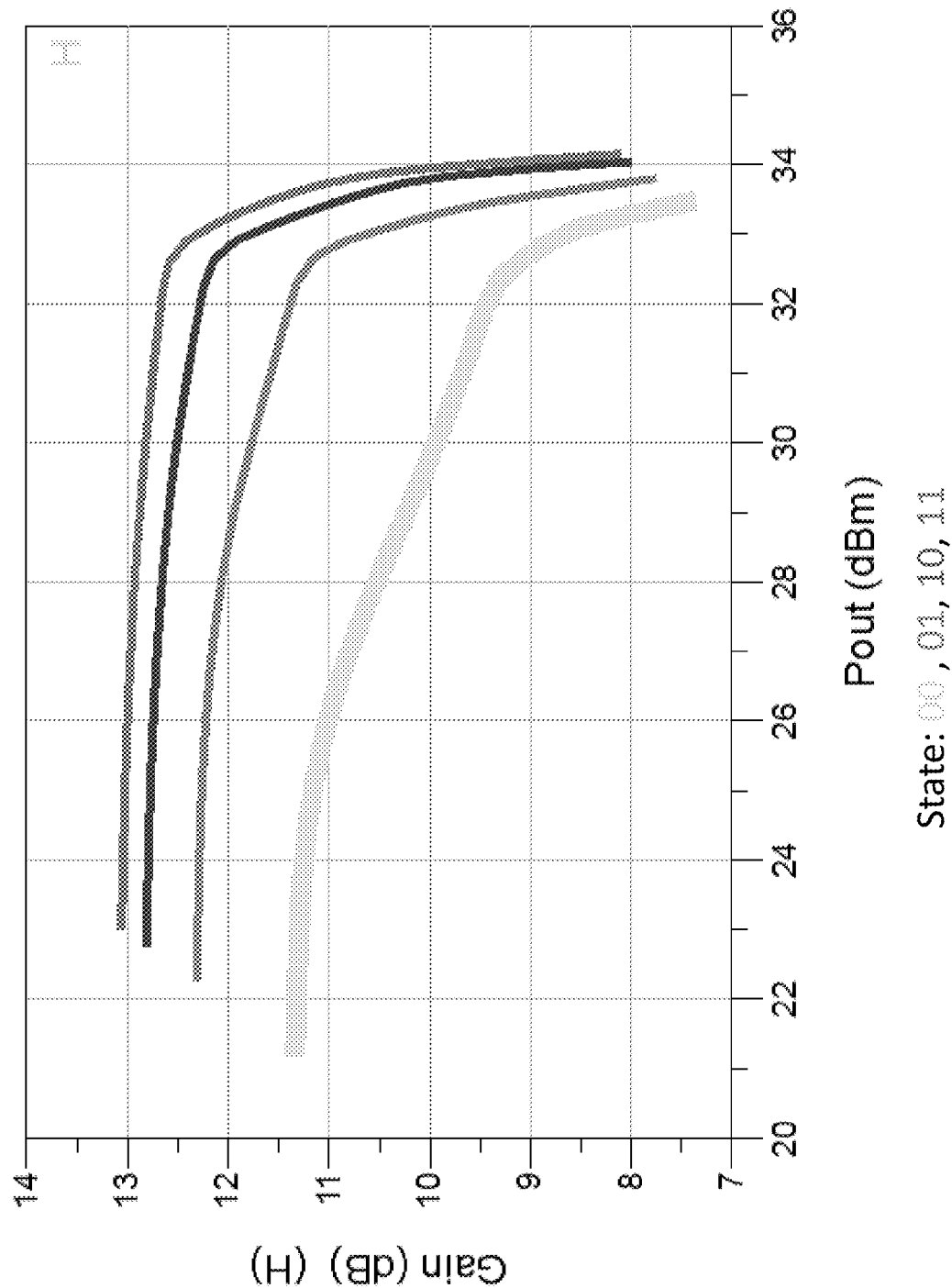

The large-signal simulations performed at 4.8 GHz are shown in the following FIGS. 31 and 32. Considering the peak power at 34 dBm, the drain efficiency (DE) at 6-dB back-off, 28 dBm output power, can be improved from 14% to 23% (1.6×) by turning all the auxiliary cells 19 off. Gain is also reduced when more auxiliary cells 19 are turned off.

By reconfiguring the PA 1, its output power level can be controlled with an improved efficiency at back-off. The output matching network 10 of the PA 1 also provides harmonic load impedances for the class-F operation to improve efficiency of the PA 1. The proposed technique at least mitigates the bandwidth limitation by using conventional impedance matching networks, instead of the impedance inverter network in the Doherty PA or the load modulation network of the Outphasing PA that can be designed to have a broad bandwidth. Furthermore, the adaptive input power division can improve gain of the PA at back-off.

From reading the present disclosure, other variations and modifications will be apparent to the skilled person. Such variations and modifications may involve equivalent and other features which are already known in the art of receivers and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

Measurement Results

Figure 46:
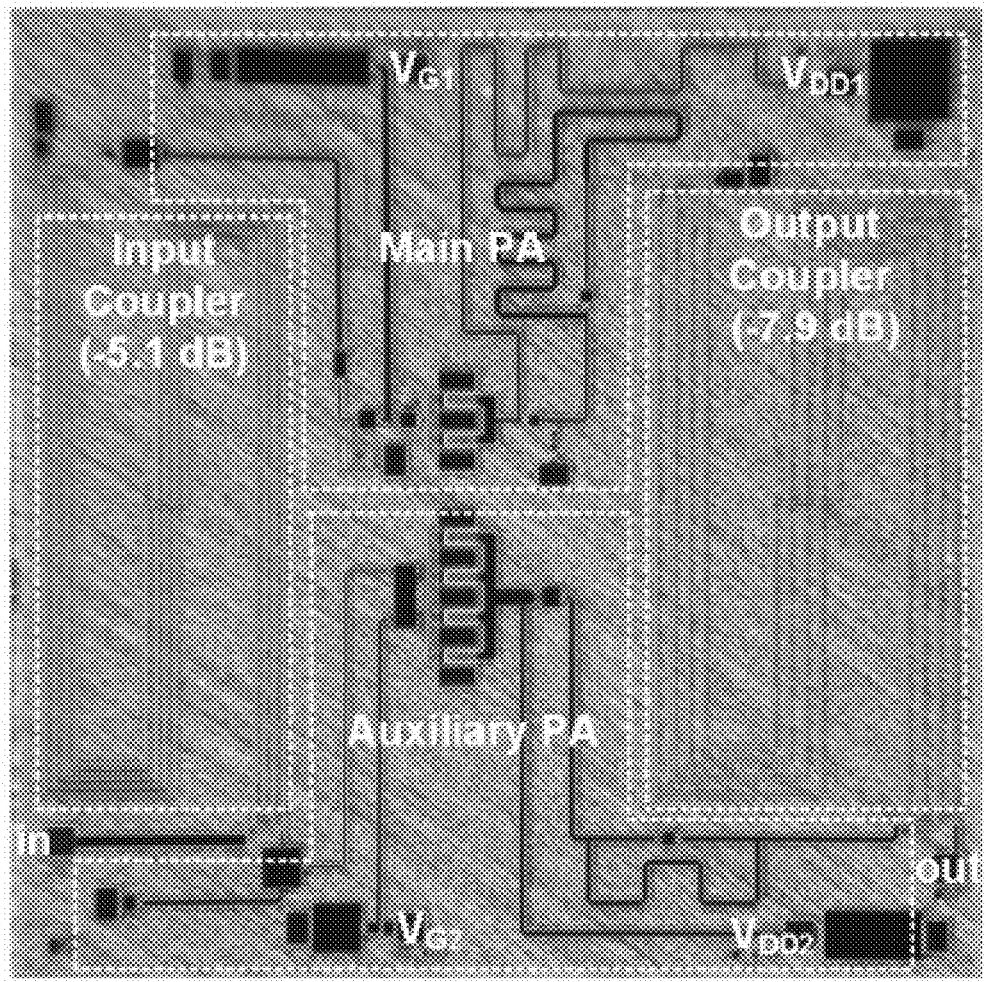
FIG. 46 shows a chip micrograph (2.8' 2.8 mm$^2$)

The PA chip is fabricated using a 250-nm GaN-on-SiC process from WIN Semiconductors. The chip is shown in FIG. 46, where the meandered Lange couplers are used to save the die area. The drains of transistors are biased at 28 V, while their gate biases are chosen as −2.3 and −4.0 V to achieve high back-off efficiency. The chip die is wire-bonded to the test PCB, and a heat-sink is used to improve the thermal stability in the measurements.

A. Continuous-Wave Measurements

Figure 47:
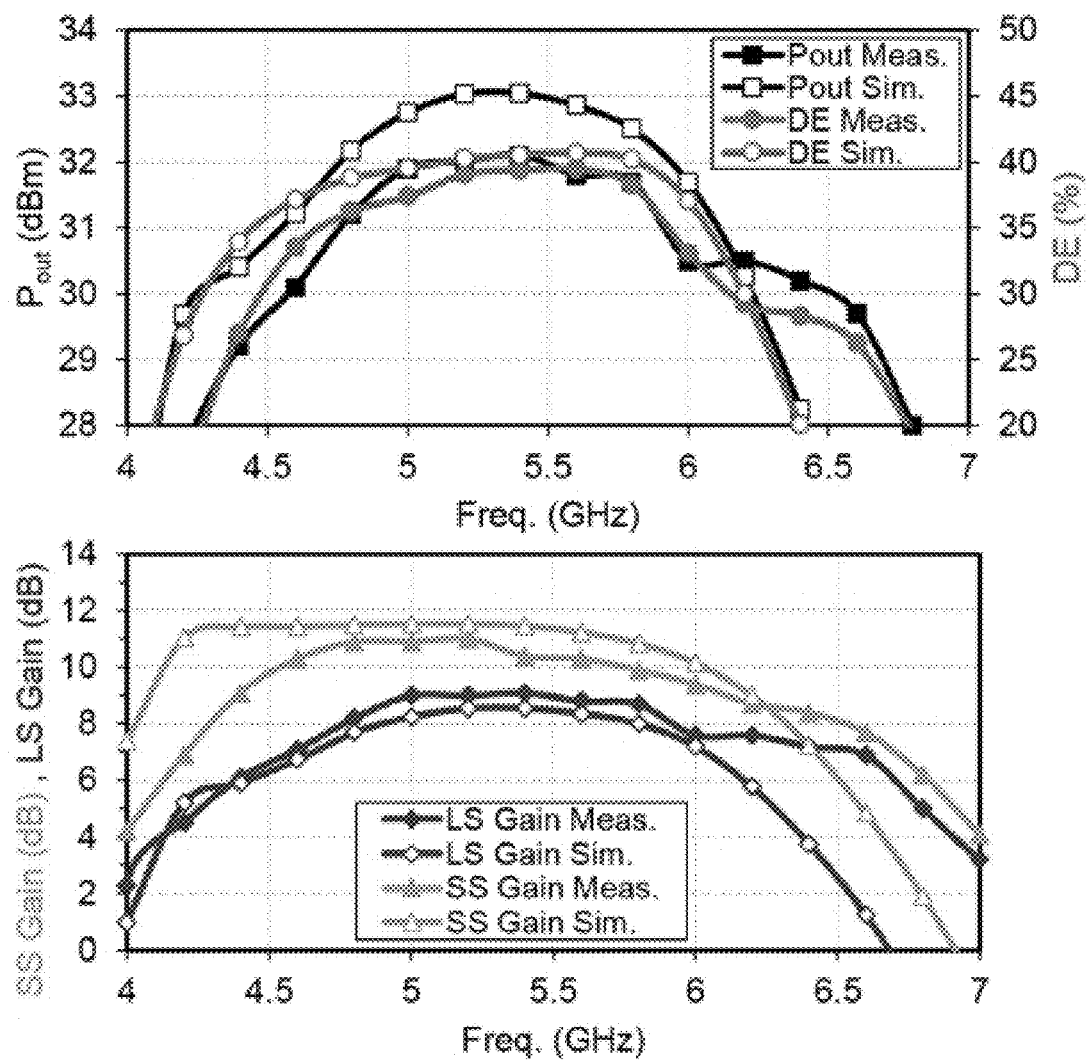
FIG. 47 shows measured and simulated output power, DE, and gain (large-signal and small-signal, LS/SS) versus frequency at 24-dBm input power.

The output power, efficiency, and gain of the PA versus frequency are shown in FIG. 47. The results are achieved at 24-dBm input power. This corresponds to about 1-3-dB gain compression. It is noticed that there is an upward shift in the measured frequency response compared with simulation results. The 3-dB bandwidth of small-signal gain is 4.3-6.5 GHz (41.6%). The efficiency reads 28%-39% across 4.5-6.5 GHz.

Figure 48:
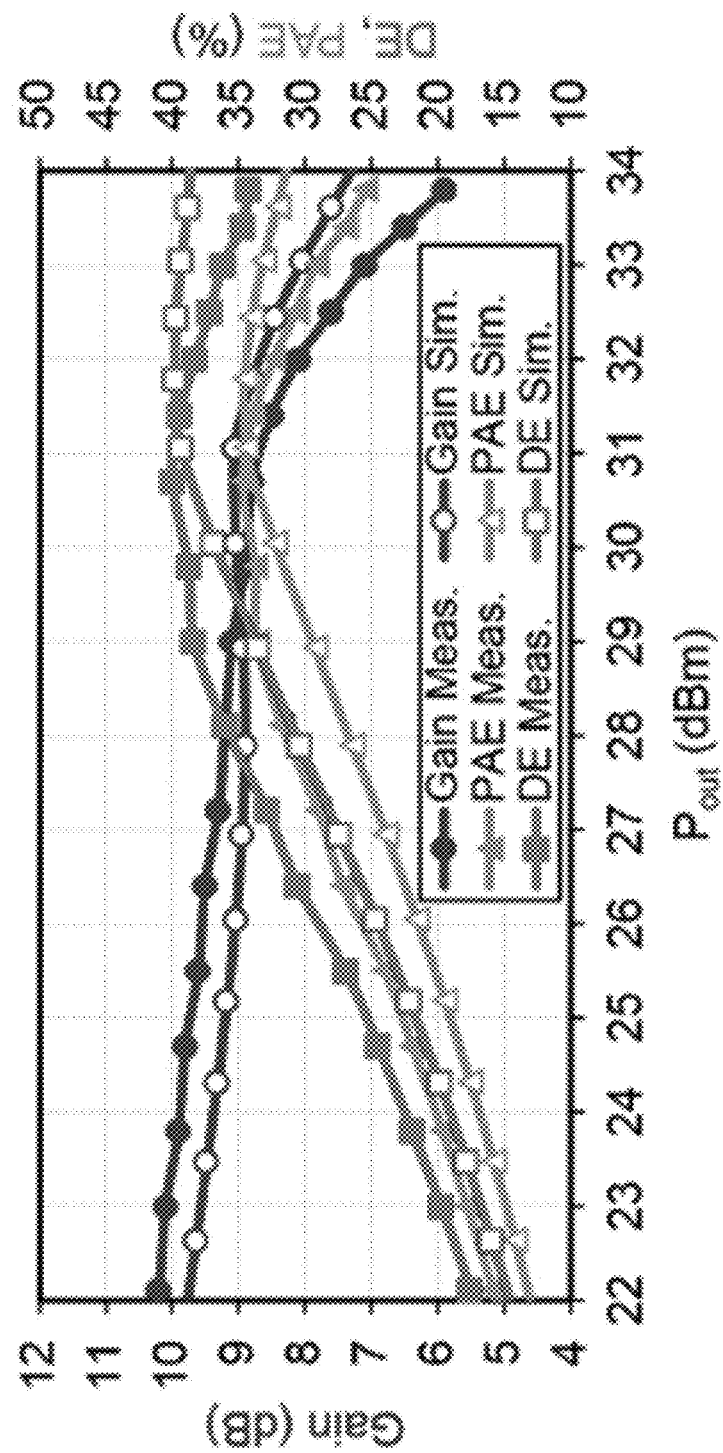
FIG. 48 shows measured and simulated gain, DE, and PAE versus output power at 5.0 GHz.

The measured and simulated gain, DE, and PAE versus output power at 5.0 GHz are shown in FIG. 48. It is noted that the shape of the efficiency versus output power follows the theoretical characteristics of the unbalanced PA, i.e., the maximum efficiency is achieved at back-off. The DE of 34%/40% is obtained at peak-power/back-off, while PAE is 25%/35%.

Figure 49:
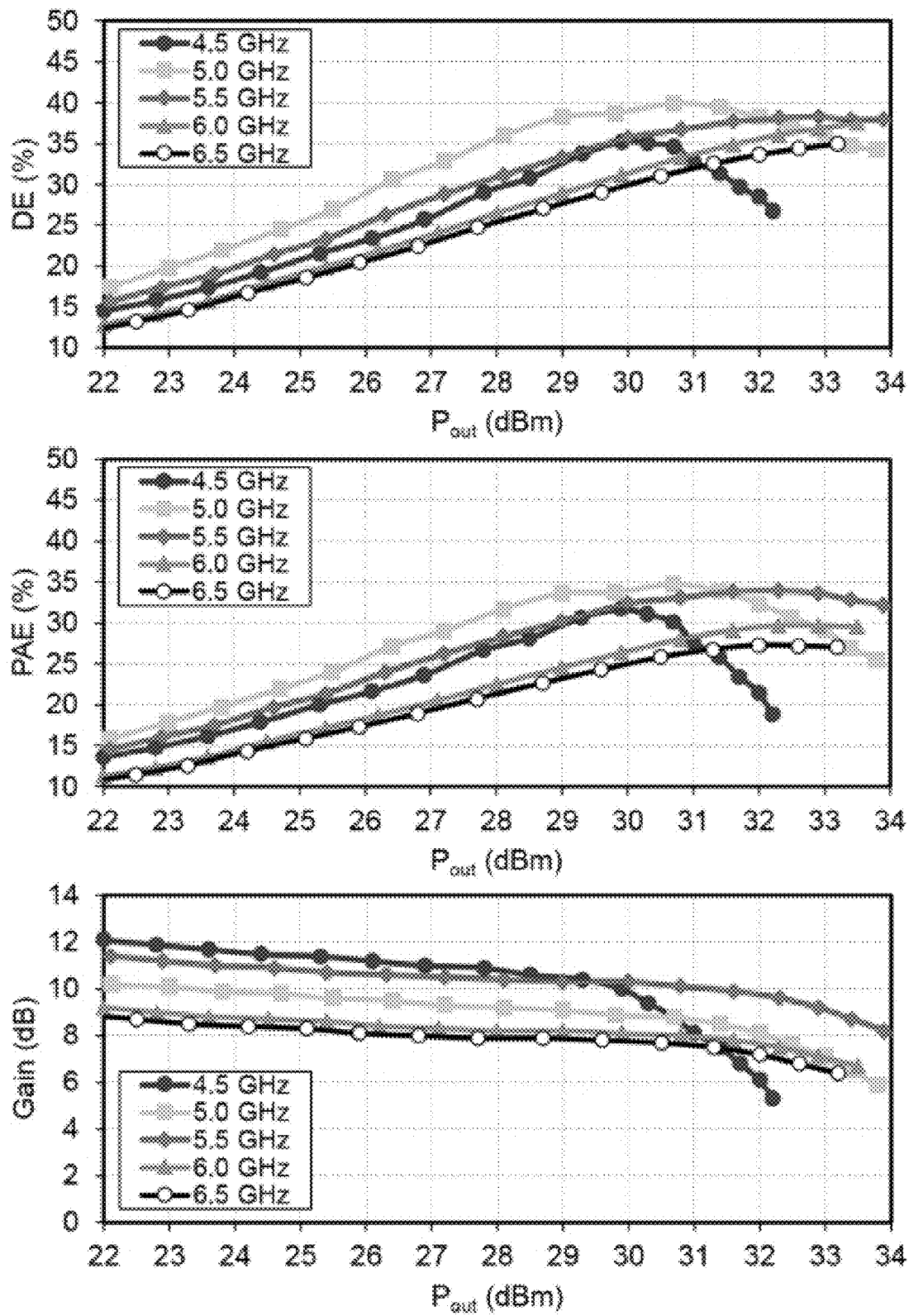
FIG. 49 shows measured DE, PAE, and gain versus output power across 4.5-6.5 GHz.

The measured DE, PAE, and gain versus output power across 4.5-6.5 GHz are shown in FIG. 49. The PA provides 32.2-34.3-dBm output power, 27%-37% DE at peak power, and 27%-40% at 5-6-dB back-off. This PA prototype is presented as proof of the developed unbalanced PA architecture. The performance can be further improved by optimizing the PA circuitry.

B. Modulated-Signal Measurements

The PA operation is evaluated using a 256-QAM signal with up to 200-MHz modulation bandwidth ($BW_m$) and 7.2-dB PAPR. The modulated signal is generated using a MATLAB code, loaded into an R&S SMW200A vector signal generator, and is applied to the PA. The output signal is captured using an R&S FSW45 vector signal analyzer and is processed in MATLAB to extract the output signal features.

Figure 50:
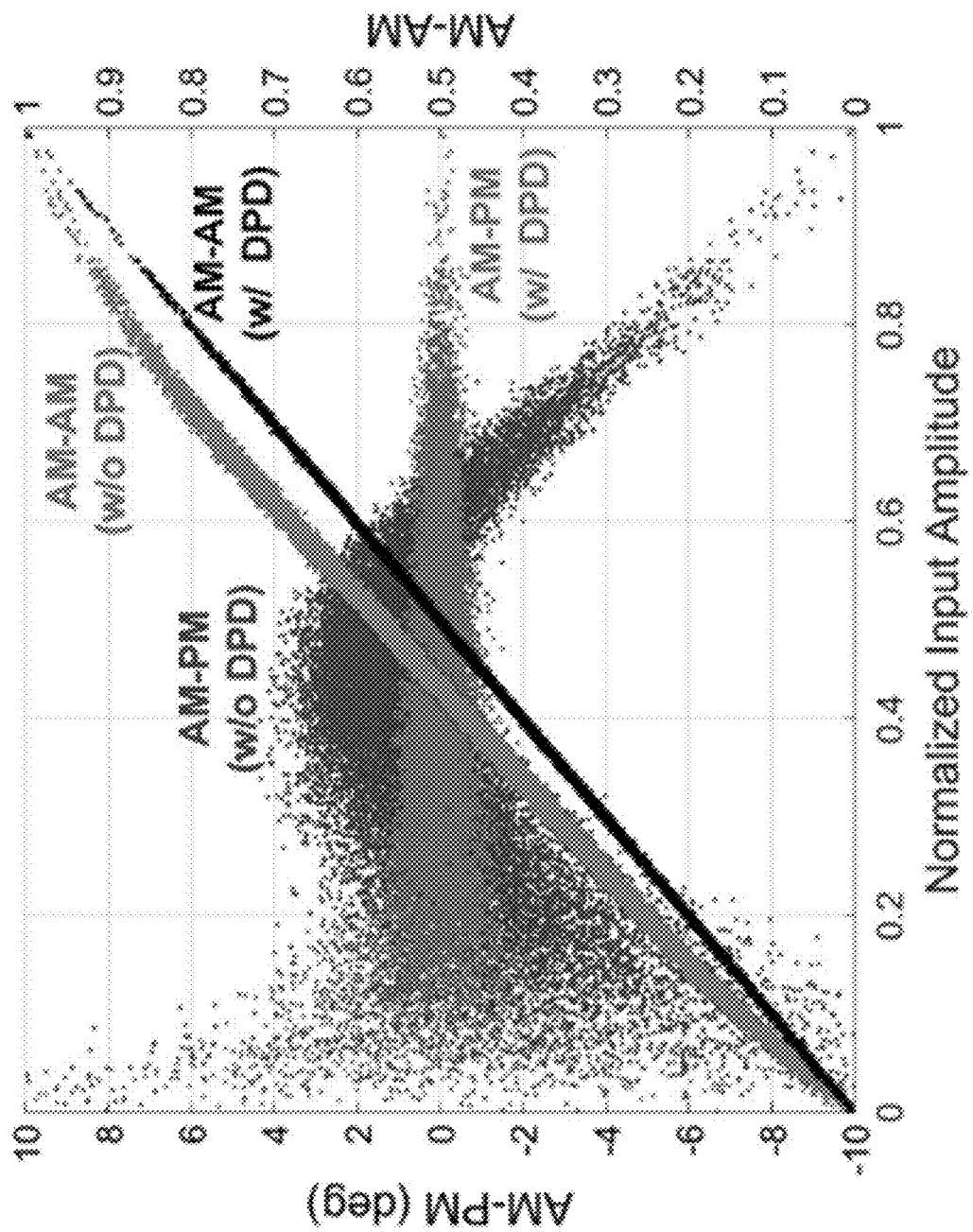
FIG. 50 shows measured AM-AM and AM-PM distortion characteristics at 25.5-dBm average output power, with and without using DPD. The results are achieved using a 5.0-GHz, 256-QAM signal with 100-MHz bandwidth and 7.2-dB PAPR.
Figure 51:
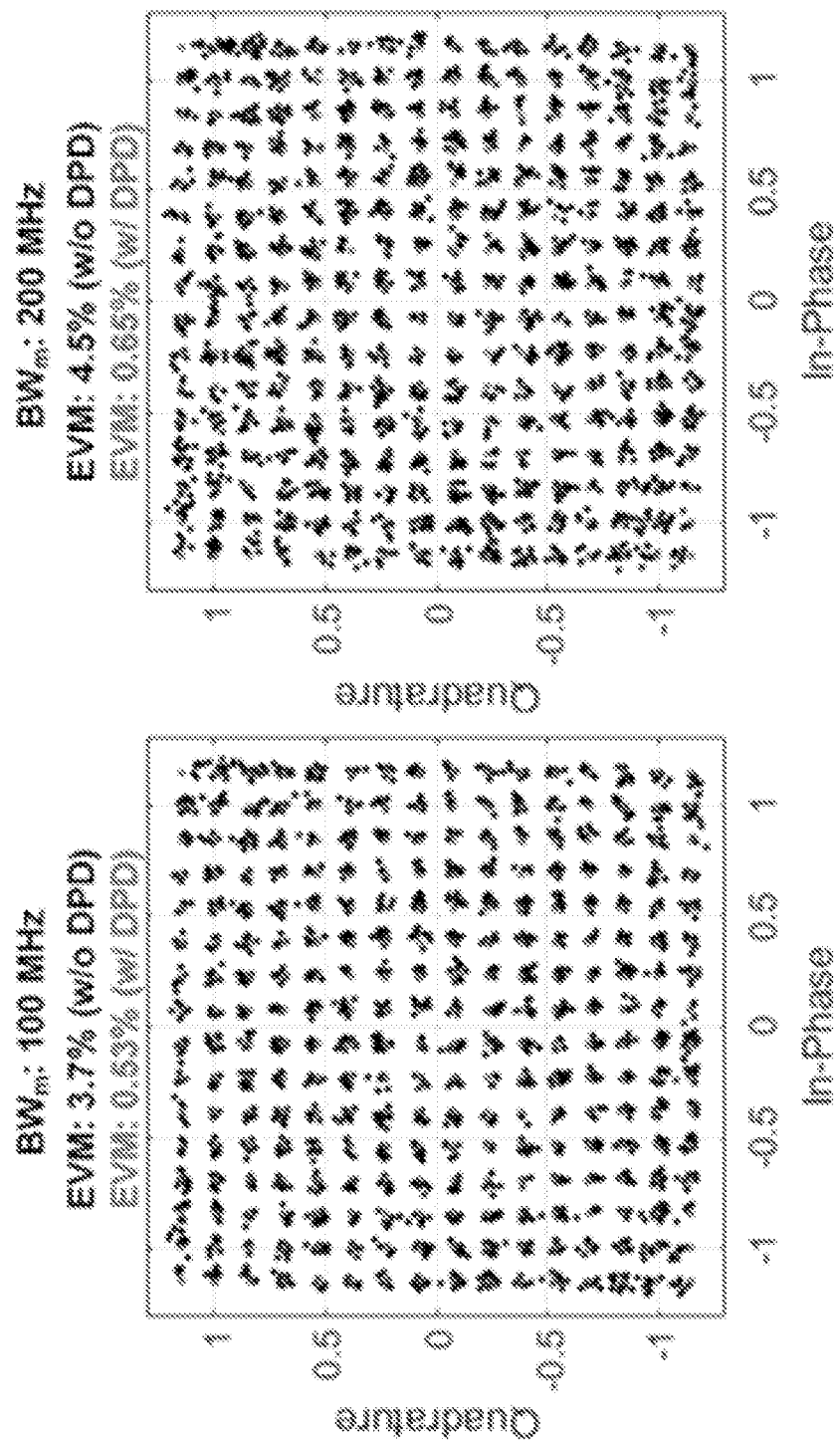
FIG. 51 shows measured output constellation at 25.5-dBm average output power. The results are achieved using a 5.0-GHz, 256-QAM signal with 100-/200-MHz bandwidth and 7.2-dB PAPR.
Figure 53:
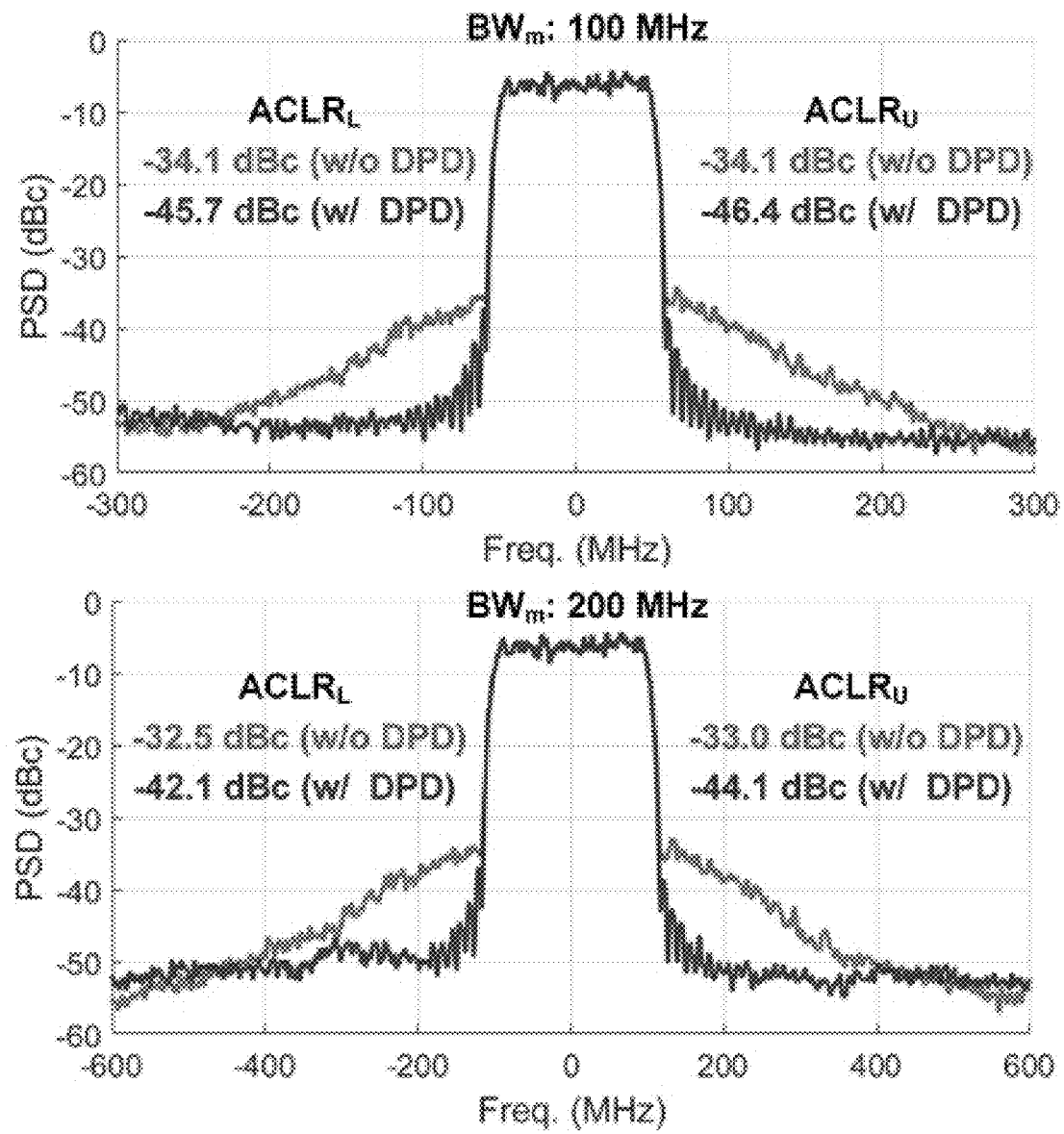
FIG. 53 shows measured output spectrum for a 256-QAM signal with 100-/200-MHz bandwidth and 7.2-dB PAPR.

The measured AM-AM and AM-PM distortion characteristics are shown in FIG. 50. Both distortions can be substantially alleviated using a digital predistortion (DPD). The output signal constellation is shown in FIG. 51, where an rms error vector magnitude $(EVM_{rms})$ of 3.7% (−28.6 dB) is achieved at 25.5-dBm average output power for $BW_m$=100 MHz. EVMrms increases to 4.5% (−26.9 dB) for $BW_m$=200 MHz. Using the DPD, $EVM_{rms}$ can be improved to, respectively, 0.53% (−45.5 dB) and 0.65% (−43.7 dB) in the two cases. The measured signal spectrum is shown in FIG. 53, where the adjacent channel leakage ratio (ACLR), for $BW_m$=100 MHz, is −34.1/−34.1 dBc at lower/upper channels without DPD and improved to −45.7/−46.4 dBc after DPD is applied. For $BW_m$=200 MHz, the ACLR is −32.5/−33.0 dBc without DPD and −42.1/−44.1 dBc with DPD.

Figure 54:
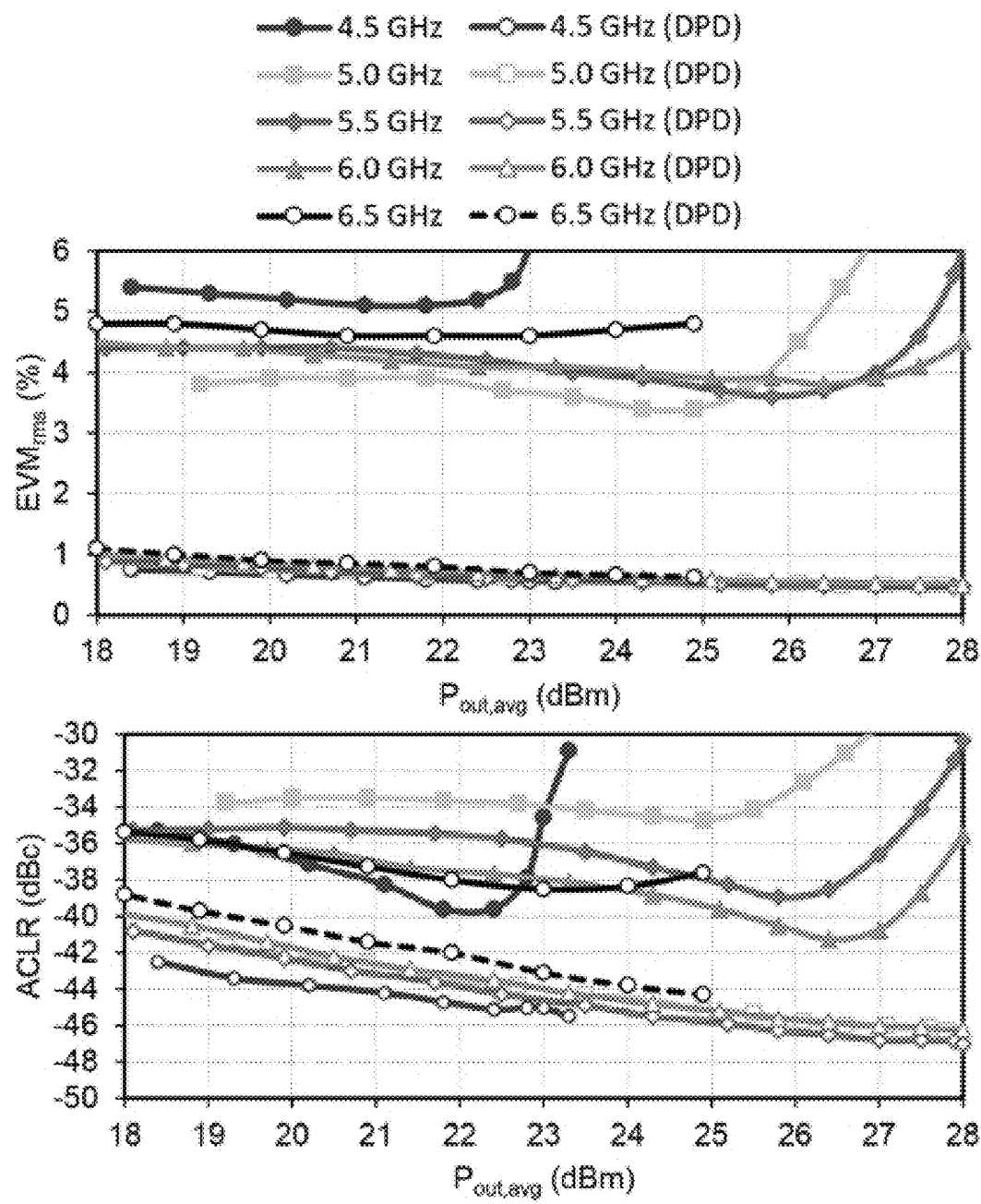
FIG. 54 shows measured EVM and ACLR (average of lower and upper channels) versus the average output power for a 256-QAM signal with 100-MHz bandwidth and 7.2-dB PAPR. Swept across carrier frequencies and with DPD ON/OFF.

In FIG. 54, the measured EVM and ACLR (average of lower and upper channels) are shown. The EVM and ACLR can be improved with the help of DPD to <1% and <−39 dBc, respectively, across the 18-28-dBm average output power range and the entire 4.5-6.5-GHz frequency band.

Figure 55:
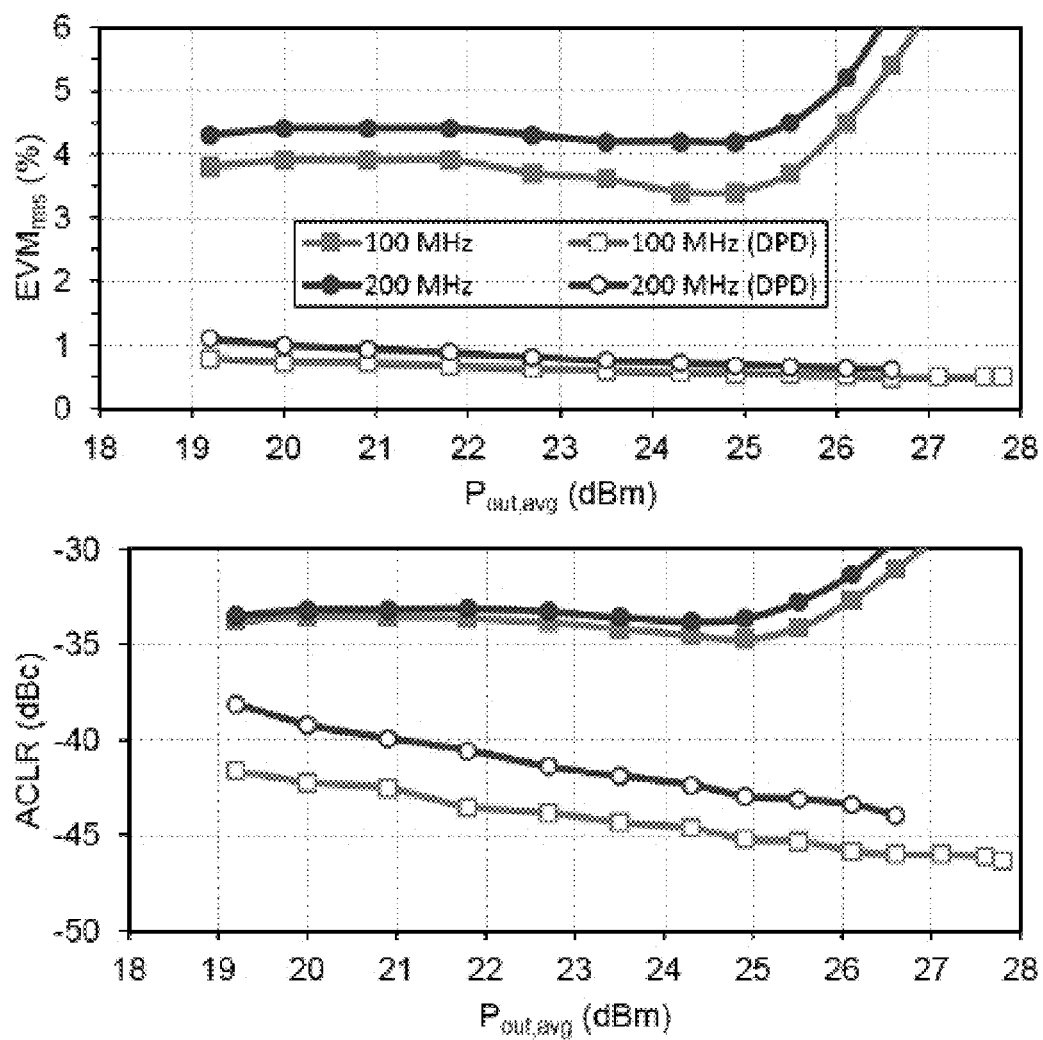
FIG. 55 shows measured EVM and ACLR (average of lower and upper channels) versus the average output power for a 256-QAM signal with 100-/200-MHz bandwidth and 7.2-dB PAPR. Swept across the modulation bandwidth and with DPD ON/OFF.

The effect of modulation bandwidth on the linearity performance is demonstrated in FIG. 55. Measured EVM and ACLR are shown versus average output power for $BW_m$=100/200 MHz. The linearity degrades with the modulation bandwidth, but good performance can still be achieved.

Figure 56:
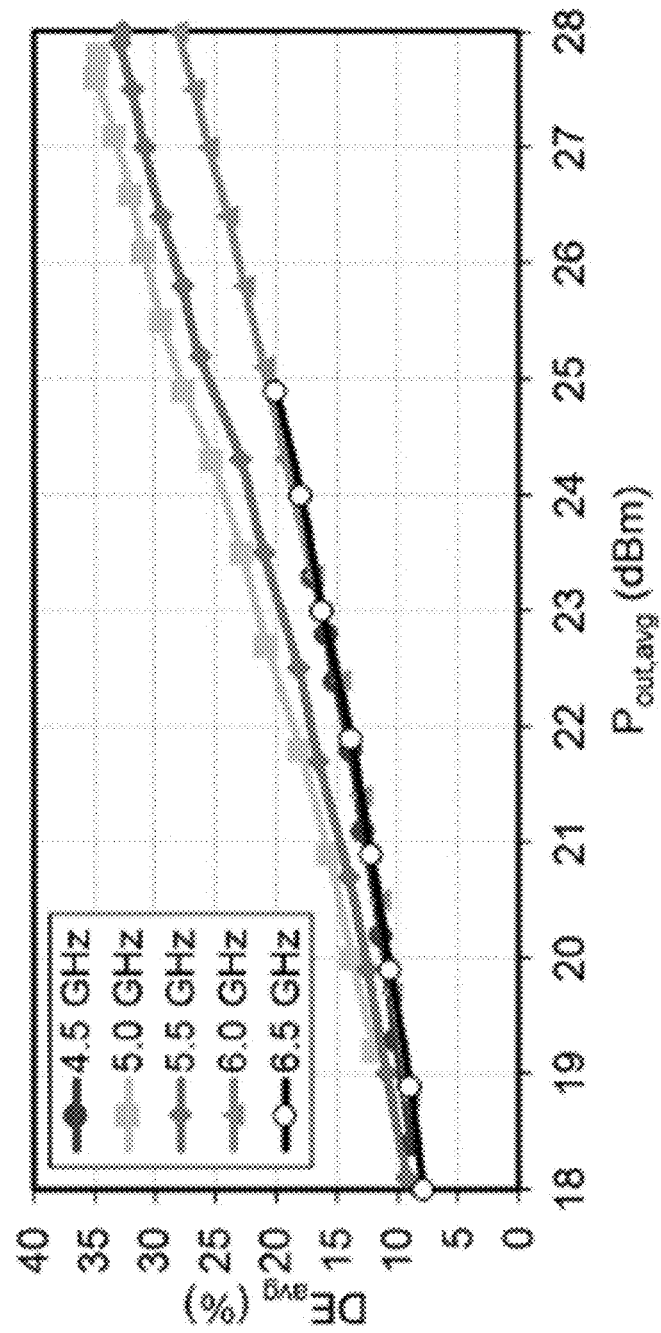
FIG. 56 shows measured average drain efficiency versus the average output power for a 256-QAM signal with 7.2-dB PAPR.

In FIG. 56, the average drain efficiency versus average output power is shown. The efficiency reaches 30% at 25.5-dBm average output power and is almost independent of the modulation bandwidth. Higher efficiency can be achieved by operating the PA at higher output power and using the DPD to compensate for the increased nonlinearity.

In the table of FIG. 52, the performance of the implemented unbalanced PA is compared with prior fully integrated GaN PAs with back-off efficiency enhancement (all of those are Doherty PAs). A wide operation bandwidth (37%) is achieved. This is a significant benefit of the proposed PA architecture and is a result of using broadband Lange couplers and impedance matching networks, rather than impedance inverters. The linearity evaluated using a wideband 100-/200-MHz 256-QAM signal results in EVMrms≈−28.6/−26.9 dB without any predistortion. A record-high modulation bandwidth of 200 MHz (with 8 S' 200 MHz=1.6 GS/s data rate) is achieved while maintaining state-of-the-art performance. This is due to the aforementioned nonlinearity cancellation through compressive and expansive nonlinearity behaviors of the main and auxiliary sub-PAs, operating in the class-B and class-C modes.

The invention claimed is:

1. A broadband power amplifier circuit, said amplifier circuit comprising:
    an input matching network having a source impedance that receives an input signal and supplies an impedance matched signal;
    an active element for receiving impedance matched signal and for amplifying the impedance matched signal to supply an amplified signal, wherein the active element comprises a main amplifier for supplying the amplified signal at a first set of input signal conditions, and an auxiliary amplifier for also supplying the amplified signal at a second set of input signal conditions;
    an input asymmetric quadrature coupler, for dividing the power of the input signal between the main and auxiliary amplifier; and
    an output matching network having a load impedance and coupled to the active element for receiving the amplified signal; and wherein the output matching network is configured to match to an optimum load impedance of the active element.

2. The amplifier of claim 1, wherein the input matching network is configured to match to the optimum load impedance of the active element.

3. The amplifier of claim 2, wherein the input matching network is configured to match the source impedance to the impedance of the active element over the fundamental frequency band of the active element.

4. The amplifier of claim 1, wherein transistor width of the auxiliary amplifier is larger than transistor width of the main amplifier.

5. The amplifier of claim 1, wherein the coupling is determined by an input asymmetric quadrature coupling coefficient of the input asymmetric quadrature coupler.

6. The amplifier of claim 5, wherein the input matching network is coupled to the main amplifier, and wherein the amplifier further comprises an auxiliary input matching network coupled to the auxiliary amplifier, such that the input matching network supplies part of the power from the input asymmetric quadrature coupler to the main amplifier and the auxiliary input matching network supplies the remaining power from the input asymmetric quadrature coupler to the auxiliary amplifier.

7. The amplifier of claim 6, further comprising an output power combiner, optionally an output asymmetric quadrature coupler, for combining the output power of the amplified signal from the main amplifier and the auxiliary amplifier, and wherein the output power of the output asymmetric quadrature coupler is determined by an output asymmetric quadrature coupling coefficient of the output asymmetric quadrature coupler.

8. The amplifier of claim 6, wherein the output matching network is coupled to the main amplifier, and wherein the amplifier further comprises an auxiliary output matching network coupled to the auxiliary amplifier, such that the output matching network matches the load impedance to the impedance of the main amplifier and the auxiliary output matching network matches the load impedance to the impedance of the auxiliary amplifier.

9. The amplifier of claim 4, wherein said main amplifier comprises one active element, and the auxiliary amplifier is connected in parallel with the main amplifier and additionally comprises at least two active elements, and wherein the number n of active elements in the auxiliary amplifier is given by n=2k−1, where k is the number of control bits; and/or, wherein each active element comprises a transistor possessing a separate gate bias control.

10. The amplifier of claim 9, wherein substantially all power from the input matching network and/or the input asymmetric quadrature coupler is delivered to the main amplifier at a first bias voltage; and/or, wherein the power from the input matching network or the input asymmetric quadrature coupler is shared substantially equally between the first and the auxiliary amplifier at a second bias voltage higher than the first bias voltage.

11. The amplifier of claim 5, wherein the output matching network and/or the auxiliary output matching network is configured to match the load impedance to the impedance of the active element over fundamental, second and third harmonic frequency bands of the active element and/or, wherein a resistance of the load impedance is at an optimum, short-circuit or open-circuit value, respectively, at the fundamental, second and the third harmonic frequency bands.

12. The amplifier of claim 1, wherein the active element is a transistor.

13. The amplifier of claim 12, wherein the power amplifier circuit is implemented on Gallium Nitride (GaN) on silicon carbide (SiC); and/or is configured as a monolithic microwave integrated circuit.

14. The amplifier of claim 1, wherein the output matching network is a minimum inductor band-pass filter configured to match the load impedance to the impedance of the active element for a continuous-mode operation of the power amplifier.

15. The amplifier of claim 14, wherein the output matching network is configured to match the impedance of the active element over fundamental and second harmonic frequency bands of the active element; and wherein the band-pass filter is further configured to suppress transmission of harmonic frequencies in and above the second harmonic frequency band out of the band of the band-pass filter.

16. The amplifier of claim 1, wherein the load impedance is substantially resistive in a fundamental harmonic frequency band; and/or wherein the load impedance is substantially reactive in a second harmonic frequency band.

17. The amplifier of claim 1, wherein the power amplifier is configured to operate in a class-F mode, and wherein the output matching network is a multi-harmonic output matching network, said network comprising reactive electrical components, and wherein the amplifier comprises three stages, each stage comprising an LC circuit; and further optionally or preferably, wherein the impedance of the LC circuit is configured is matched the optimum load impedance of the active element in the fundamental, second-harmonic, and third-harmonic frequency bands.

* * * * *